(12) United States Patent
Sunaga et al.

(10) Patent No.: US 7,794,915 B2
(45) Date of Patent: Sep. 14, 2010

(54) HYDROGENATED RING-OPENING METATHESIS POLYMER, RESIST COMPOSITION COMPRISING THE SAME AND PATTERNING METHOD

(75) Inventors: Tadahiro Sunaga, Yamato (JP); Yuichi Okawa, Ichihara (JP); Takeshi Kinsho, Joetsu (JP); Tomohiro Kobayashi, Joetsu (JP)

(73) Assignees: Mitsui Chemicals, Inc., Manato-Ku, Tokyo (JP); Shin-Etsu Chemical Co., Ltd., Chiyoda-Ku, Tokyo (JP)

( * ) Notice: Subject to any disclaimer, the term of this patent is extended or adjusted under 35 U.S.C. 154(b) by 493 days.

(21) Appl. No.: 11/902,775

(22) Filed: Sep. 25, 2007

(65) Prior Publication Data

US 2008/0085470 A1 Apr. 10, 2008

(30) Foreign Application Priority Data

Sep. 28, 2006 (JP) ............................. 2006-264264

(51) Int. Cl.
*G03F 7/004* (2006.01)
*G03F 7/30* (2006.01)
*C08F 232/08* (2006.01)

(52) U.S. Cl. .................. 430/270.1; 430/326; 430/905; 526/281

(58) Field of Classification Search .............. 430/270.1, 430/326, 905; 526/280, 281
See application file for complete search history.

(56) References Cited

U.S. PATENT DOCUMENTS

| | | | | |
|---|---|---|---|---|
| 6,136,499 A | * | 10/2000 | Goodall et al. | 430/270.1 |
| 6,372,854 B1 | * | 4/2002 | Sunaga et al. | 525/326.8 |
| 6,525,153 B1 | * | 2/2003 | Jayaraman et al. | 526/281 |
| 6,605,408 B2 | * | 8/2003 | Nishi et al. | 430/270.1 |
| 6,673,515 B2 | * | 1/2004 | Nishi et al. | 430/270.1 |
| 6,794,111 B2 | * | 9/2004 | Nishi et al. | 430/270.1 |
| 6,800,720 B2 | * | 10/2004 | Yamamoto et al. | 528/403 |

FOREIGN PATENT DOCUMENTS

JP 04-039665 A 2/1992
JP 05-257281 A 10/1993

* cited by examiner

*Primary Examiner*—John S Chu
(74) *Attorney, Agent, or Firm*—Buchanan Ingersoll & Rooney PC

(57) ABSTRACT

Provided is a resin having an alicyclic structure in a main chain, which is excellent in etching resistance and developing property, a resist composition for exposure with a high energy radiation using the resin, and a method for forming a pattern using the resist composition.

Also provided is a hydrogenated ring-opening metathesis polymer which is comprised of alicyclic skeleton-containing structural units [A], [B] and a structural unit [C] selected from the following general formula [5] and/or [6]:

[Chem. 1]

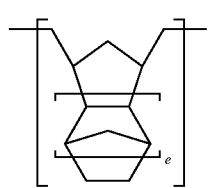

[5]

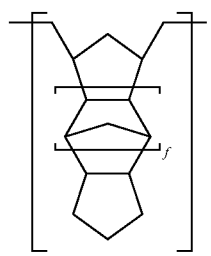

[6]

wherein, e and f represent respectively an integer of 0 to 3, wherein the at least one of $X^1$ of the general formula [1] of the structural unit [A], $X^2$ of the general formula [3] and $X^3$ of the general formula [4] of the structural unit [B] is —O—, and wherein the molar ratio of the structural units [A], [B] and [C] satisfies simultaneously that [A]/([B]+[C]) is from 20/80 to 98/2, ([A]+[B])/[C] is from 99/1 to 50/50, and ([A]+[C])/[B] is from 99/1 to 21/79. Also, a resist composition comprising the same and a method for forming a pattern are provided.

20 Claims, 1 Drawing Sheet

HYDROGENATED RING-OPENING METATHESIS POLYMER, RESIST COMPOSITION COMPRISING THE SAME AND PATTERNING METHOD

This application is based on Japanese patent application No. 2006-264,264, the content of which is incorporated hereinto by reference.

FIELD OF THE INVENTION

The present invention relates to a hydrogenated ring-opening metathesis polymer, a resist composition using the hydrogenated ring-opening metathesis polymer as a base resin, for example, a resist composition for exposure of a high-energy radiation (including excimer lasers) with wavelength of 300 nm or shorter and a patterning method using the resist composition.

DESCRIPTION OF RELATED ART

To achieve high integration and high-speed performance of large scale integrated (LSI) circuit, a micropatterning with finer pattern rule is sought much more, and thus the micropatterning technologies by using far UV lithography and vacuum UV lithography has been enthusiastically developed. Particularly, it has been widely known that ArF excimer laser which is a light source for the next generation of a KrF excimer laser is indispensable for photolithography for an advanced semiconductor of 90 nm to 45 nm node.

In a lithography using an ArF excimer laser as a light source, polyhydroxystyrene derivatives, which were mainly used as a resin for a resist composition in the generation of KrF excimer laser light source, have difficulty in application due to their non-transparency to a wavelength of 193 nm, and thus it is required to ensure transparency of a base resin.

Poly(meth)acrylic acid and its derivatives were focused on as a resin which is highly transparent at 193 nm and relatively excellent in developing properties. However, there is a problem in dry etching resistance. To improve dry etching resistance, poly(meth)acrylic acid ester derivatives in which an alicyclic structure such as an adamantane skeleton, norbornane skeleton and the like is introduced in ester parts of the side chains were proposed (Patent Documents 1 and 2) and have been mainly developed.

However, etching resistance of such poly(meth)acrylic acid ester derivatives is not sufficient yet. Further, to ensure resolution followed with micropatterning from now on, thin-filming of a resist is inevitable. Thus it is expected that etching resistance becomes much more important.

Meanwhile, there have been proposed resins having an alicyclic structure in a main chain, for example, polynorbornene derivatives, alternative copolymers of polynorbornene derivatives and maleic anhydride, and the like. Although some have sufficient etching resistance, there has been a problem in a resolution deficiency due to inferior developing properties, that is, swelling during the development, a low dissolution, an insufficient contrast and the like.

[PATENT DOCUMENT 1] JP-A-1992-39665
[PATENT DOCUMENT 2] JP-A-1993-257281

DISCLOSURE OF THE INVENTION

Problem to be Solved by the Invention

To overcome the problems mentioned above, the present invention provides a resin containing an alicyclic structure in the main chain which is excellent in etching resistance and in developing property, and provides a resist composition using the resin for exposure with a high energy radiation and a method for forming a pattern using the resist composition.

Means to Solve the Problem

The present inventors have studied enthusiastically for achieving the above object. As a result, they have found that, as a resin satisfying the above-mentioned various properties necessary to be used as a base polymer for resist compositions, more particularly, satisfying all of various properties such as light transparency to ultraviolet ray and far ultraviolet ray (including excimer lasers), solubility to an alkali developer, etching resistance and the like, preferable is a hydrogen additive of ring-opening metathesis polymers having an alicyclic compound as a main chain and a structural unit containing an oxygen atom in a part of the cyclic structure. In addition, the polymer contains structural units of a specific cyclic lactone compound and a specific alicyclic hydrocarbon compound, thereby to achieve highly excellent resolution. Containing an oxygen atom in a part of the cyclic structure and containing the lactone unit enhance a polarity of the resin to increase affinity to alkali developer. However, if an affinity to the developer is too high, the dissolution contrast is decreased and thus resolution is decreased. It is believed that the developing property become easily controlled by combining in a proper quantity with the alicyclic hydrocarbon compound which is highly lipid-soluble and has a low affinity to a developer, thus contributing on the improvement of resolution.

Namely, the present invention is:

(1) A hydrogenated ring-opening metathesis polymer, which contains at least a structural unit [A] represented by the following general formula [1], a structural unit [B] selected from the following formula [3] and/or [4] and a structural unit [C] selected from the following general formula [5] and/or [6], wherein the structural unit [A] is represent by the following general formula [1]:

[Chem. 1]

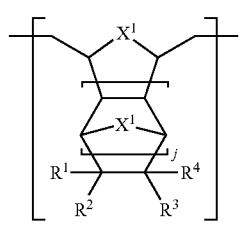

[1]

wherein at least one of $R^1$ to $R^4$ is a functional group having an acid-unstable group represented by the following general formula [2]:

[Chem. 2]

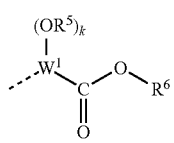

[2]

wherein the chain line represents a coupling hand, $R^5$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^6$ represents a tertiary alkyl group having 4 to 20 carbon atoms, and $W^1$ represents a single bond or a (k+2)-valent hydrocarbon group having 1 to 10 carbon atoms, k is 0 or 1 and when k is 0, $W^1$ represents a single bond, and the remaining groups of $R^1$ to $R^4$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms; and $X^1$s are the same or different and represent —O— or —$CR^7{}_2$— where $R^7$ represents a hydrogen atom or a linear or branched alkyl group having 1 to 10 carbon atoms, j represents an integer of 0 or 1 to 3, the structural unit [B] is selected from the following formula [3] and/or formula [4]:

[Chem. 3]

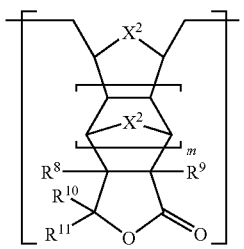

[3]

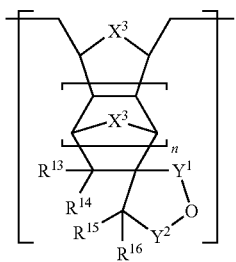

[4]

wherein $R^8$ to $R^{11}$ each independently represent a hydrogen atom or a linear, branched or cyclic alkyl group having 1 to 10 carbon atoms, $X^2$s are the same or different and represent —O— or —$CR^{12}{}_2$— where $R^{12}$ represents a hydrogen atom or a linear or branched alkyl group having 1 to 10 carbon atoms, m represents an integer of 0 or 1 to 3, $R^{13}$ to $R^{16}$ each independently represent a hydrogen atom or a linear, branched or cyclic alkyl group having 1 to 10 carbon atoms, $X^3$s are the same or different and represent —O— or —$CR^{17}{}_2$— wherein $R^{17}$ represents a hydrogen atom or a linear or branched alkyl group having 1 to 10 carbon atoms, one of $Y^1$ and $Y^2$ represents —(C=O)— and the other of $Y^1$ and $Y^2$ represents —$CR^{18}{}_2$— where $R^{18}$ represents a hydrogen atom or a linear or branched alkyl group having 1 to 10 carbon atoms, n represents an integer of 0 or 1 to 3; and the structural unit [C] is selected from the following general formula [5] and/or general formula [6]:

[Chem. 4]

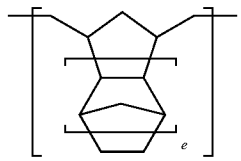

[5]

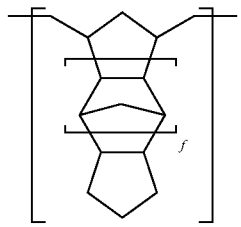

[6]

wherein e represents an integer of 0 or 1 to 3, and f represents an integer of 0 or 1 to 3;

wherein the at least one of $X^1$ of the general formula [1] of the structural unit [A], $X^2$ of the general formula [3] and $X^3$ of the general formula [4] of the structural unit [B] is —O—, and wherein the molar ratio of the structural units [A], [B] and [C] satisfies simultaneously that [A]/([B]+[C]) is from 20/80 to 98/2, ([A]+[B])/[C] is from 99/1 to 50/50, and ([A]+[C])/[B] is from 99/1 to 21/79;

(2) The hydrogenated ring-opening metathesis polymer according to (1), wherein $R^6$ of the general formula [2] selected as at least one of $R^1$ to $R^4$ of the formula [1] represents 1-alkyl cyclopentyl group, 2-alkyl-2-norbornyl group or 2-alkyl-2-adamantyl group;

(3) The hydrogenated ring-opening metathesis polymer according to (1) or (2), which further contains a structural unit [D] represented by the following general formula [7]:

[Chem. 5]

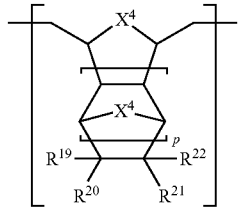

[7]

wherein at least one of $R^{19}$ to $R^{22}$ represents a functional group having a carboxyl group represented by the following general formula [8]:

[Chem. 6]

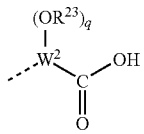

[8]

wherein the chain line represents a coupling hand, $R^{23}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $W^2$ represents a single bond or a (q+2)-valent hydrocarbon group having 1 to 10 carbon atoms, q represents 0 or 1, and when q is 0, $W^2$ represents a single bond, and the remaining groups of $R^{19}$ to $R^{22}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms, and $X^4$s are the same or different and represent —O— or —$CR^{24}_2$— wherein $R^{24}$ represents a hydrogen atom or a linear or branched alkyl group having 1 to 10 carbon atoms, p represents an integer of 0 or 1 to 3;

(4) The hydrogenated ring-opening metathesis polymer according to (3), wherein the molar ratio of the sum of the structural unit [A] of the general formula [1], the structural unit [B] of the general formula [3] and/or the general formula [4], and the structural unit [C] of the general formula [5] and/or the general formula [6] to the structural unit [D] of the general formula [7], ([A]+[B]+[C])/[D] is from 100/0 to 20/80;

(5) The hydrogenated ring-opening metathesis polymer according to any one of (1) to (4), which further contains a structural unit [E] represented by the following general formula [9]:

[Chem. 7]

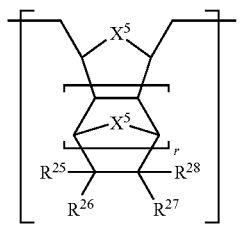

[9]

wherein at least one of $R^{25}$ to $R^{28}$ represents a functional group having a carboxylic acid ester group represented by the following general formula [10]:

[Chem. 8]

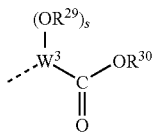

[10]

wherein the chain line represents a coupling hand, $R^{29}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms, $W^3$ represents a single bond or a (s+2)-valent hydrocarbon group having 1 to 10 carbon atoms, s represents 0 or 1, when s is 0, $W^3$ represents a single bond; and the remaining groups of $R^{25}$ to $R^{28}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms and $X^5$s are the same or different and represent —O— or —$CR^{31}_2$— wherein $R^{31}$ represents a hydrogen atom or a linear or branched alkyl group having 1 to 10 carbon atoms; and r represents an integer of 0 or 1 to 3;

(6) The hydrogenated ring-opening metathesis polymer according to (5), wherein the molar ratio of the sum of the structural unit [A] of the general formula [1], the structural unit [B] of the general formula [3] and/or the general formula [4] and the structural unit [C] of the general formula [5] and/or the general formula [6] to the structural unit [E] of the general formula [9], ([A]+[B]+[C])/[E] is from 100/0 to 40/60;

(7) The hydrogenated ring-opening metathesis polymer according to any one of (1) to (6), wherein the number-average molecular weight in terms of polystyrene standard measured by gel permeation chromatography (GPC) is from 2,000 to 200,000;

(8) The hydrogenated ring-opening metathesis polymer according to (7), wherein the number-average molecular weight in terms of polystyrene standard measured by GPC is from 3,000 to 50,000.

(9) A resist composition comprising the hydrogenated ring-opening metathesis polymer according to any one of (1) to (8) as a base resin;

(10) A method for forming a pattern, comprising:

a process of applying a resist composition comprising the hydrogenated ring-opening metathesis polymer according to any one of 1 to 8 as a base resin onto a substrate;

a process of, after heat treatment, exposure with a high energy radiation or electron beam through a photomask, and a process of, after optional heat treatment, development with a developer;

EFFECT OF THE INVENTION

The present invention is achieved in view of the above-mentioned object. According to the present invention, it is provided a resin having an alicyclic skeleton in its main chain and excellent in etching resistance and developing property, a resist composition for light exposure with a high energy radiation using the resin, and a method for forming pattern using the resist composition.

BRIEF DESCRIPTION OF THE DRAWINGS

The above and other objects, advantages and features of the present invention will be more apparent from the following description taken in conjunction with the accompanying drawings, in which.

BEST MODE FOR CARRYING OUT THE INVENTION

Figure 1:
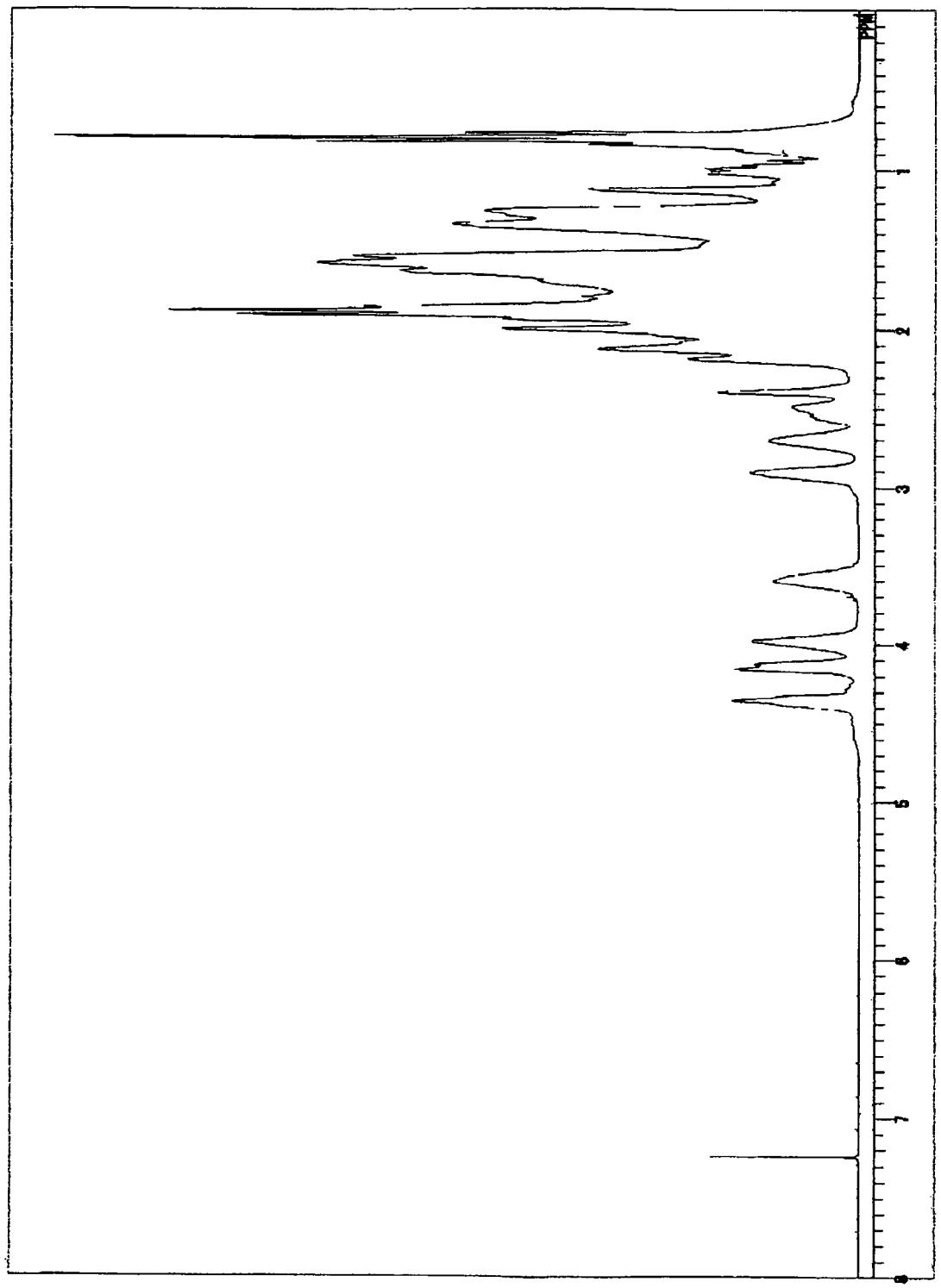
FIG. 1 It shows $^1$H-NMR spectrum (270 MHz, in a deuterated chloroform solvent) of the hydrogenated ring-opening metathesis polymer obtained in Example 1.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereafter, the present invention will be described more specifically. In the general formulas in the description, there can be an enantiomer or diasteromer, and in that case, one planar formula or stereoisomer formula represents all stereoisomers. Such stereoisomers can be used alone or as a mixture thereof.

A hydrogenated ring-opening metathesis polymer of the present invention contains a structural unit [A] represented by the following general formula [1], a structural unit [B] selected from the following general formula [3] and/or general formula [4], and a structural unit [C] selected from the following general formula [5] and/or general formula [6]:

[Chem. 9]

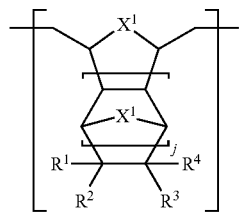

[1]

wherein at least one of $R^1$ to $R^4$ is a functional group having an acid-unstable group, represented by the following general formula [2]:

[Chem. 10]

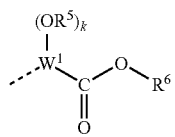

[2]

wherein the chain line represents a coupling hand, $R^5$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^6$ represents a tertiary alkyl group having 4 to 20 carbon atoms, $W^1$ represents a single bond or a (k+2)-valent hydrocarbon group having 1 to 10 carbon atoms, and k is 0 or 1 where if k is 0, $W^1$ represents a single bond.

The acid-unstable group, which has been already a known technical word in the resist-related technology, is a protecting group of an alkali-soluble group. The acid-unstable group is a group which generates an alkali-soluble group such as carboxylic acid via decomposition and deprotection of the protecting group by an acid such as a strong acid, etc., as a catalyst released from a photoacid generator by light exposure.

Regarding $R^5$, examples of the linear, branched or cyclic alkyl group having 1 to 10 carbon atoms includes methyl, ethyl, propyl, isopropyl, n-butyl, isobutyl, tert-butyl, cyclopentyl, cyclohexyl, 1-ethylcyclopentyl, 1-ethylcyclohexyl and the like. Examples of the linear, branched or cyclic alkoxyalkyl group having 2 to 10 carbon atoms includes methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like. Examples of the linear, branched or cyclic acyl group having 1 to 10 carbon atoms includes formyl, acetyl, pivaloyl, cyclohexylcarbonyl and the like. Among these groups $R^5$, a linear or branched alkyl group having 1 to 6 carbon atoms, a linear, branched or cyclic alkoxyalkyl group having 2 to 7 carbon atoms and a linear or branched acyl group having 2 to 7 carbon atoms are preferable, and a hydrogen atom, methyl, ethyl, methoxymethyl, 1-ethoxyethyl, tetrahydrofuran-2-yl and acetyl are particularly preferable.

Regarding $W^1$, the (k+2)-valent hydrocarbon group having 1 to 10 carbon atoms is a linear, branched or cyclic divalent hydrocarbon group having 1 to 10 carbon atoms when k is 0, and examples thereof include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, 1,4-cyclohexylene and the like. Among them, methylene, ethylidene, ethylene, 1-methylethylene, 2-methylethylene, trimethylene and 2-methyltrimethylene are preferable. When k is 1, for example, those having a coupling hand formed by removing one hydrogen atom at any position on the hydrocarbon group as described above when k is 0, are listed. Most preferably, $W^1$ is a single bond.

Regarding $R^6$, examples of the tertiary alkyl group having 4 to 20 carbon atoms include an alkyl group represented by the following general formula [13]:

[Chem. 11]

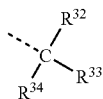

[13]

wherein, $R^{32}$ to $R^{34}$ are independently a linear, branched or cyclic alkyl group having 1 to 17 carbon atoms; and an 1-alkyl cycloalkyl group represented by the following general formula [14]:

[Chem. 12]

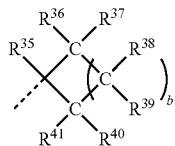

[14]

wherein, $R^{35}$ is a linear, branched or cyclic alkyl group having 1 to 17 carbon atoms, $R^{36}$ to $R^{41}$ are independently a hydrogen atom, or a linear, branched or cyclic alkyl group having 1 to 16 carbon atoms, b is an integer of 0 or 1 to 6 and when b is 2 to 6, the plural of $R^{38}$ and $R^{39}$ can be the same or different; and a 2-alkyl-2-norbornyl group, 2-alkyl-2-adamantyl group such as 2-methyl-2-adamantyl, 2-ethyl-2-adamantyl group and the like represented by the following general formula [15]:

[Chem. 13]

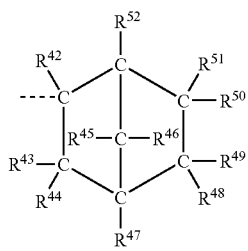

[15]

wherein, $R^{42}$ is a linear, branched or cyclic alkyl group having 1 to 13 carbon atoms, $R^{43}$ to $R^{52}$ are independently a hydrogen atom, or a linear, branched or cyclic alkyl group having 1 to 13 carbon atoms.

Specific examples of the general formula [13] include tert-butyl, tert-amyl, 1,1-dimethylbutyl, 1-ethyl-1-methylpropyl, 1,1-dimethylisopropyl, 1-cyclopentyl-1-methylethyl, 1-cyclohexyl-1-methylethyl, 1-(1-adamantyl)-1-methylethyl and the like. Among these, tert-butyl, tert-amyl, 1-ethylmethyl-1-propyl, 1-cyclopentyl-1-methylethyl, 1-cyclohexyl-1-methylethyl, represented by the following general formulae [16-1] to [16-5], are preferable, and tert-butyl ([16-1]), tert-amyl ([16-2]) and 1-ethyl-1-methylpropyl ([16-3]) are more preferable:

[Chem. 14]

[16-1]

[16-2]

[16-3]

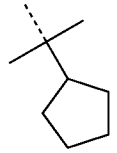

[16-4]

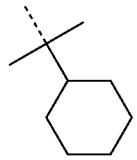

[16-5]

Specific examples of the general formula [14] include 1-methylcyclopropyl, 1-methylcyclobutyl, 1-ethylcyclobutyl, 1-methylcyclopentyl, 1-ethylcyclopentyl, 1-n-propylcyclopentyl, 1-iso-propylcyclopentyl, 1-tert-butylcyclopentyl, 1-cyclopentylcyclopentyl, 1-cyclohexylcyclopentyl, 1-norbornylcyclopentyl, 1-methylcyclohexyl, 1-ethylcyclohexyl, 1-methylcyclohexyl, 1-ethylcyclohexyl, 1-methylcycloheptyl, 1-ethylcycloheptyl, 1-methylcyclooctyl, and 1-methylcyclononyl. Among these, 1-alkylcyclopentyl such as 1-methylcyclopentyl, 1-ethylcyclopentyl, 1-n-propylcyclopentyl, 1-iso-propylcyclopentyl, 1-tert-butylcyclopentyl, 1-cyclopentylcyclopentyl, 1-cyclohexylcyclopentyl, 1-norbornylcyclopentyl and the like, represented by the chemical formulae [17-1] to [17-9] are preferable, and 1-methylcyclopentyl [17-1] and 1-ethylcyclopentyl [17-2] are more preferable.

[Chem. 15]

[17-1]

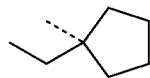

[17-2]

[17-3]

[17-4]

[17-5]

-continued

[17-6] 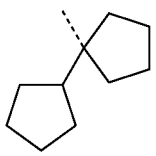

[17-7] 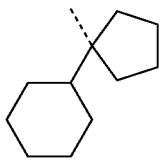

[17-8] 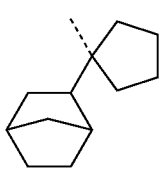

[17-9] 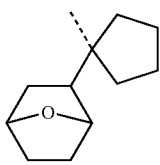

Specific examples of the general formula [15] include 2-alkyl-2-norbornyl group of the following chemical formulae [18-1] to [18-11], etc. Among these, [18-1], [18-2], [18-8] and [18-9] are preferable.

[Chem. 16]

[18-1] 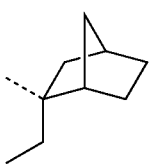

[18-2] 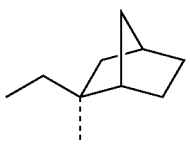

[18-3] 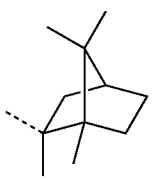

[18-4] 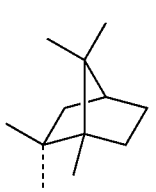

-continued

[18-5] 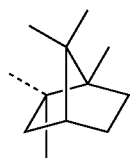

[18-6] 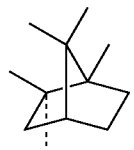

[18-7] 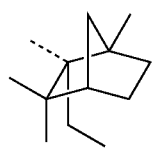

[18-8] 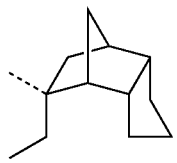

[18-9] 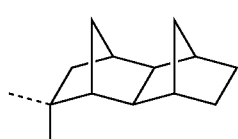

[18-10] 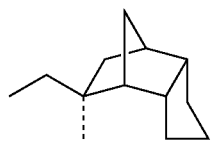

[18-11] 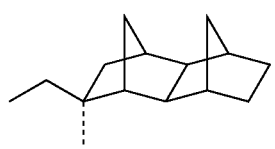

As described above, an enantiomer or diastereomer may exist. In this case, one stereoisomer formula can present all stereoisomers. Such stereoisomers may be used alone or as a mixture.

For example, the formula [18-8] is defined to represent one or a mixture of two selected from the following general formulae [18-8-1] and [18-8-2]:

[Chem. 17]

[18-8-1] 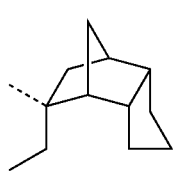

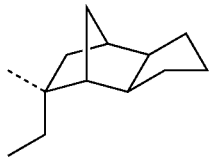
[18-8-2]

Further, the above formula [18-9] is defined to represent one or a mixture of at least two selected from the following general formulae [18-9-1] to [18-9-4]:

[Chem. 18]

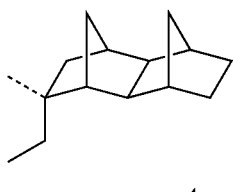
[18-9-1]

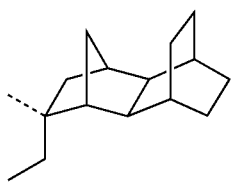
[18-9-2]

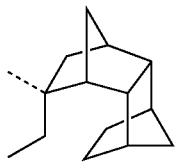
[18-9-3]

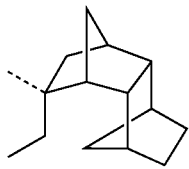
[18-9-4]

Furthermore, the formula [18-8-1], [18-8-2], [18-9-1] to [18-9-4] are defined to represent such enantiomeric isomers or a mixture of such enantiomeric isomers.

Regarding the other groups of $R^1$ to $R^4$, a hydrogen atom, a linear, branched or cyclic alkyl group having 1 to 20 carbon atoms such as methyl, ethyl, propyl, isopropyl, n-butyl, tert-butyl, cyclohexyl, menthyl and the like, halogens such as a chlorine atom, a bromine atom, an iodine atom, a fluorine atom and the like, a linear, branched or cyclic halogenated alkyl group having 1 to 20 carbon atoms such as fluoromethyl, chloromethyl, bromomethyl, difluoromethyl, dichloromethyl, dibromomethyl, trifluoromethyl, trichloromethyl, tribromomethyl and the like, a linear, branched or cyclic alkoxy group having 1 to 12 carbon atoms such as methoxy, ethoxy, isopropoxy, n-butoxy, tert-butoxy, menthoxy and the like, a linear, branched or cyclic alkoxyalkyl group having 2 to 20 carbon atoms such as methoxymethyl, methoxyethyl, tert-butoxymethyl, tert-butoxyethyl, methoxymenthol and the like, or groups containing alkoxy saccharides such as methylglucose and the like, a linear, branched or cyclic alkylcarbonyloxy group having 2 to 20 carbon atoms such as acetoxy and the like, an arylcarbonyloxy group having 6 to 20 carbon atoms such as naphthoyloxy, a linear, branched or cyclic alkylsulfonyloxy group having 1 to 20 carbon atoms such as mesyloxy and the like, an arylsulfonyloxy group having 6 to 20 carbon atoms such as tosyloxy and the like, a linear, branched or cyclic alkoxycarbonyl group having 2 to 20 carbon atoms such as methoxycarbonyl, ethoxycarbonyl, n-propoxycarbonyl, isopropoxycarbonyl, n-butoxycarbonyl, tert-butoxycarbonyl, cyclohexyloxycarbonyl and the like, a linear, branched or cyclic alkoxycarbonylalkyl group having 3 to 20 carbon atoms such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl and the like, are each independently listed as specific examples thereof. Among them, a hydrogen atom, a linear, branched or cyclic alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkoxycarbonyl group having 2 to 20 carbon atoms and a linear, branched or cyclic alkoxycarbonylalkyl group having 3 to 20 carbon atoms are preferable. A hydrogen atom, a linear or branched alkyl group having 1 to 10 carbon atoms, a linear or branched alkoxycarbonyl group having 2 to 10 carbon atoms and a linear or branched alkoxycarbonylalkyl group having 3 to 10 carbon atoms are more preferable.

$X^1$ represents —O— or —$CR^7_2$— (wherein, $R^7$ represents a hydrogen atom or a linear or branched alkyl group having 1 to 10 carbon atoms) and when j is 1 to 3, $X^1$s may be the same or different. Specific examples of $R^7$ include a hydrogen atom and a linear or branched alkyl group having 1 to 10 carbon atoms such as methyl, ethyl, n-propyl, isopropyl, n-butyl, tert-butyl and the like. $X^1$ represents preferably —O— or —$CH_2$—, and more preferably, all of $X^1$s are either —O— or —$CH_2$—. Also, j represents preferably 0 or 1.

Specific examples of the general formula [1] include the structural unit [A] represented by the chemical formulae [19-1-1] to [22-4-20]:

[Chem. 19]

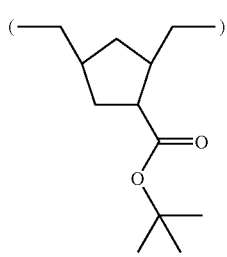
[19-1-1]

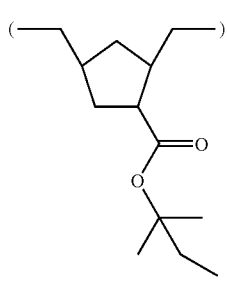
[19-1-2]

[19-1-3]
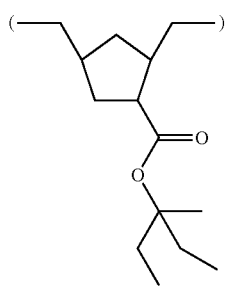
[19-1-4]
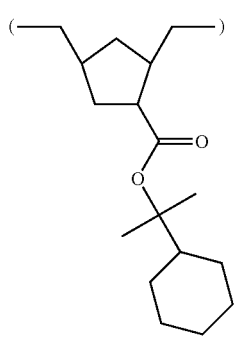
[19-1-5]
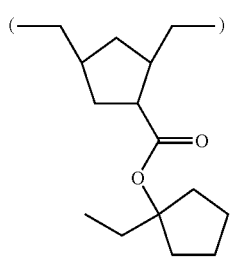
[19-1-6]
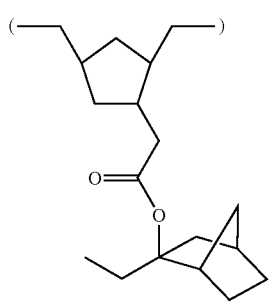
[19-1-7]
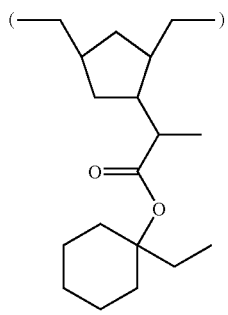
[19-1-8]
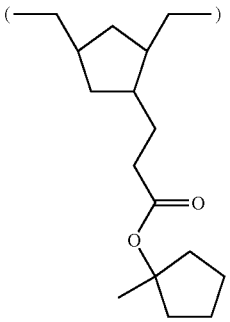
[19-1-9]
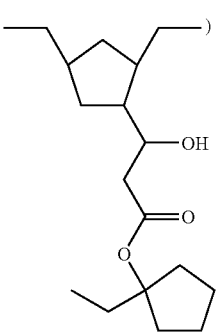
[19-1-10]
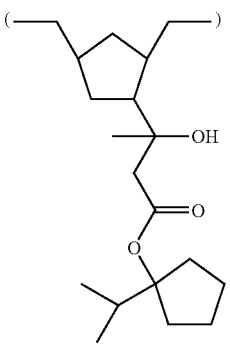
[19-1-11]
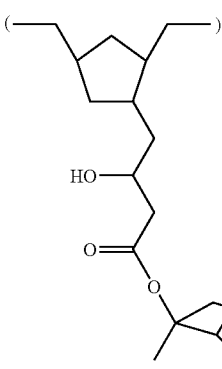

[19-1-12]
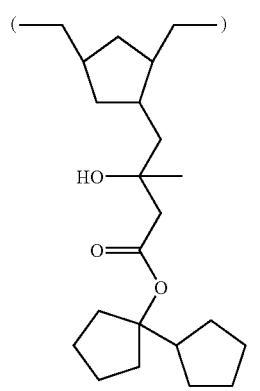
[19-1-13]
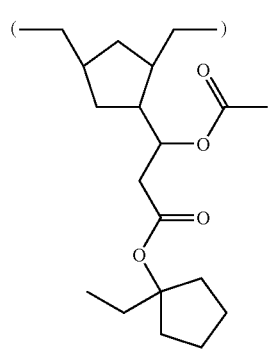
[19-1-14]
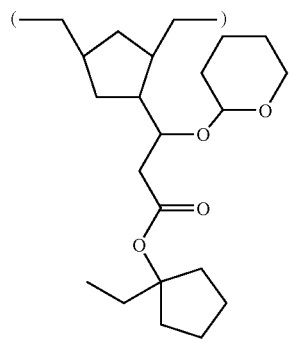
[19-1-15]
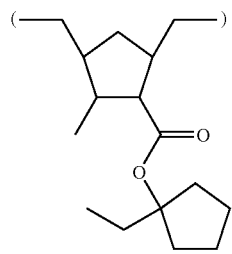
[19-1-16]
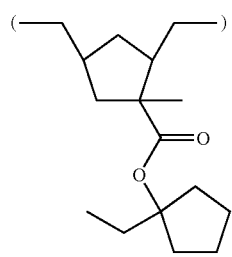
[19-1-17]
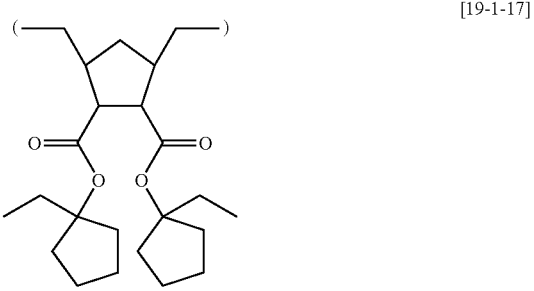
[19-1-18]
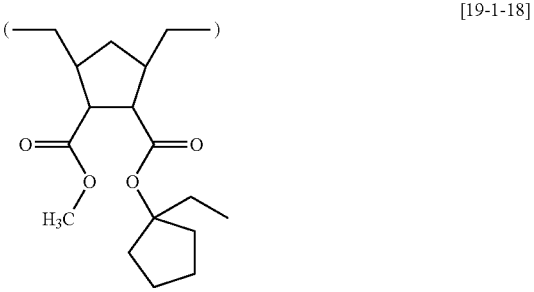
[19-1-19]
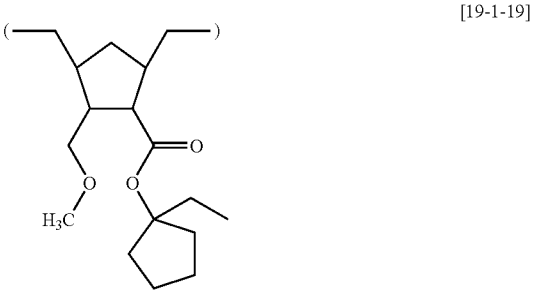
[19-1-20]
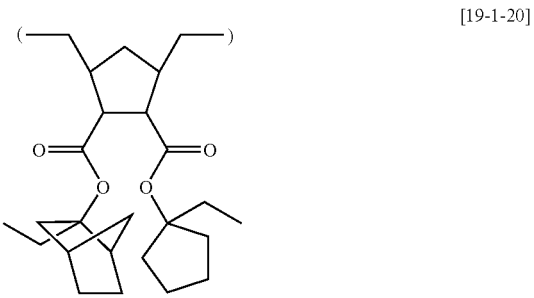
[Chem. 20]
[20-1-1]
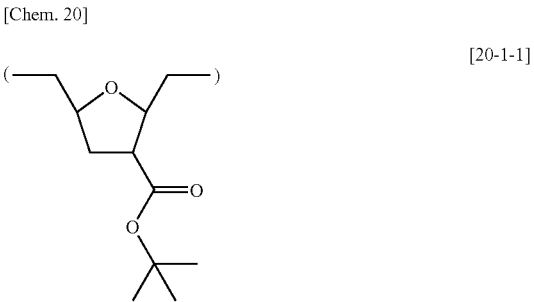

-continued
[20-1-2] 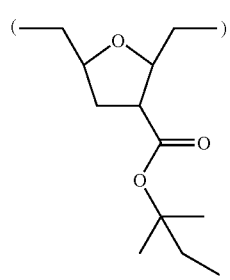
[20-1-3] 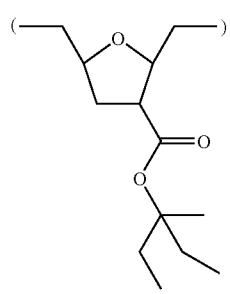
[20-1-4] 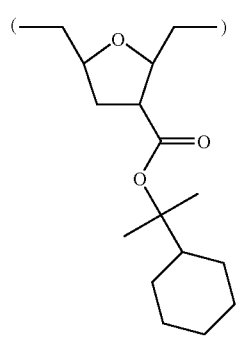
[20-2-5] 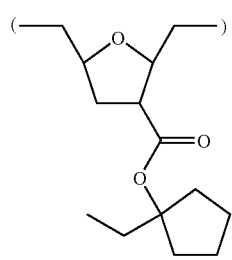
[20-2-6] 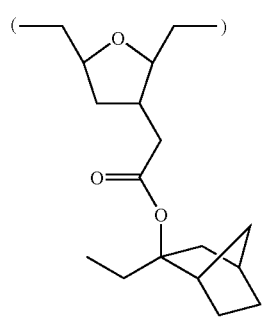
-continued
[20-2-7] 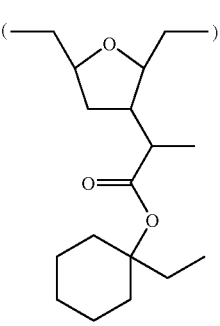
[20-2-8] 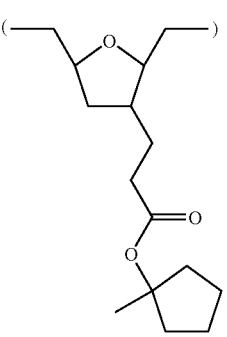
[20-2-9] 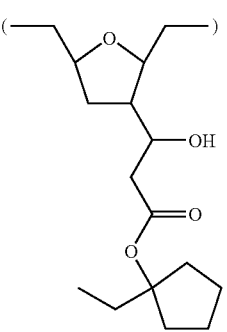
[20-2-10] 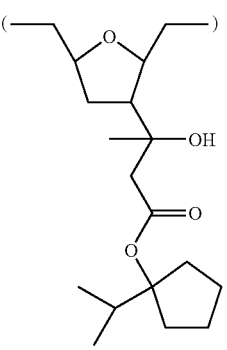

[20-2-11]
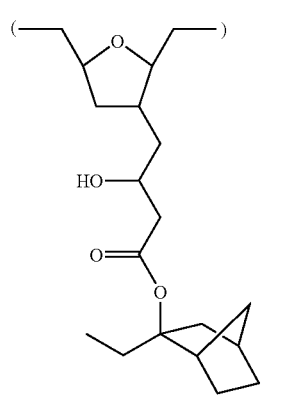
[20-2-12]
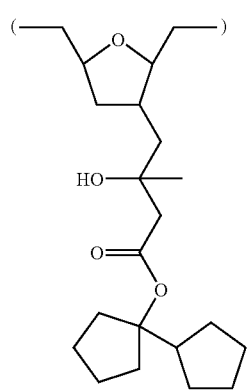
[20-2-13]
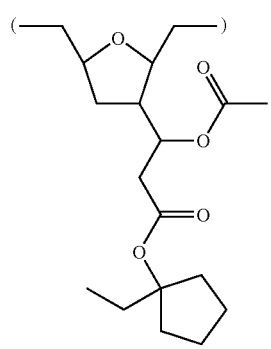
[20-2-14]
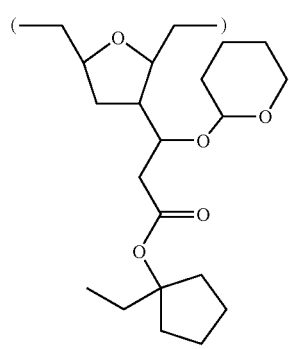
[20-2-15]
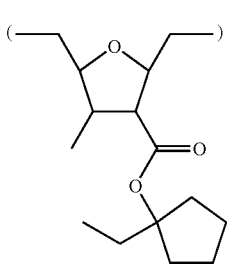
[20-2-16]
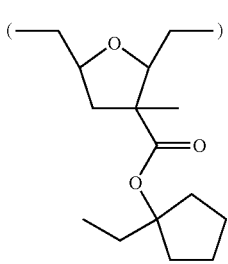
[20-2-17]
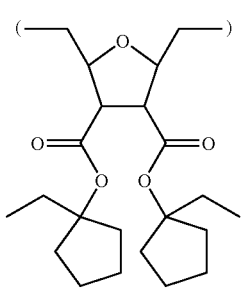
[20-2-18]
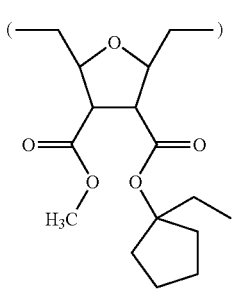
[20-2-19]
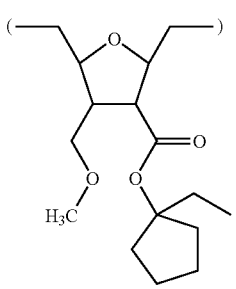

-continued
[20-2-20]
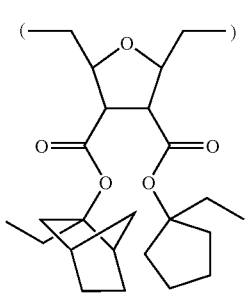
[Chem. 21]
[21-3-1]
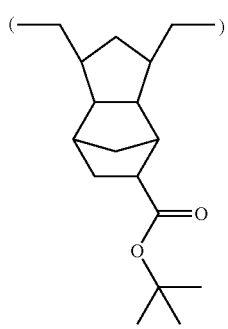
[21-3-2]
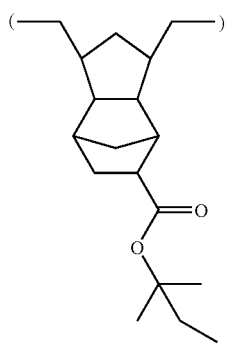
[21-3-3]
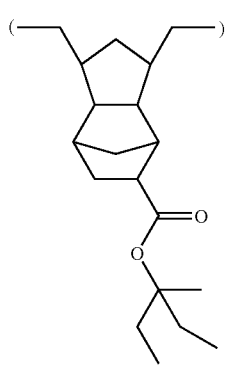
[21-3-4]
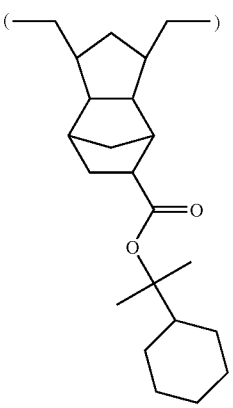
[21-3-5]
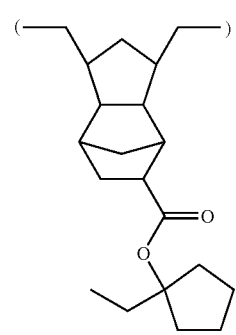
[21-3-6]
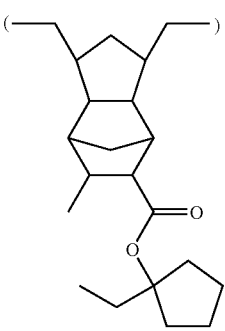
[21-3-7]
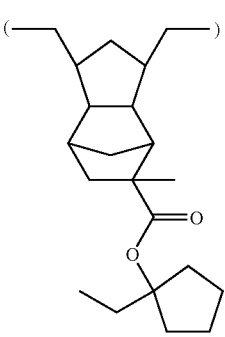

[21-3-8]
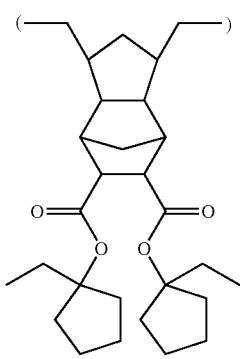
[21-3-9]
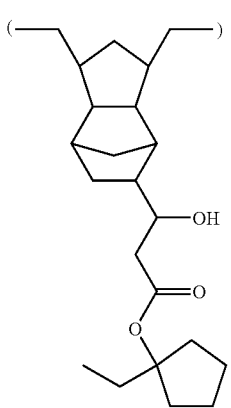
[21-3-10]
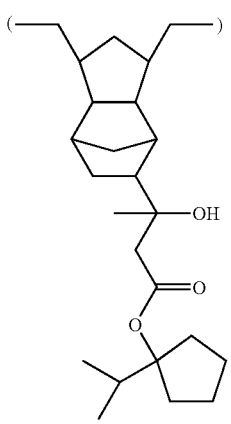
[21-3-11]
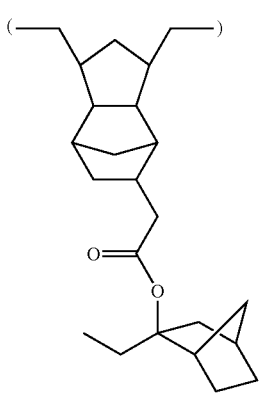
[21-3-12]
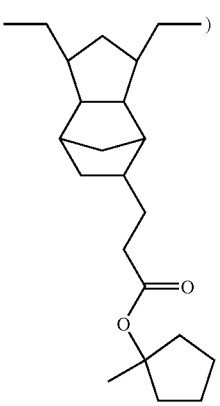
[21-3-13]
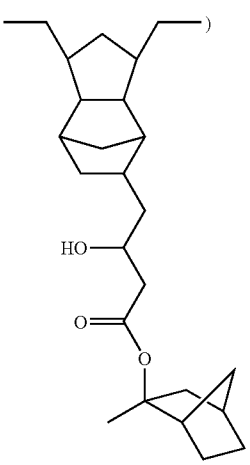
[21-3-14]
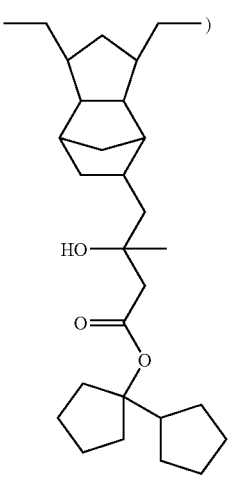

-continued
[21-3-15]
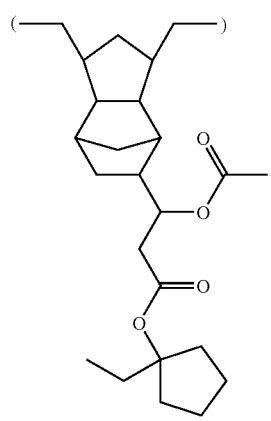
[21-3-16]
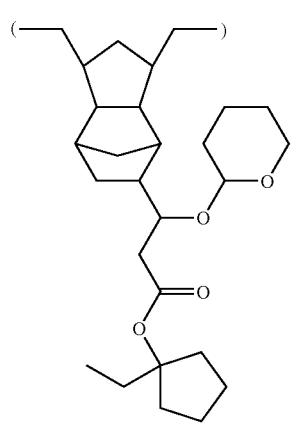
[21-3-17]
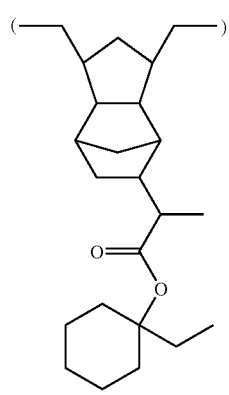
[21-3-18]
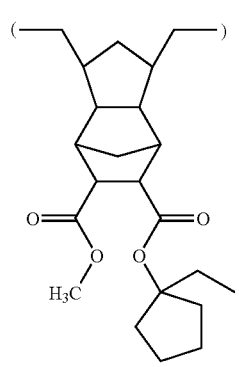
-continued
[21-3-19]
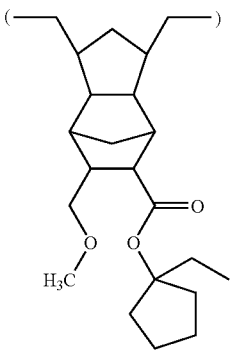
[21-3-20]
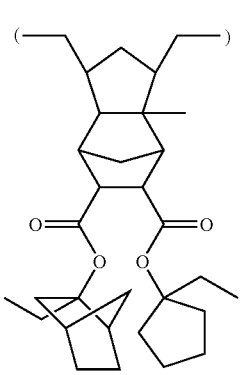
[21-3-21]
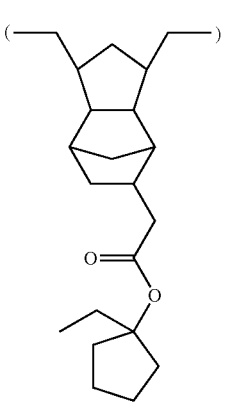
[Chem. 22]
[22-4-1]
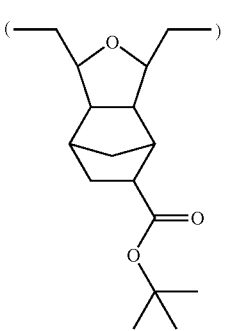

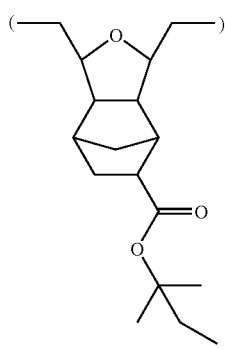
[22-4-2]
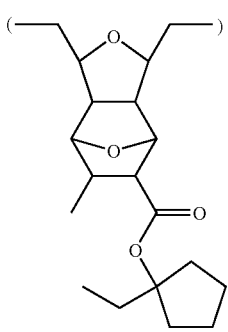
[22-4-6]
[22-4-3]
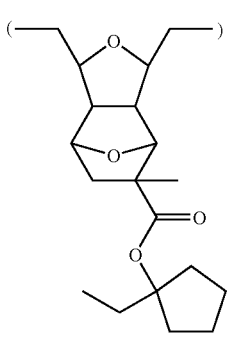
[22-4-7]
[22-4-4]
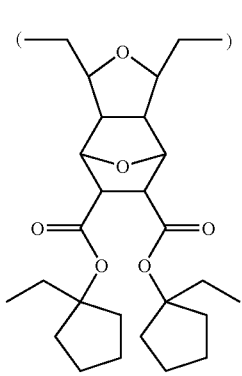
[22-4-8]
[22-4-5]
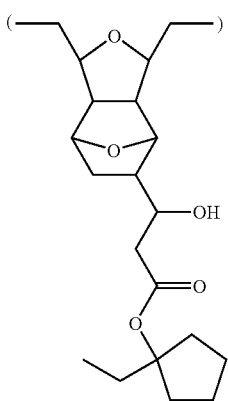
[22-4-9]

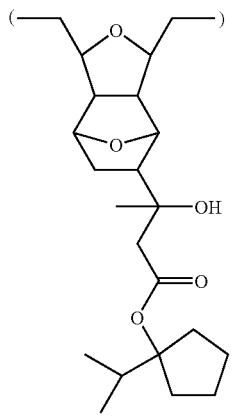
[22-4-10]
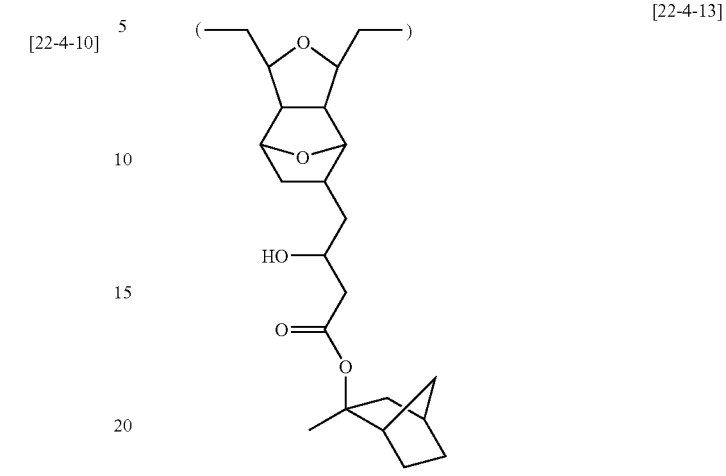
[22-4-13]
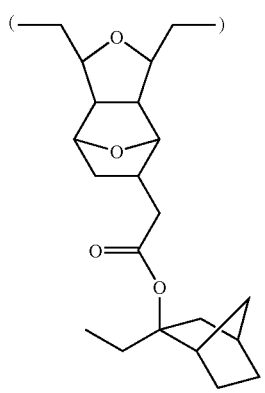
[22-4-11]
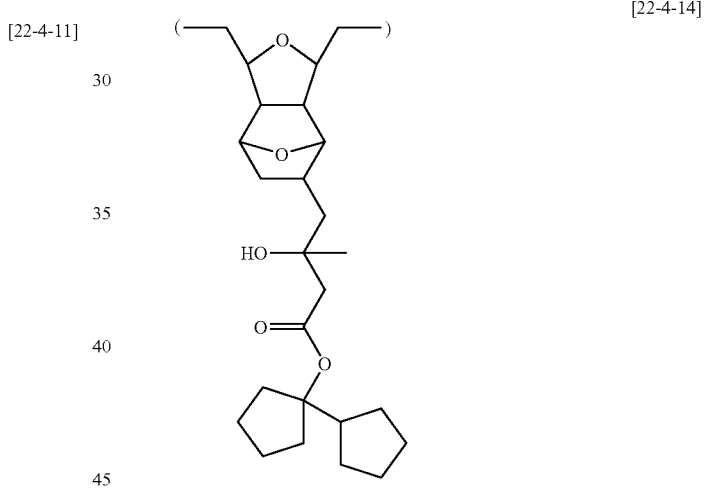
[22-4-14]
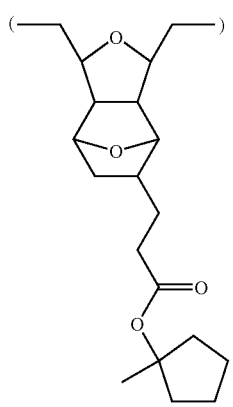
[22-4-12]
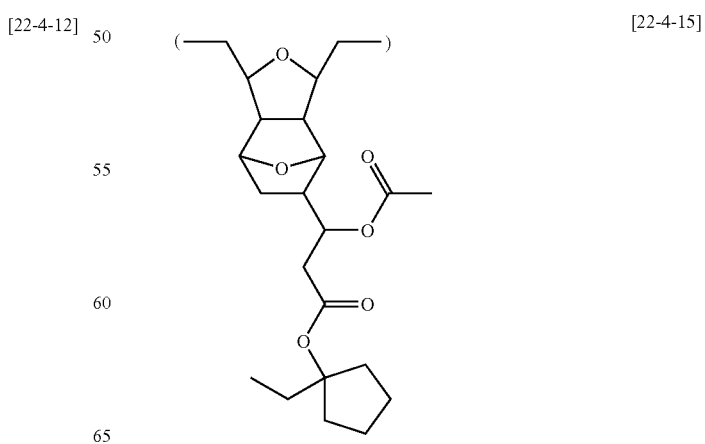
[22-4-15]

-continued

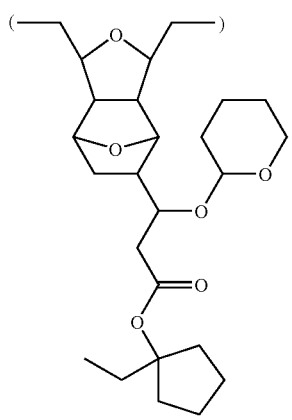

[22-4-16]

[22-4-17]

[22-4-18]

[22-4-19]

-continued

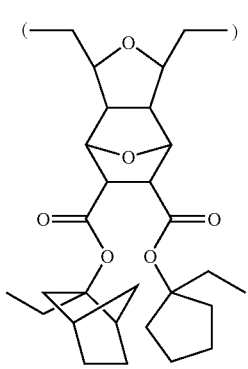

[22-4-20]

[Chem. 23]

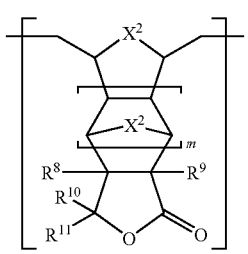

[3]

Further, regarding the general formula [3], $R^8$ to $R^{11}$ each independently represent a hydrogen atom or a linear, branched or cyclic alkyl group having 1 to 10 carbon atoms such as methyl, ethyl, n-propyl, isopropyl, n-butyl, tert-butyl, cyclohexyl, menthyl and the like. $X^2$ represents —O— or —$CR^{12}_2$— (wherein, $R^{12}$ represents a hydrogen atom or a linear or branched alkyl group having 1 to 10 carbon atoms) and when m is 1 to 3, $X^2$ may be the same or different. Specific examples of $R^{12}$ include a hydrogen atom or a linear or branched alkyl group having 1 to 10 carbon atoms such as methyl, ethyl, n-propyl, isopropyl, n-butyl and tert-butyl and the like. $X^2$ represents preferably —O— or —$CH_2$—, and more preferably, all of $X^2$ are either —O— or —$CH_2$—. Also, m is preferably 0 or 1.

Specific examples of the general formulae [3] include the following chemical formula [23-1] to [23-16]:

[Chem. 24]

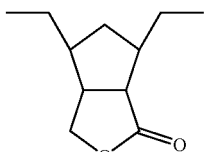

[23-1]

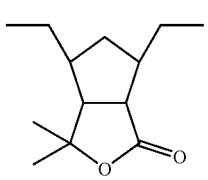

[23-2]

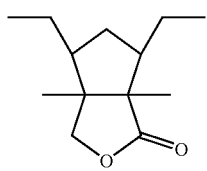 [23-3]
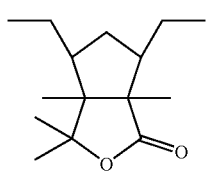 [23-4]
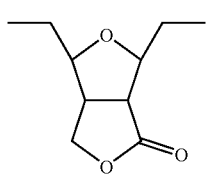 [23-5]
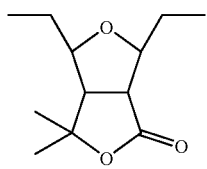 [23-6]
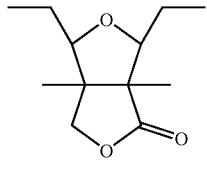 [23-7]
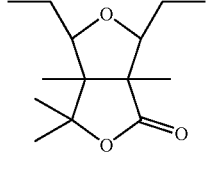 [23-8]
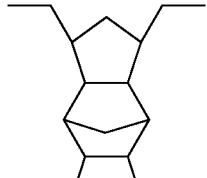 [23-9]
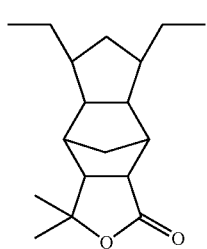 [23-10]
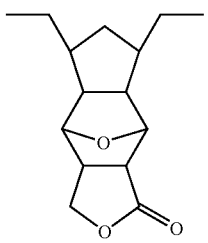 [23-11]
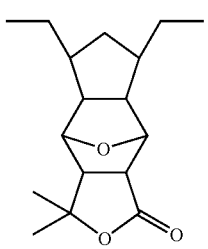 [23-12]
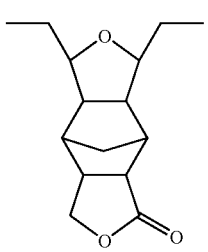 [23-13]
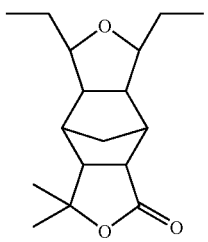 [23-14]
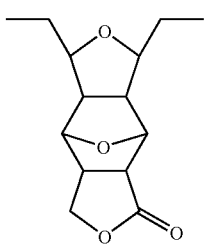 [23-15]
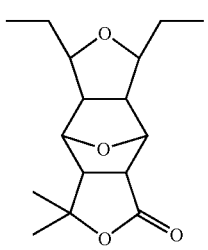 [23-16]

-continued

[Chem. 25]

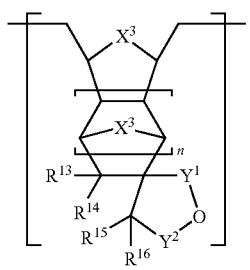
[4]

Further, regarding the general formula [4], specific examples of $R^{13}$ to $R^{16}$ each independently include a hydrogen atom, or linear, branched or cyclic alkyl group having 1 to 10 carbon atoms such as methyl, ethyl, n-propyl, isopropyl, n-butyl, tert-butyl, cyclohexyl, menthyl and the like. $X^3$ represent —O— or —$CR^{17}_2$— (wherein, $R^{17}$ represents a hydrogen atom or a linear or branched alkyl group having 1 to 10 carbon atoms) and when n is 1 to 3, $X^3$s may be the same or different. Specific examples of $R^{17}$ include a hydrogen atom, or a linear or branched alkyl group having 1 to 10 carbon atoms such as methyl, ethyl, n-propyl, isopropyl, n-butyl, tert-butyl and the like. $X^3$ represents preferably —O— or —$CH_2$—, and more preferably, all of $X^3$s are either —O— or —$CH_2$—. One of $Y^1$ and $Y^2$ represents —(C=O)— and the other of $Y^1$ and $Y^2$ represents —$CR^{18}_2$— (wherein, $R^{18}$ represents a hydrogen atom or a linear or branched alkyl group having 1 to 10 carbon atoms). Specific examples of $R^{18}$ include a hydrogen atom, or a linear or branched alkyl group having 1 to 10 carbon atoms such as methyl, ethyl, n-propyl, isopropyl, n-butyl, tert-butyl and the like. One of $Y^1$ and $Y^2$ represents preferably —(C=O)— and the other is —$CH_2$—. Also, n is preferably 0 or 1.

Specific examples of the general formula [4] include the following chemical formulae [24-1] to [24-16]:

[Chem. 26]

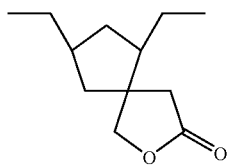
[24-1]

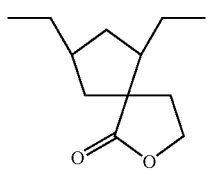
[24-2]

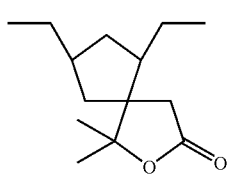
[24-3]

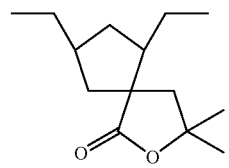
[24-4]

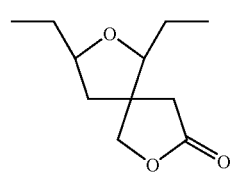
[24-5]

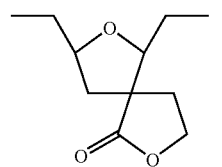
[24-6]

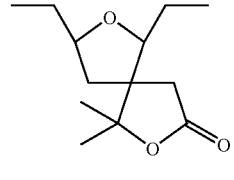
[24-7]

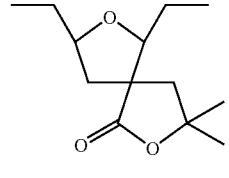
[24-8]

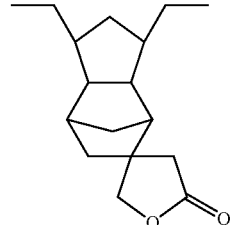
[24-9]

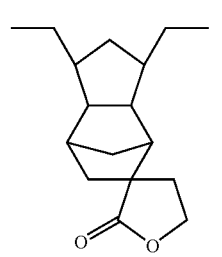
[24-10]

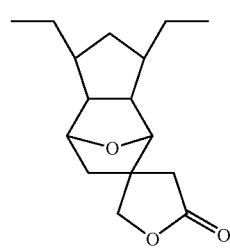
[24-11]

-continued
[24-12]
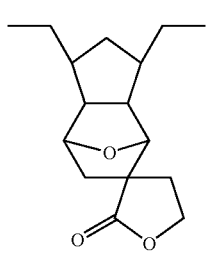
[24-13]
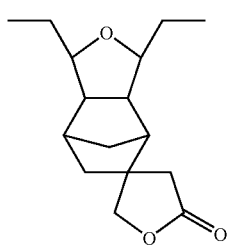
[24-14]
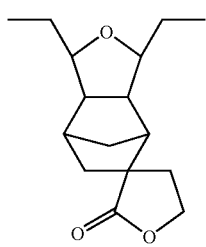
[24-15]
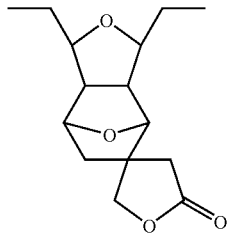
[24-16]
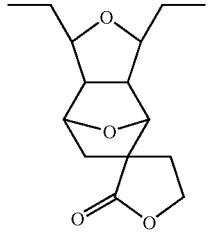
[Chem. 27]
[5]
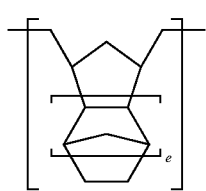
Examples of the general formula [5] (wherein, e is 0 or an integer of 1 to 3) include the following chemical formulae [25-5-1] to [25-5-4], and e is preferably 0 or 1:
[Chem. 28]
[25-5-1]
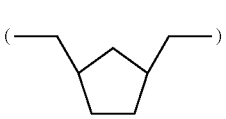
[25-5-2]
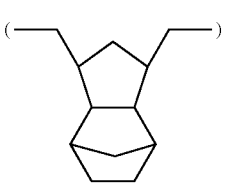
[25-5-3]
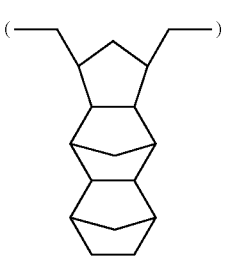
[25-5-4]
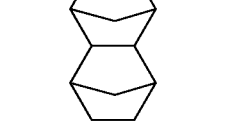
[Chem. 29]
[6]
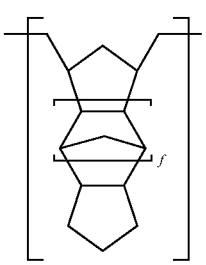
Examples of the general formula [6] (wherein, f is 0 or an integer of 1 to 3) include the following chemical formulae [26-6-1] to [26-6-4], and f is preferably 0, 1 or 2:
[Chem. 30]
[26-6-1]
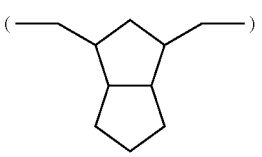

-continued

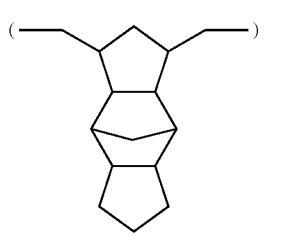
[26-6-2]

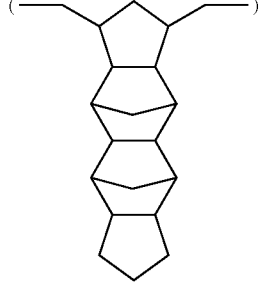
[26-6-3]

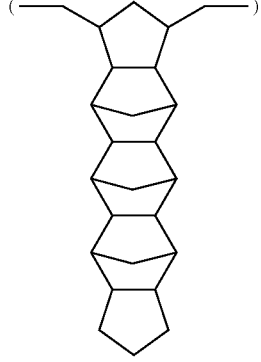
[26-6-4]

In the hydrogenated ring-opening metathesis polymer of the present invention, at least one of $X^1$ of the general formula [1] in the structural unit [A], $X^2$ of the general formula [3], and $X^3$ of the general formula [4] in the structural unit [B] represents —O—. The presence of an oxygen atom in the aliphatic cyclic compound which is the main chain improves adhesion to a substrate to be treated such as a silicon substrate, and wet tension in development with an alkali aqueous solution, and enhances solubility in polar organic solvents such as ketones, alcohols and the like used in a process of applying a resist agent onto a silicon wafer, affinity to water, and developing property with a photoresist remover (or a developer) such as an alkali aqueous solution and the like after exposure. Preferable is a hydrogenated ring-opening metathesis polymer in which at least one of $X^1$ of the general formula [1] in the structural unit [A], $X^2$ of the general formula [3] and $X^3$ of the general formula [4] in the structural unit [B] represents —O— and the others represent —CH$_2$—. The molar amount of the —O— unit based on the total of unit molar amounts of $X^1$, $X^2$ and $X^3$ is 1 to 99 mol %, preferably 2 to 95 mol %, more preferably, 5 to 80 mol %, and most preferably 10 to 70 mol %.

In the present invention, the molar ratio of the structural unit [A] represented by the general formula [1], the structural unit [B] represented by the general formula [3] and/or [4], and the structural unit [C] represented by the general formula [5] and/or [6] satisfies that [A]/([B]+[C]) is from 20/80 to 98/2, ([A]+[B])/[C] is from 99/1 to 50/50, and ([A]+[C])/[B] is from 99/1 to 21/79, simultaneously and it is essential that a certain amount of the units [B] and [C] in addition to the structural unit [A] is present. Here, the structural unit [A] contains a tertiary ester group represented by the general formula [2], namely a group which is decomposed by an acid generated from a photo-sensitizer in exposure, to produce a carboxylic acid. The structural unit [A] is necessary for making a resist pattern by developing with an alkali aqueous solution after exposure. Further, the structural unit [B] is necessary for bringing on adhesion with a substrate to be treated such as a silicon substrate. The structural unit [C] is necessary for controlling dissolution contrast by imparting a solubility-inhibition property in an alkali developer. When the molar ratio [A]/([B]+[C]) is less than 20/80, a dissolving rate after light exposure is inadequate, and thereby development becomes insufficient, and when more than 98/2, adhesion with a substrate to be treated may be insufficient or there might be the problem of insufficient resolution. Also, it is essential that the molar ratio ([A]+[B])/[C] is equal to or more than 99/1 for bringing on the effect of improving the developing property by the structural unit [C]. However, when the molar ratio is more than 50/50, affinity to water is too low and thus developing property becomes deteriorated. Further, when the molar ratio ([A]+[C])/[B] is less than 99/1, adhesion with a substrate to be treated may not be brought on, and when more than 21/79, development becomes deteriorated. Accordingly, it is essential to satisfy that [A]/([B]+[C]) is from 20/80 to 98/2, ([A]+[B])/[C] is from 99/1 to 50/50, and ([A]+[C])/[B] is from 99/1 to 21/79, simultaneously, and preferably, [A]/([B]+[C]) is from 20/80 to 88/12, ([A]+[B])/[C] is from 95/5 to 60/40, and ([A]+[C])/[B] is from 93/7 to 25/75, simultaneously, and more preferably, [A]/([B]+[C]) is from 20/80 to 70/30, ([A]+[B])/[C] is from 90/10 to 70/30, and ([A]+[C])/[B] is from 80/20 to 40/60, simultaneously.

The hydrogenated ring-opening metathesis polymer of the present invention preferably has the ratio of the weight-average molecular weight Mw to the number average molecular weight Mn, i.e., a molecular weight distribution (Mw/Mn) of 1.0 to 3.0. The molecular weight distribution greatly affects resolution when the hydrogenated ring-opening metathesis polymer is used as a resist composition. The narrower the molecular weight distribution is, the higher a pattern of high resolution obtained becomes. The hydrogenated ring-opening metathesis polymer of the present invention usually has a number average molecular weight Mn from 2,000 to 200,000. Preferably, it is from 3,000 to 100,000, and more preferably, from 5,000 to 50,000. In addition, the number average molecular weight and the weight-average molecular weight described in the present specification can be measured by gel permeation chromatography (GPC) in terms of polystyrene standard using a proper solvent being capable of dissolving the hydrogenated ring-opening metathesis polymer of the present invention and a proper column being capable of separating it.

Further, these hydrogenated ring-opening metathesis polymers may be composed of each one structural unit of [A], [B] and [C], or two or more structural units of any of or all of [A], [B] and [C]. Foe example, hydrogenated ring-opening metathesis polymers are composed of the structural unit [A] of structural units [A-1-1] and [A-1-2] represented by the following general formulae [1-1] and [1-2], respectively:

[Chem. 31]

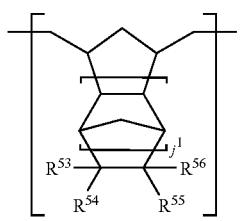

[1-1]

wherein, at least one of $R^{53}$ to $R^{56}$ is a functional group having an acid-unstable group, represented by the following general formula [2], and the remaining groups of $R^{53}$ to $R^{56}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms, and $j^1$ represents an integer of 0 or 1 to 3.),

[Chem. 32]

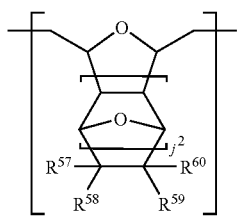

[1-2]

wherein, at least one of $R^{57}$ to $R^{60}$ is a functional group having an acid-unstable group represented by the following general formula [2], and the remaining groups of $R^{57}$ to $R^{60}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms, and $j^2$ represents an integer of 0 or 1 to 3.);

the structural unit [B] of structural units [B-3-1] and [B-3-2] represented by the following formulae [3-1] and [3-2], respectively, and/or structural units [B-4-1] and [B-4-2] represented by the following formulae [4-1] and [4-2]:

[Chem. 33]

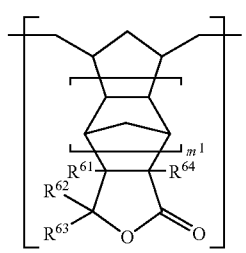

[3-1]

wherein, $R^{61}$ to $R^{64}$ each independently represent a hydrogen atom or a linear, branched or cyclic alkyl group having 1 to 10 carbon atoms, and $m^1$ represents an integer of 0 or 1 to 3.

[Chem. 34]

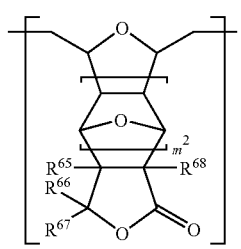

[3-2]

wherein, $R^{65}$ to $R^{68}$ each independently represent a hydrogen atom or a linear, branched or cyclic alkyl group having 1 to 10 carbon atoms, and $m^2$ represents an integer of 0 or 1 to 3.

[Chem. 35]

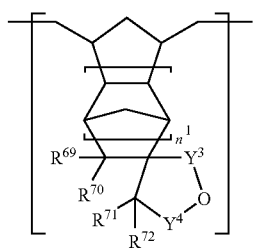

[4-1]

wherein, $R^{69}$ to $R^{72}$ each independently represent a hydrogen atom or a linear, branched or cyclic alkyl group having 1 to 10 carbon atoms, one of $Y^3$ and $Y^4$ represents —(C=O)— and the other of $Y^3$ and $Y^4$ represents —CH$_2$— and $n^1$ represents an integer of 0 or 1 to 3.).

[Chem. 36]

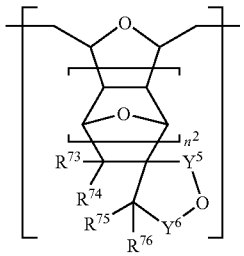

[4-2]

wherein, $R^{73}$ to $R^{76}$ each independently represent hydrogen atom or a linear, branched or cyclic alkyl group having 1 to 10 carbon atoms, one of $Y^5$ and $Y^6$ represents —(C=O)—, the other represents —CH$_2$—, and $n^2$ represents an integer of 0 or 1 to 3; and the structural unit [C] represented by the general formula [5] and/or [6].

It is preferable that the hydrogenated ring-opening metathesis copolymer of the present invention has a structural unit [D] represented by the following general formula [7] further as a structural unit in addition to the structural units [A], [B] and [C], for further improving adhesion to substrates and affinity to developers:

[Chem. 37]

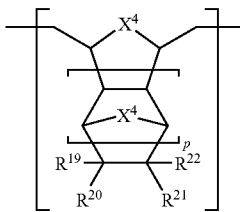

[7]

[Chem. 38]
wherein at least one of $R^{19}$ to $R^{22}$ represents a functional group having a carboxyl group represented by the following general formula [8]:

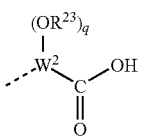

[8]

wherein, the chain line represents a coupling hand, $R^{23}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $W^2$ represents a single bond or a (q+2)-valent hydrocarbon group having 1 to 10 carbon atoms. q represents 0 or 1, and when q is 0, $W^2$ represents a single bond), and the remaining groups of $R^{19}$ to $R^{22}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms, and $X^4$s are the same or different and represent —O— or —CR$^{24}_2$— wherein $R^2$ represents a hydrogen atom or a linear or branched alkyl group having 1 to 10 carbon atoms, p represents an integer of 0 or 1 to 3.

Regarding $R^{23}$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, 1-ethylcyclopentyl, 1-ethylcyclohexyl and the like; examples of the linear, branched or cyclic alkoxyalkyl group having 2 to 10 carbon atoms includes methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like; and examples of the linear, branched or cyclic acyl group having 1 to 10 carbon atoms includes formyl, acetyl, pivaloyl, cyclohexylcarbonyl and the like. Among these groups $R^{23}$, a linear or branched alkyl group having 1 to 6 carbon atoms, a linear, branched or cyclic alkoxyalkyl group having 2 to 7 carbon atoms and a linear or branched acyl group having 2 to 7 carbon atoms, and particularly, a hydrogen atom, methyl, ethyl, methoxymethyl, 1-ethoxyethyl, tetrahydrofuran-2-yl and acetyl are preferable.

Regarding $W^2$, a (q+2)-valent hydrocarbon group having 1 to 10 carbon atoms is a linear, branched or cyclic divalent hydrocarbon group having 1 to 10 carbon atoms when q is 0, and examples thereof include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, 1,4-cyclohexylene and the like. Among them, methylene, ethylidene, ethylene, 1-methylethylene, 2-methylethylene, trimethylene and 2-methyltrimethylene are preferable. When q is 1, for example, those having a coupling hand formed by removing one hydrogen atom at any position on the hydrocarbon group as described above when q is 0, are listed. Most preferably, $W^2$ represents a single bond.

Regarding the other groups of $R^{19}$ to $R^{22}$, a hydrogen atom, a linear, branched or cyclic alkyl group having 1 to 20 carbon atoms such as methyl, ethyl, propyl, isopropyl, n-butyl, tert-butyl, cyclohexyl, menthyl and the like, halogens such as a chlorine atom, a bromine atom, an iodine atom, a fluorine atom and the like, a linear, branched or cyclic halogenated alkyl group having 1 to 20 carbon atoms such as fluoromethyl, chloromethyl, bromomethyl, difluoromethyl, dichloromethyl, dibromomethyl, trifluoromethyl, trichloromethyl, tribromomethyl and the like, a linear, branched or cyclic alkoxy group having 1 to 20 carbon atoms such as methoxy, ethoxy, isopropoxy, n-butoxy, tert-butoxy, menthoxy and the like, a linear, branched or cyclic alkoxyalkyl group having 2 to 20 carbon atoms such as methoxymethyl, methoxyethyl, tert-butoxymethyl, tert-butoxyethyl, methoxymenthol and the like, or groups containing alkoxy saccharides such as methylglucose and the like, a linear, branched or cyclic alkylcarbonyloxy group having 2 to 20 carbon atoms such as acetoxy and the like, an arylcarbonyloxy group having 6 to 20 carbon atoms such as naphthoyloxy, a linear, branched or cyclic alkylsulfonyloxy group having 1 to 20 carbon atoms such as mesyloxy and the like, an arylsulfonyloxy group having 6 to 20 carbon atoms such as tosyloxy and the like, a linear, branched or cyclic alkoxycarbonyl group having 2 to 20 carbon atoms such as methoxycarbonyl, ethoxycarbonyl, n-propoxycarbonyl, isopropoxycarbonyl, n-butoxycarbonyl, tert-butoxycarbonyl, cyclohexyloxycarbonyl and the like, and a linear, branched or cyclic alkoxycarbonylalkyl group having 3 to 20 carbon atoms such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl and the like are each independently listed as specific examples thereof. Among these, a hydrogen atom, a linear, branched or cyclic alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkoxycarbonyl group having 2 to 20 carbon atoms and a linear, branched or cyclic alkoxycarbonylalkyl group having 3 to 20 carbon atoms are preferable. A hydrogen atom, a linear or branched alkyl group having 1 to 10 carbon atoms, a linear or branched alkoxycarbonyl group having 2 to 10 carbon atoms and a linear or branched alkoxycarbonylalkyl group having 3 to 10 carbon atoms are more preferable.

$X^4$ represents —O— or —$CR^{24}_2$— (wherein, $R^2$ represents a hydrogen atom or a linear or branched alkyl group having 1 to 10 carbon atoms) and when p is 1 to 3, $X^4$s may be the same or different. Specific examples of $R^{24}$ include a hydrogen atom and a linear or branched alkyl group having 1 to 10 carbon atoms such as methyl, ethyl, n-propyl, isopropyl, n-butyl, tert-butyl and the like. $X^4$ represents preferably —O— or —$CH_2$—, and more preferably, all of $X^4$s are either —O— or —$CH_2$—. Also, p is preferably 0 or 1.

Specific examples of the general formulae [7] include the structural unit [D] represented by the following chemical formulae [27-1-1] to [27-4-16]:

[Chem. 39]

[27-1-1]

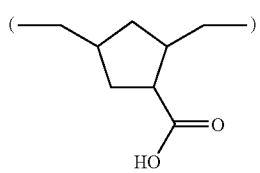

[27-1-2]

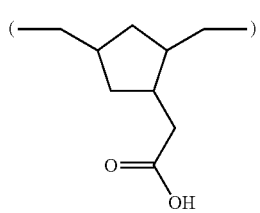

-continued

[27-1-3]

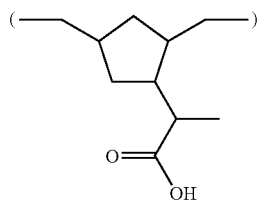

[27-1-4]

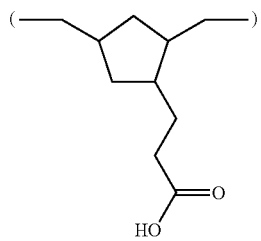

[27-1-5]

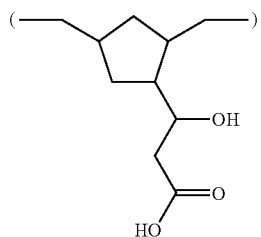

[27-1-6]

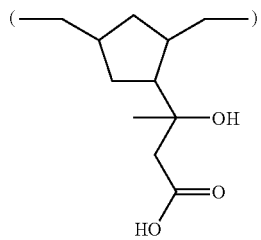

[27-1-7]

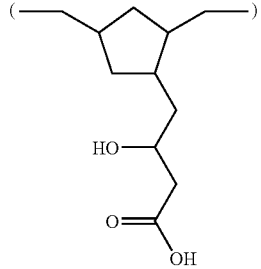

[27-1-8]

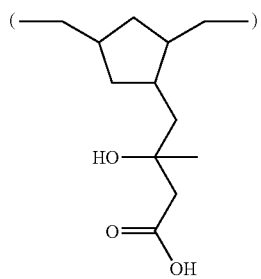

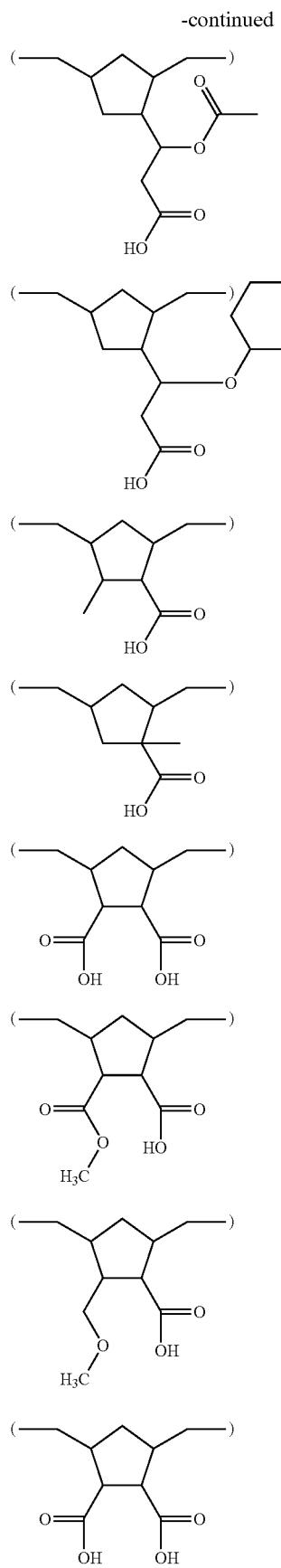
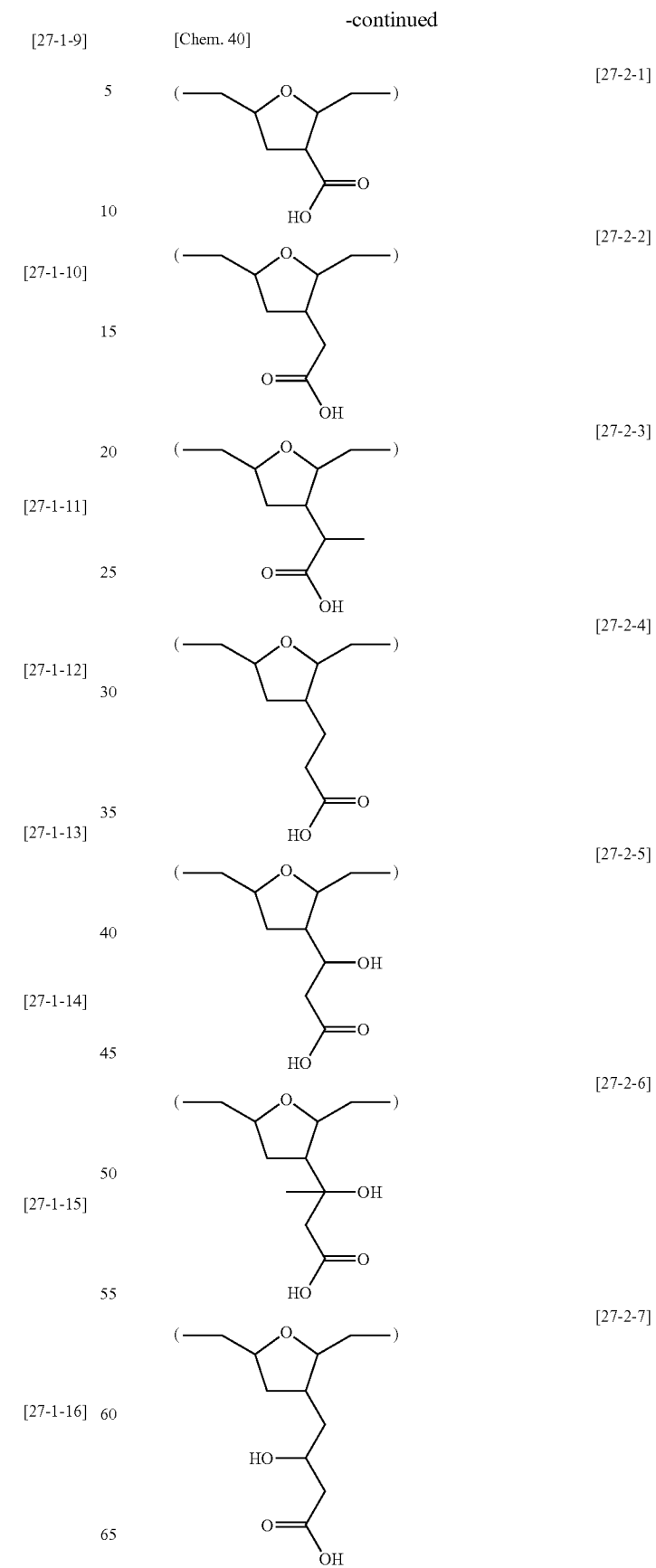

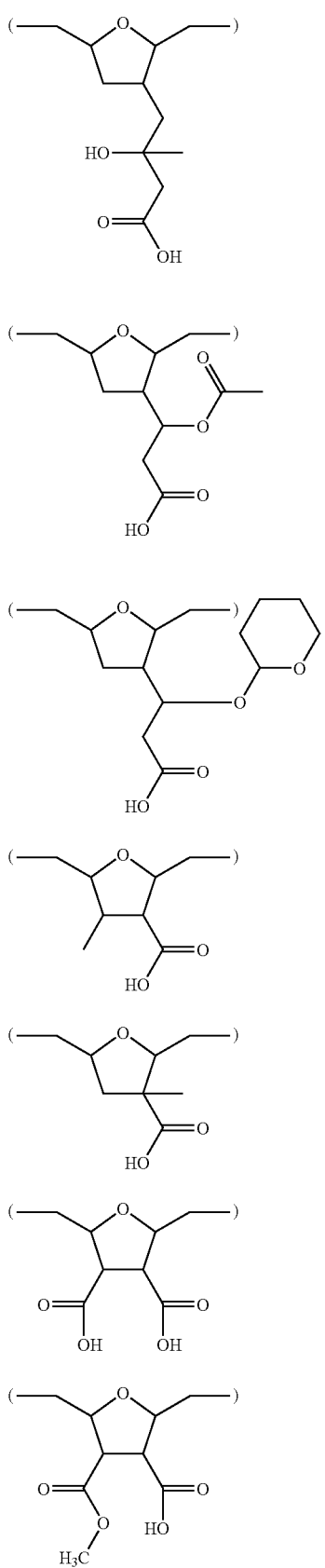
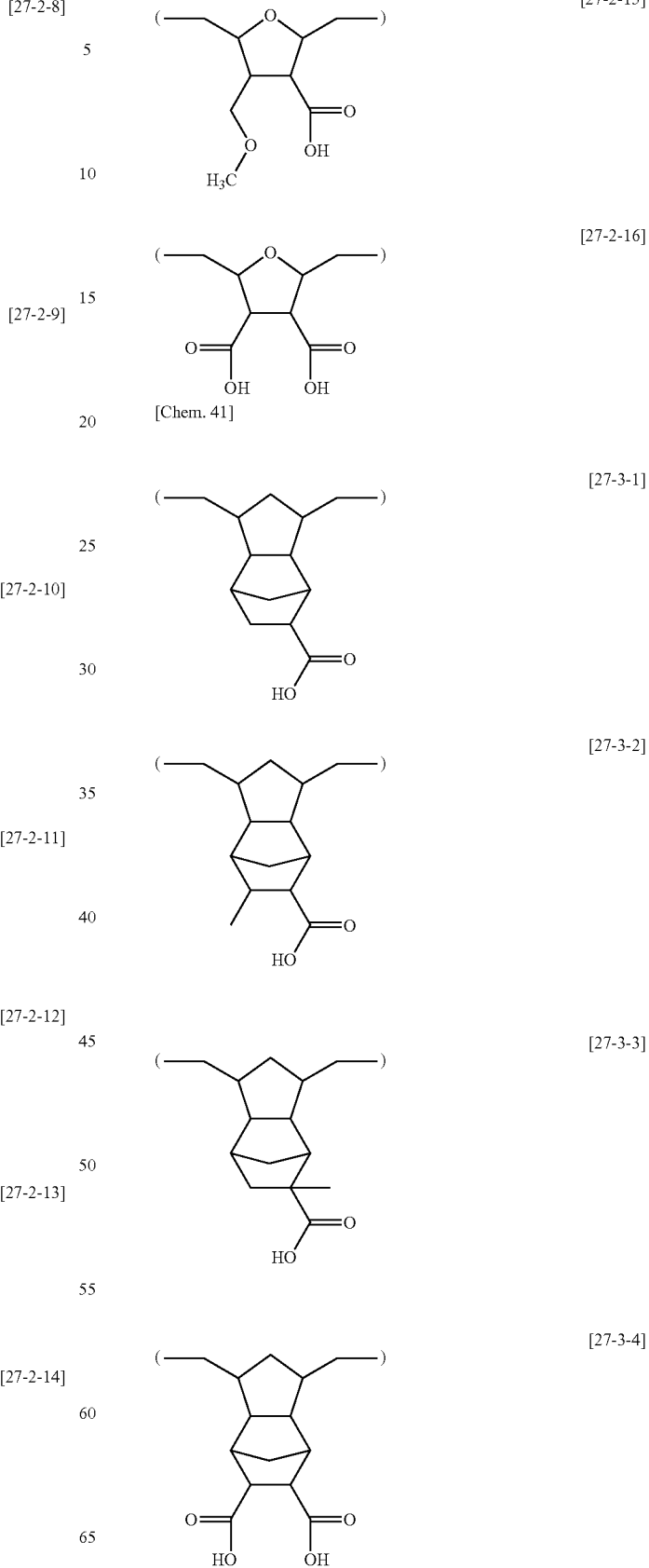

[27-3-5]
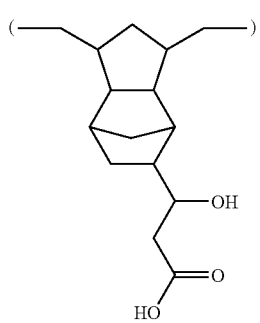
[27-3-6]
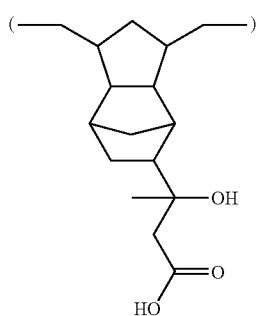
[27-3-7]
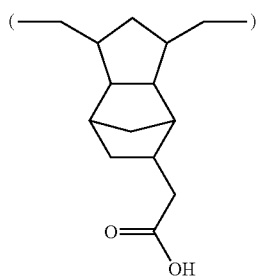
[27-3-8]
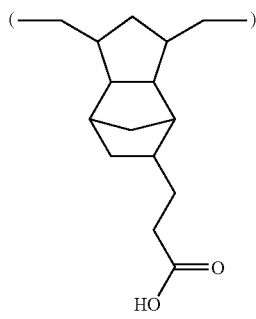
[27-3-9]
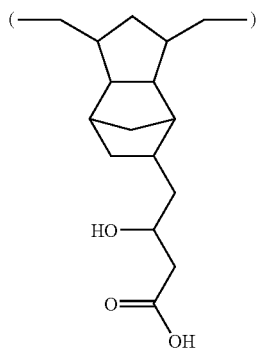
[27-3-10]
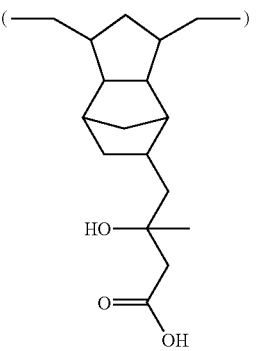
[27-3-11]
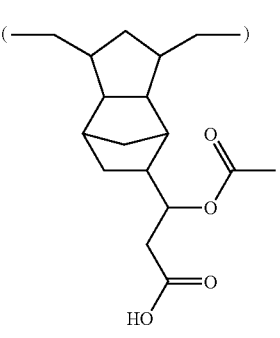
[27-3-12]
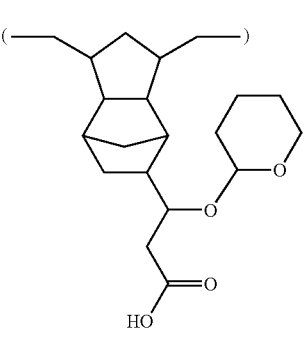
[27-3-13]
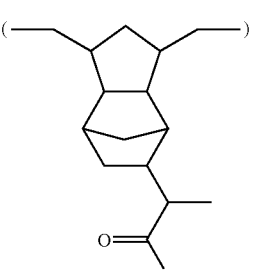
[27-3-14]
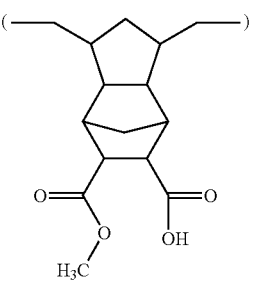

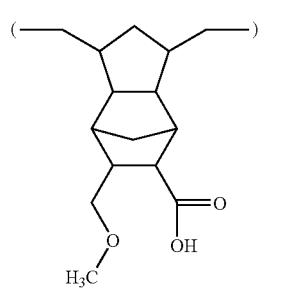
[27-3-15]
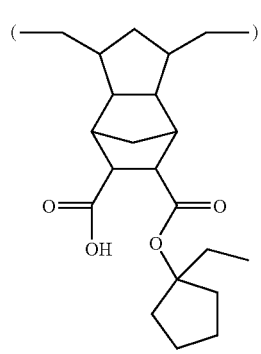
[27-3-16]
[Chem. 42]
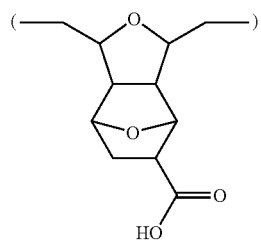
[27-4-1]
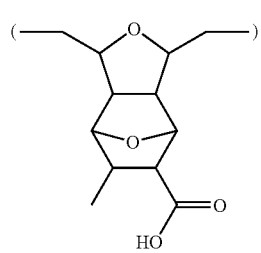
[27-4-2]
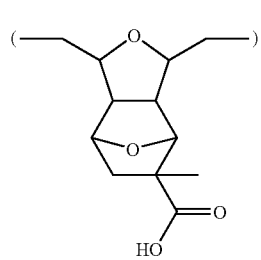
[27-4-3]
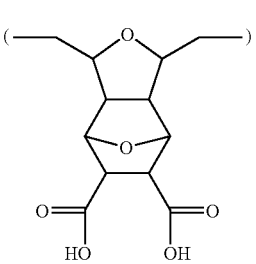
[27-4-4]
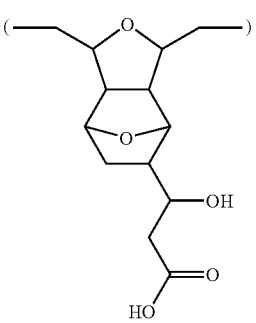
[27-4-5]
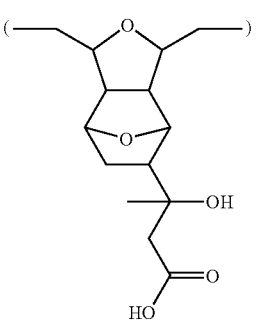
[27-4-6]
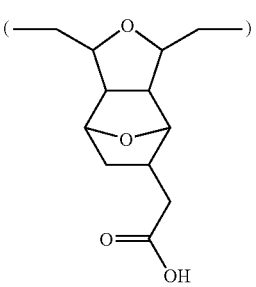
[27-4-7]
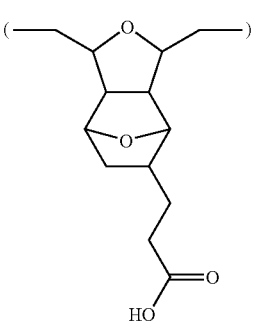
[27-4-8]

-continued

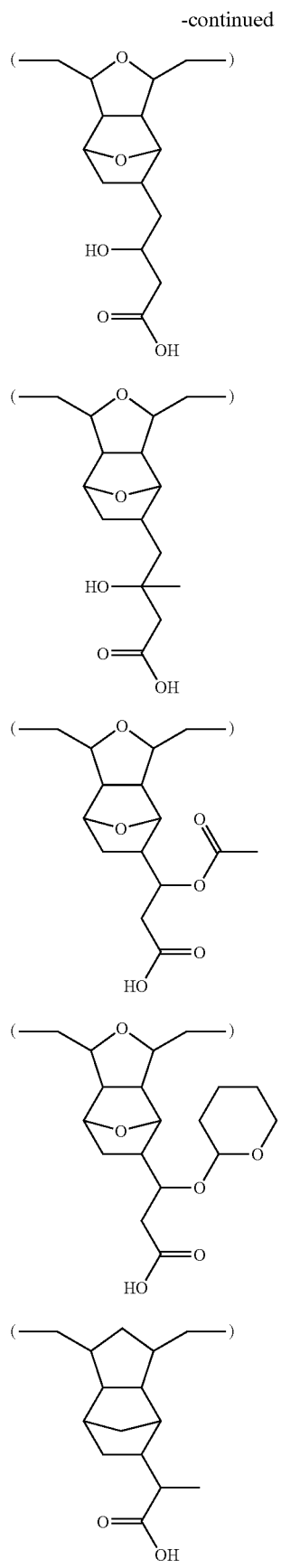

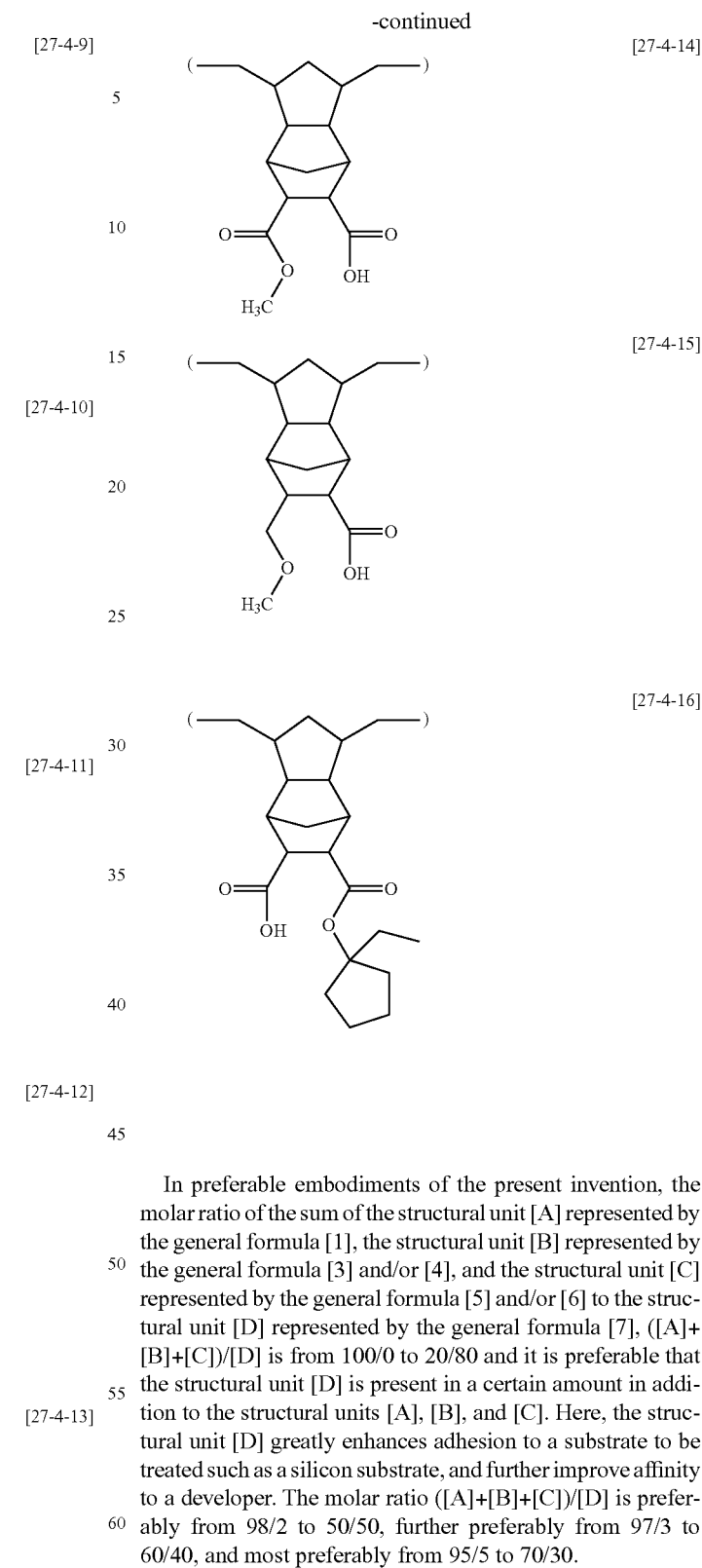

In preferable embodiments of the present invention, the molar ratio of the sum of the structural unit [A] represented by the general formula [1], the structural unit [B] represented by the general formula [3] and/or [4], and the structural unit [C] represented by the general formula [5] and/or [6] to the structural unit [D] represented by the general formula [7], ([A]+[B]+[C])/[D] is from 100/0 to 20/80 and it is preferable that the structural unit [D] is present in a certain amount in addition to the structural units [A], [B], and [C]. Here, the structural unit [D] greatly enhances adhesion to a substrate to be treated such as a silicon substrate, and further improve affinity to a developer. The molar ratio ([A]+[B]+[C])/[D] is preferably from 98/2 to 50/50, further preferably from 97/3 to 60/40, and most preferably from 95/5 to 70/30.

The hydrogenated ring-opening metathesis copolymer of the present invention may further have a structural unit [E] represented by the following general formula [9] as a structural unit in addition to the structural units [A], [B] and [C], and preferably further in addition to [D]:

[Chem. 43]

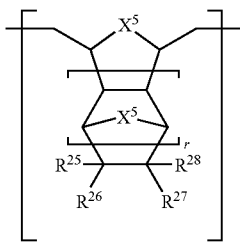

[9]

wherein at least one of $R^{25}$ to $R^{28}$ represents a functional group having a carboxylic acid ester group represented by the following general formula [10]:

[Chem. 44]

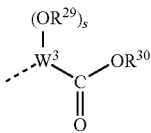

[10]

wherein the chain line represents a coupling hand, $R^{29}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms, $W^3$ represents a single bond or a (s+2)-valent hydrocarbon group having 1 to 10 carbon atoms, s represents 0 or 1, and when s is 0, $W^3$ represents a single bond.), and the remaining groups of $R^{25}$ to $R^{28}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms and $X^5$s are the same or different and represent —O— or —$CR^{31}_2$— wherein $R^{31}$ represents a hydrogen atom or a linear or branched alkyl group having 1 to 10 carbon atoms; and r represents an integer of 0 or 1 to 3.

Regarding $R^{29}$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, 1-ethylcyclopentyl, 1-ethylcyclohexyl and the like; examples of the linear, branched or cyclic alkoxyalkyl group having 2 to 10 carbon atoms includes methoxymethyl, 1-ethoxyethyl, 1-tert-butoxyethyl, 1-cyclohexyloxyethyl, 1-ethoxypropyl, 1-ethoxy-1-methylethyl, tet-rahydrofuran-2-yl, tetrahydropyran-2-yl and the like; and examples of the linear, branched or cyclic acyl group having 1 to 10 carbon atoms includes formyl, acetyl, pivaloyl, cyclohexylcarbonyl and the like. Among these groups $R^{29}$, a linear or branched alkyl group having 1 to 6 carbon atoms, a linear, branched or cyclic alkoxyalkyl group having 2 to 7 carbon atoms and a linear or branched acyl group having 2 to 7 carbon atoms are preferable, and particularly, a hydrogen atom, methyl, ethyl, methoxymethyl, 1-ethoxyethyl, tetrahydrofuran-2-yl and acetyl are preferable.

Regarding $R^{30}$, examples of the linear or branched alkyl group having 1 to 10 carbon atoms includes methyl, ethyl, propyl, isopropyl, n-butyl, isobutyl, tert-butyl and the like; examples of the linear, branched or cyclic alkoxyalkyl group having 2 to 10 carbon atoms includes methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like; and examples of the linear, branched or cyclic halogenated alkyl group having 1 to 20 carbon atoms includes fluoromethyl, chloromethyl, bromomethyl, difluoromethyl, dichloromethyl, dibromomethyl, trifluoromethyl, trichloromethyl, tribromomethyl and the like. Among these groups $R^{30}$, a linear or branched alkyl group having 1 to 10 carbon atoms, and particularly, methyl, ethyl, propyl, isopropyl, n-butyl, isobutyl and tert-butyl are preferable.

Regarding $W^3$, the (s+2)-valent hydrocarbon group having 1 to 10 carbon atoms is a linear, branched or cyclic divalent hydrocarbon group having 1 to 10 carbon atoms when is 0. Examples thereof include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, 1,4-cyclohexylene and the like. Among them, methylene, ethylidene, ethylene, 1-methylethylene, 2-methylethylene, trimethylene and 2-methyltrimethylene are preferable. When s is 1, for example, those having a coupling hand formed by removing one hydrogen atom at any position on the hydrocarbon group as described above when s is 0, are listed. Most preferably, $W^3$ represents a single bond.

Regarding the other groups of $R^{25}$ to $R^{28}$, a hydrogen atom; a linear, branched or cyclic alkyl group having 1 to 20 carbon atoms such as methyl, ethyl, propyl, isopropyl, n-butyl, tert-butyl, cyclohexyl, menthyl and the like; halogens such as a chlorine atom, a bromine atom, an iodine atom, a fluorine atom and the like; a linear, branched or cyclic halogenated alkyl group having 1 to 20 carbon atoms such as fluoromethyl, chloromethyl, bromomethyl, difluoromethyl, dichloromethyl, dibromomethyl, trifluoromethyl, trichloromethyl, tribromomethyl and the like; a linear, branched or cyclic alkoxy group having 1 to 20 carbon atoms such as methoxy, ethoxy, isopropoxy, n-butoxy, tert-butoxy, menthoxy and the like; a linear, branched or cyclic alkoxyalkyl group having 2 to 20 carbon atoms such as methoxymethyl, methoxyethyl, tert-butoxymethyl, tert-butoxyethyl, methoxymenthol and the like, or groups containing alkoxy saccharides such as methylglucose and the like; a linear, branched or cyclic alkylcarbonyloxy group having 2 to 20 carbon atoms such as acetoxy and the like; an arylcarbonyloxy group having 6 to 20 carbon atoms such as naphthoyloxy; a linear, branched or cyclic alkylsulfonyloxy group having 1 to 20 carbon atoms such as mesyloxy and the like; an arylsulfonyloxy group having 6 to 20 carbon atoms such as tosyloxy and the like; a linear, branched or cyclic alkoxycarbonyl group having 2 to 20 carbon atoms such as methoxycarbonyl, ethoxycarbonyl, n-propoxycarbonyl, isopropoxycarbonyl, n-butoxycarbonyl, tert-butoxycarbonyl, cyclohexyloxycarbonyl and the like; and a linear, branched or cyclic alkoxycarbonylalkyl group having 3 to 20 carbon atoms such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl, are each independently listed as specific examples thereof. Among these, a hydrogen atom, a linear, branched or cyclic alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkoxycarbonyl group having 2 to 20 carbon atoms and a linear, branched or cyclic alkoxycarbonylalkyl group having 3 to 20 carbon atoms are preferable, and a hydrogen atom, a linear or branched alkyl group having 1 to 10 carbon atoms, a linear or branched alkoxycarbonyl group having 2 to 10 carbon atoms and a linear or branched alkoxycarbonylalkyl group having 3 to 10 carbon atoms are more preferable.

$X^5$ represents —O— or —CR$^{31}_2$— (wherein, $R^{31}$ represents a hydrogen atom or a linear or branched alkyl group having 1 to 10 carbon atoms), and when r is 1 to 3, $X^5$ may be the same or different. Specific examples of $R^{31}$ include a hydrogen atom, or a linear or branched alkyl group having 1 to 10 carbon atoms such as methyl, ethyl, n-propyl, isopropyl, n-butyl, tert-butyl and the like. $X^5$ represents preferably —O— or —CH$_2$—, and more preferably, all of $X^5$s are either —O— or —CH$_2$—. Also, r represents preferably 0 or 1.

Specific examples of the general formula [9] include the structural unit [E] represented by the following chemical formula [28-1-1] to [28-4-16]:

[Chem. 45]

[28-1-1]

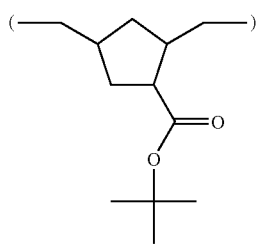

[28-1-2]

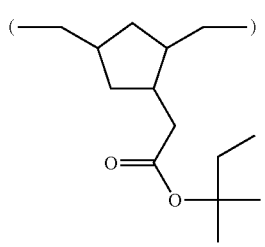

-continued

[28-1-3]

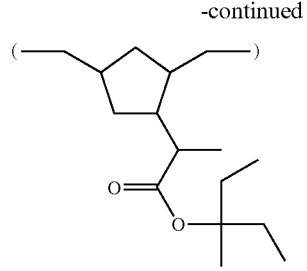

[28-1-4]

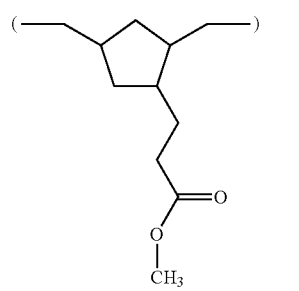

[28-1-5]

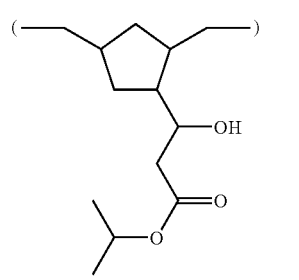

[28-1-6]

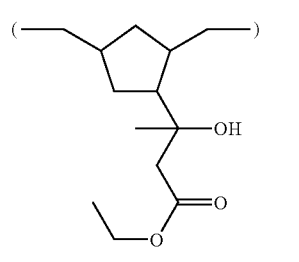

[28-1-7]

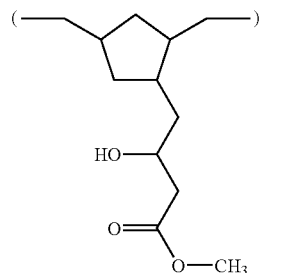

[28-1-8]

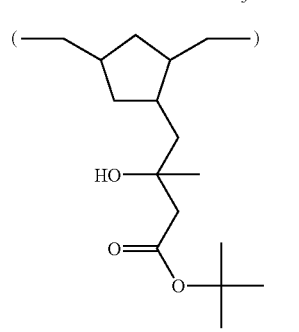

[28-1-9]
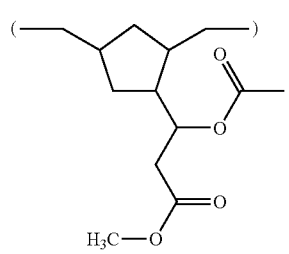
[28-1-10]
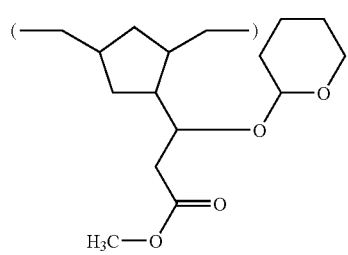
[28-1-11]
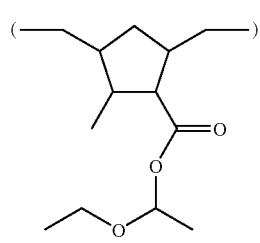
[28-1-12]
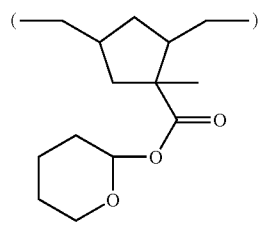
[28-1-13]
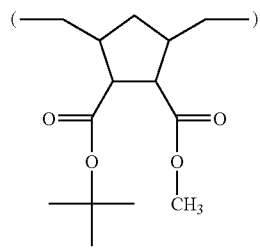
[28-1-14]
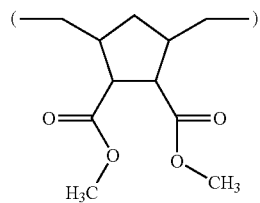
[28-1-15]
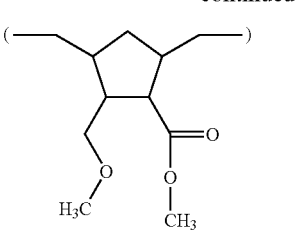
[28-1-16]
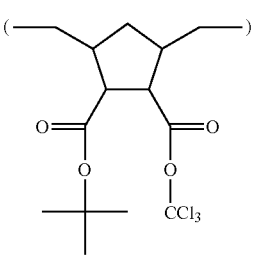
[Chem. 46]
[28-2-1]
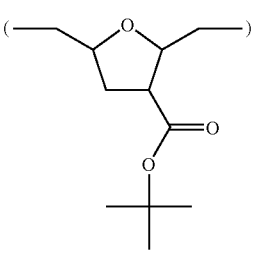
[28-2-2]
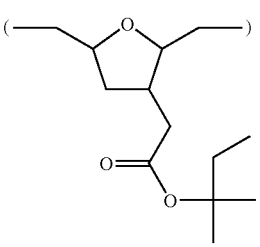
[28-2-3]
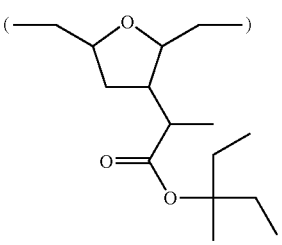
[28-2-4]
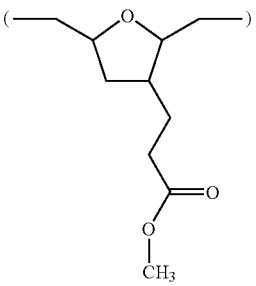

[28-2-5]
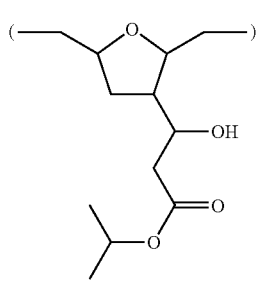
[28-2-6]
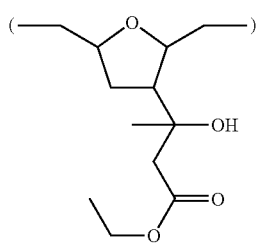
[28-2-7]
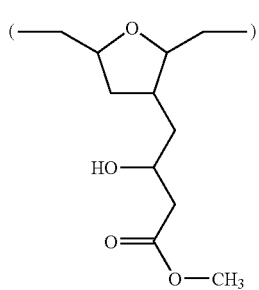
[28-2-8]
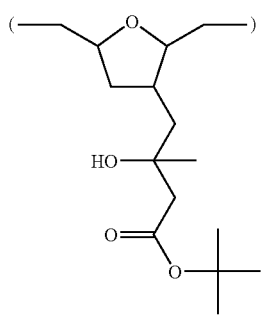
[28-2-9]
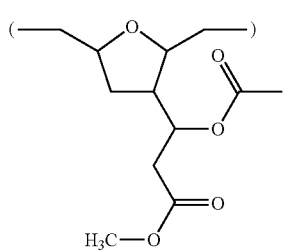
[28-2-10]
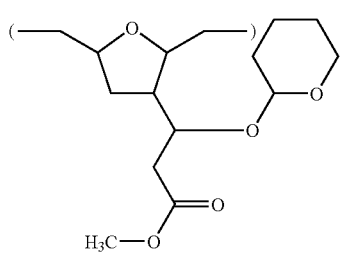
[28-2-11]
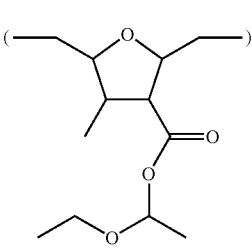
[28-2-12]
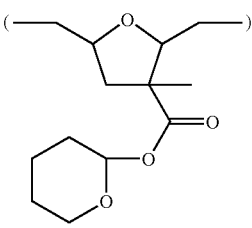
[28-2-13]
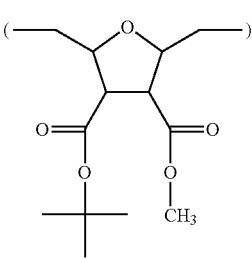
[28-2-14]
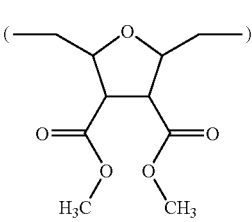
[28-2-15]
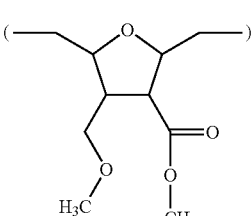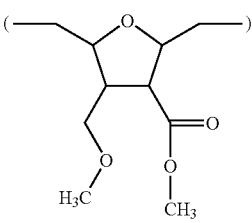
[28-2-16]
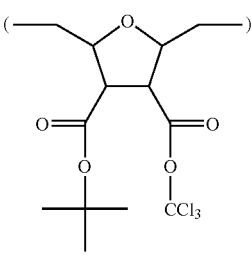

-continued
[28-2-17]
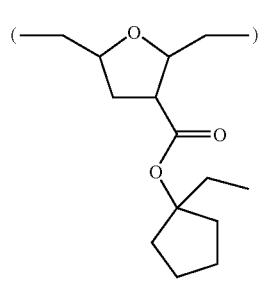
[Chem. 47]
[28-3-1]
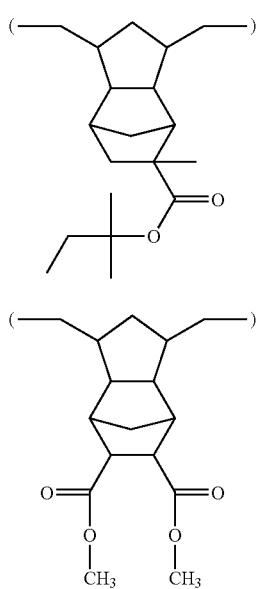
[28-3-2]
[28-3-3]
[28-3-4]
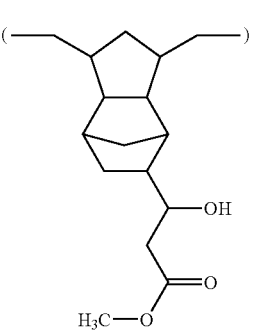
[28-3-5]
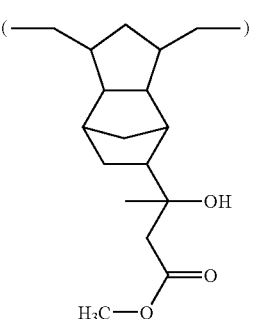
[28-3-6]
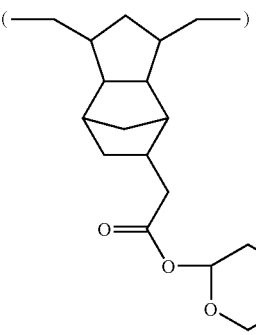
[28-3-7]
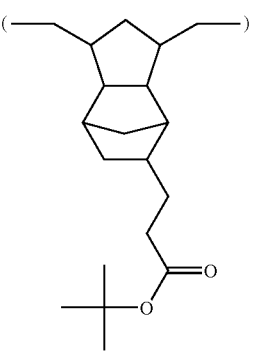
[28-3-8]

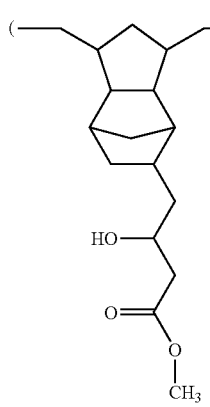
[28-3-9]
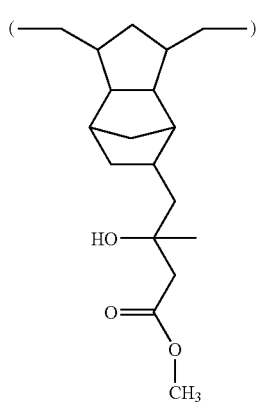
[28-3-10]
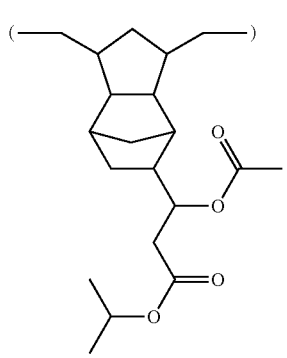
[28-3-11]
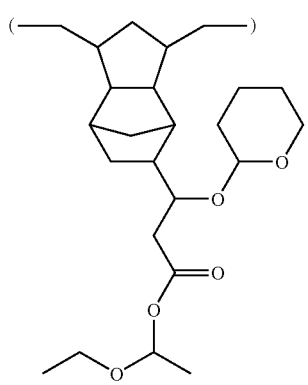
[28-3-12]
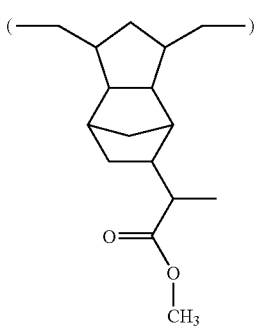
[28-3-13]
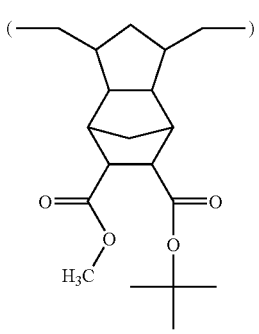
[28-3-14]
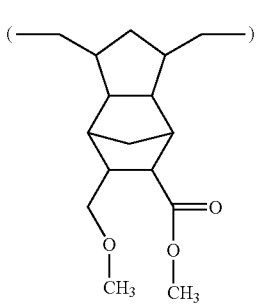
[28-3-15]
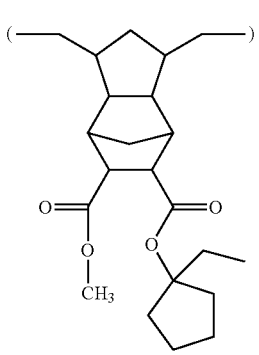
[28-3-16]
[Chem. 48]
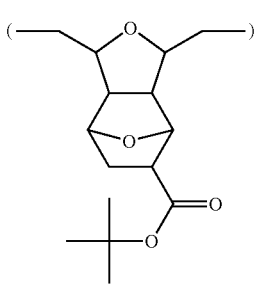
[28-4-1]

-continued
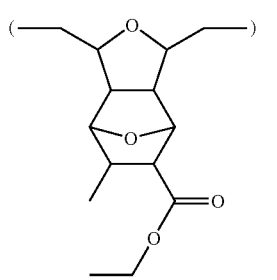
[28-4-2]
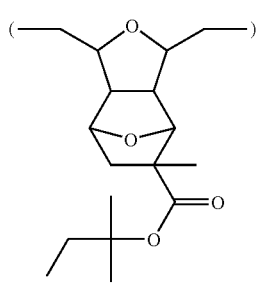
[28-4-3]
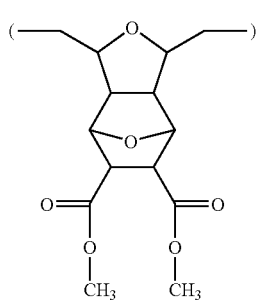
[28-4-4]
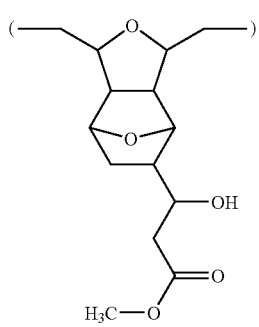
[28-4-5]
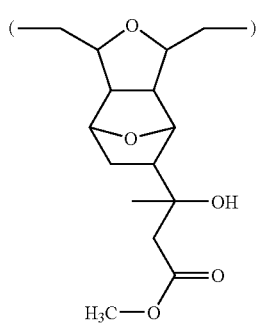
[28-4-6]
-continued
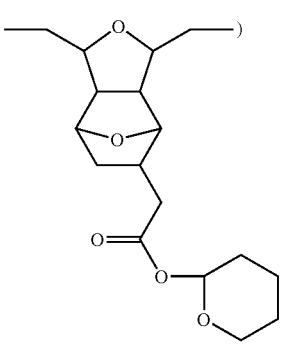
[28-4-7]
[28-4-8]
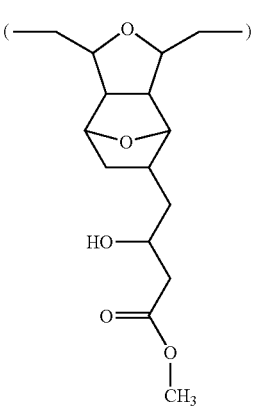
[28-4-9]
[28-4-10]
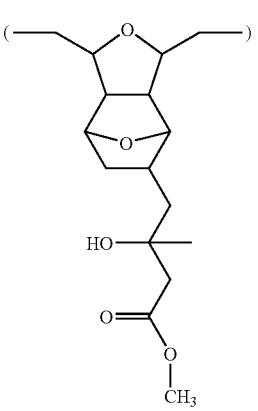

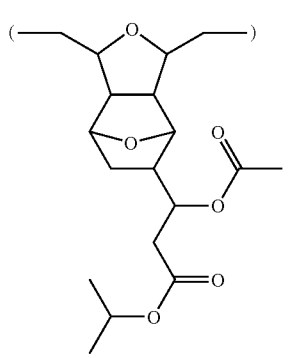
[28-4-11]

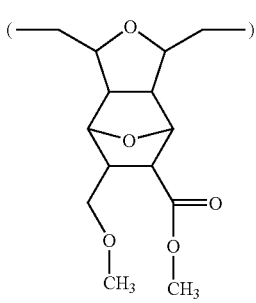
[28-4-15]

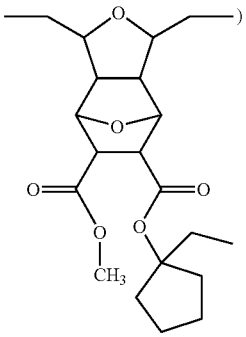
[28-4-16]

[28-4-12]

[28-4-13]

In preferable embodiments of the present invention, the molar ratio of the sum of the structural unit [A] represented by the general formula [1], the structural unit [B] represented by the general formula [3] and/or [4], and the structural unit [C] represented by the general formula [5] and/or [6] to the structural unit [E] represented by the general formula [9], ([A]+[B]+[C])/[E] is from 100/0 to 40/60, and it is preferable that the structural unit [E] is present in a certain amount in addition to the structural units [A], [B], and [C]. Here, the structural unit [E] is useful for increasing the degree of freedom for design such as decomposition performance upon light exposure, control of the development property, control of the heat property or solubility to a solvent and the like. The molar ratio ([A]+[B]+[C])/[E] is preferably from 98/2 to 50/50, further preferably from 97/3 to 60/40, and most preferably from 95/5 to 70/30.

The hydrogenated ring-opening metathesis copolymer of the present invention may further has a structural unit [F] represented by the following general formula [29] as a structural unit in addition to the structural units [A], [B], and [C], and preferably in addition to the structural unit [D], and further in addition to the structural unit [E] in some cases:

[Chem. 49]

[28-4-14]

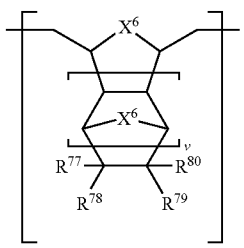
[29]

wherein, $R^{77}$ to $R^{80}$ are selected each independently from a hydrogen atom, a linear, branched or cyclic alkyl group having 1 to 20 carbon atoms, halogens, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a hydroxyl group, a linear, branched or cyclic hydroxyalkyl group having 1 to 20 carbon atoms, a cyano group, a linear, branched or cyclic cyanoalkyl group having 2 to 20 carbon atoms, a linear, branched or cyclic alkylcarbonyloxy group having 2 to 20 carbon atoms, a linear, branched or cyclic alkylcarbonyloxyalkyl group having 3 to 20 carbon atoms, an arylcarbonyloxy group having 6 to 20 carbon atoms, a linear, branched or cyclic alkylsulfonyloxy group having 1 to 20 carbon atoms, a linear, branched or cyclic alkylsulfonyloxyalkyl group having 2 to 20 carbon atoms, or an arylsulfonyloxy group having 6 to 20 carbon atoms, and $X^6$s may be the same or different and represent —O— or —$CR^{81}_2$— (wherein, $R^{81}$ represents a hydrogen atom or a linear or branched alkyl group having 1 to 10 carbon atoms). Also, v represents an integer of 0 or 1 to 3.

In the hydrogenated ring-opening metathesis copolymer of the present invention, it is essential that the molar ratio of the sum of the structural unit [A] represented by the general formula [1], the structural unit [B] represented by the general formulae [3] and/or [4], and the structural unit [C] represented by the general formulae [5] and/or [6] satisfies that [A]/([B]+[C]) is from 20/80 to 98/2, ([A]+[B])/[C] is from 99/1 to 50/50, and ([A]+[C])/[B] is from 99/1 to 21/79, simultaneously and is essential that the structural units [B] and [C] are present in a certain amount in addition to the structural unit [A]. Here, the structural unit [A] contains a tertiary ester group represented by the general formula [2], namely a group which is decomposed by an acid generated from a photo-sensitizer in exposure, to produce a carboxylic acid. The structural unit [A] is necessary for making a resist pattern by developing with an alkali aqueous solution after exposure. Further, the structural unit [B] is necessary for bringing on adhesion with a substrate to be treated such as a silicon substrate. The structural unit [C] is necessary for controlling dissolution contrast by imparting a solubility-inhibition property in an alkali developer. When the molar ratio [A]/([B]+[C]) is less than 20/80, a dissolving rate after light exposure is inadequate, and thereby development becomes insufficient, and when more than 98/2, adhesion with a substrate to be treated may be insufficient or there might be the problem of insufficient resolution. Also, it is essential that the molar ratio ([A]+[B])/[C] is equal to or more than 99/1 for bringing on the effect of improving the developing property by the structural unit [C]. However, when the molar ratio is more than 50/50, affinity to water is too low and thus developing property becomes deteriorated. Further, when the molar ratio of ([A]+[C])/[B] is less than 99/1, adhesion with a substrate to be treated may not be brought on, and when more than 21/79, development becomes deteriorated. Further, the structural unit [D] represented by the general formula [7] contains a carboxyl group. Thus, adhesion to substrates to be treated such as a silicon substrate and solubility to solvents are improved. Further, when the molar ratio of the structural units [A], [B], and [C] to the structural unit [D], ([A]+[B]+[C])/[D] is from 100/0 to 20/80, wet tension in development with an alkali aqueous solution after light exposure is improved and thus preferable to solve uneven development. The molar ratio of these units being in such ranges is preferable for preparing a resist composition, and important for a resist composition to be applied on a substrate such as a silicon substrate by dissolving it in a polar solvent such as 2-heptanone and the like with a highly polar photo-sensitizer. That is, the hydrogenated ring-opening metathesis polymer enhances solubility or dissolving rate in the polar solvent at the time of preparing a resist composition, and thereby a homogeneous flat and smooth coating film can be formed. Further, when the structural unit [E] is present in addition to the structural unit [A], [B], and [C], an ester group which has a different activity from that of an ester group contained in the structural unit [A] or an ester group which is not decomposed easily by a generated acid, is contained. Thus, it is useful because the degree of freedom for design, in view of decomposition property upon light exposure, controlling a development property, and controlling a heat property or solubility to a solvent, is increased. In this case, the molar ratio of the structural units ([A]+[B]+[C])/[E] is preferably from 100/0 to 40/60.

Also, particularly, the hydrogenated ring-opening metathesis polymer in which at least one of $X^1$ of the general formula [1] in the structural unit [A], $X^2$ of the general formula [3] and $X^3$ of the general formula [4] in the structural unit [B] represents —O— and the others represent —$CH_2$—, has the effects that improve adhesion to a substrate to be treated such as a silicon substrate, and wet tension in development with an alkali aqueous solution, and further enhance solubility in polar organic solvents such as ketones, alcohols and the like used in a process of applying a resist composition onto a silicon wafer. Further, affinity to water is also improved and thus developing property with a photoresist remover (or a developer) such as an alkali aqueous solution and the like after exposure is improved.

The hydrogenated ring-opening metathesis copolymer of the present invention can be obtained by polymerizing cyclic olefin monomers corresponding respectively to the structural unit [A] represented by the general formula [1], a structural unit [B] represented by the general formulae [3] and/or [4], and a structural unit [C] represented by the general formulae [5] and/or [6], and if necessary the structural unit [E] represented by the general formula [9], and further if necessary the structural unit [F] represented by the general formula [29] by using a ring-opening metathesis catalyst, and hydrogenating the resulted polymer in the presence of a hydrogenation catalyst.

The cyclic olefin monomers corresponding to the general formula [1] of the structural unit [A] are cyclic olefin monomers having a structure of the general formula [30]. The cyclic olefin monomers corresponding to the general formulae [3] and [4] of the structural unit [B] are cyclic olefin monomers having a structure of the following general formulae [31] and [32], respectively. The cyclic olefin monomers corresponding to the general formulae [5] and [6] of the structural unit [C] are cyclic olefin monomers having a structure of the following general formulae [33] and [34], respectively. The cyclic olefin monomers corresponding to the general formula [9] of the structural unit [E] are cyclic olefin monomers having a structure of the following general formula [35]. The cyclic olefin monomers corresponding to the structural unit [F] of the general formula [29] are cyclic olefin monomer having a structure of the following general formula [36].

[Chem. 50]

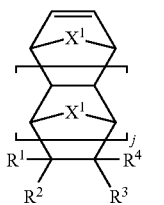

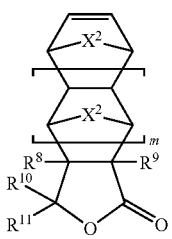

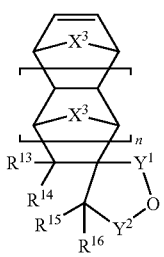

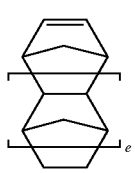

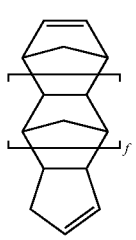

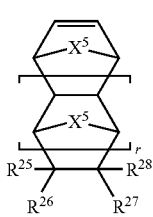

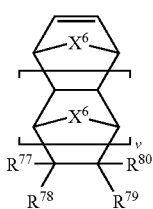

wherein $R^1$ to $R^{80}$, $X^1$ to $X^6$, $Y^1$, $Y^2$, j, m, n, e, f, r and v are as defined in the above.

A method for preparing the hydrogenated ring-opening metathesis copolymer of the present invention is not particularly limited. However, the hydrogenated ring-opening metathesis copolymer of the present invention can be obtained by polymerizing the above-mentioned olefin monomers by using a living ring-opening metathesis catalyst, preferably in the presence of a chain transfer agent such as an olefin, diene and the like, in a solvent or without using a solvent, then hydrogenating the resulted polymer using a hydrogenation catalyst in a solvent under pressure of hydrogen. For example, the polymerization and the hydrogenation can be carried out using a method disclosed in JP-A-2001-354756 and the like.

The ring-opening metathesis polymerization catalyst used for preparing the ring-opening metathesis polymer in the present invention may be any catalyst as long as it causes ring-opening metathesis polymerization. Specific examples of the ring-opening metathesis polymerization catalyst include tungsten-based alkylidene catalysts, molybdenum-based alkylidene catalysts, rhenium-based alkylidene catalysts, tantalum-based alkylidene catalysts, ruthenium-based alkylidene catalysts, and titanacyclobutane catalysts and the like.

The ring-opening metathesis polymer of the present invention has the ratio of the weight-average molecular weight Mw to the number average molecular weight Mn (Mw/Mn) of 1.0 to 3.0. Generally, the number average molecular weight Mn of the ring-opening metathesis polymer of the present invention is from 2,000 to 200,000, preferably, from 3,000 to 100,000, and more preferably, from 5,000 to 50,000. In addition, the number average molecular weight and the weight-average molecular weight described in the present specification can be measured by gel permeation chromatography (GPC) in terms of polystyrene standard.

In the hydrogenation for adding hydrogen to double bonds in the main chain of the ring-opening metathesis polymer of the present invention, known hydrogenation catalysts can be used. The known heterogeneous catalysts include supported metal catalysts prepared by supporting a metal such as palladium, platinum, nickel, rhodium, ruthenium and the like on a carrier such as carbon, silica, alumina, titania, magnesia, diatomaceous earth, synthetic zeolite and the like. The homogeneous catalysts include nickel naphthenate/triethylaluminum, nickel acetylacetonate/triisobutylaluminum, cobalt octenoate/n-butyllithium, titanocene dichloride/diethylaluminum chloride, rhodium acetate, dichlorobis(triphenylphosphine)palladium, chlorotris(triphenylphosphine) rhodium, dihydride tetrakis(triphenylphosphine)ruthenium and the like.

The hydrogenated ring-opening metathesis polymer of the present invention can be obtained by adding hydrogen in a proportion of preferably 80 to 100% and more preferably 90 to 100% in the presence of a catalyst being capable of adding hydrogen to the double bonds in the main chain of the ring-opening metathesis polymer.

The hydrogenated ring-opening metathesis polymer of the present invention has the ratio of the weight-average molecular weight Mw to the number average molecular weight Mn (Mw/Mn) of 1.0 to 3.0. Generally, the number average molecular weight Mn of the hydrogenated ring-opening metathesis polymer of the present invention is from 2,000 to 200,000, preferably, from 3,000 to 100,000, and more preferably, from 5,000 to 50,000. In addition, the number average molecular weight and the weight-average molecular weight described in the present specification can be measured by gel permeation chromatography (GPC) in terms of polystyrene standard.

Further, at least part of a tertiary ester group in the general formula [2] and/or an ester group in the general formula [10] in a hydrogenated ring-opening metathesis polymer may be decomposed and converted to a carboxylic acid, in order to produce a hydrogenated ring-opening metathesis polymer which contains the structural unit [A] of the general formula [1], the structural unit [B] of the general formula [3] and/or [4] and the structural unit [C] of the general formula [5] and/or [6], a structural unit [D] of the general formula [7] and if necessary a structural unit [E] of the general formula [9], and further if necessary a structural unit [F] of the general formula [29] and in which at least one of $X^1$ of the general formula [1] of the structural unit [A], $X^2$ of the general formula [3] and $X^3$ of the general formula [4] of the structural unit [B] is —O— and the molar ratio of the structural units [A], [B] and [C] satisfies the conditions that [A]/([B]+[C]) is from 20/80 to 98/2, ([A]+[B])/[C] is from 99/1 to 50/50, and ([A]+[C])/[B] is from 99/1 to 21/79, simultaneously.

As the method of decomposing at least part of a tertiary ester group of in the general formula [2] and/or an ester group in the general formula [10] to convert it into a carboxylic acid, conventional methods can be used. Specific examples of the methods include hydrolysis under basic condition, hydrolysis under acidic condition, hydrolysis under neutral condition, acidolysis and the like, but not limited thereto.

Further, in the present invention, a carboxylic acid as functional group in a hydrogenated ring-opening metathesis polymer having a functional group of carboxylic acid obtained by the above described method, is converted into an ester, in order to produce a hydrogenated ring-opening metathesis polymer which contains the structural unit [A] of the general formula [1], the structural unit [B] of the general formula [3] and/or [4] and the structural unit [C] of the general formula [5] and/or [6], a structural unit [D] of the general formula [7] and if necessary a structural unit [E] of the general formula [9], and further if necessary a structural unit [F] of the general formula [29] and in which at least one of $X^1$ of the general formula [1] of the structural unit [A], $X^2$ of the general formula [3] and $X^3$ of the general formula [4] of the structural unit [B] is —O— and the molar ratio of the structural units [A], [B] and [C] satisfies the conditions that [A]/([B]+[C]) is from 20/80 to 98/2, ([A]+[B])/[C] is from 99/1 to 50/50, and ([A]+[C])/[B] is from 99/1 to 21/79, simultaneously.

As the method of converting a carboxylic acid as functional group into an ester, conventional methods can be applied. For example, esterification by a dehydrocondensation reaction with alcohols, esterification by using an ortho-alkylating agent, esterification by addition of olefins in the presence of an acid, esterification by a condensation reaction with a halide using an organic basic compound, alkoxyalkyl esterification by addition of alkyl vinyl ethers and the like are listed. The method further includes, but not limited to, a method of converting a carboxylic acid into an acid halide by using thionyl chloride and the like and then esterifying the acid halide by contacting it with alcohols, a method of contacting a metal salt of the carboxylic acid with a halide and esterifying, and the like.

A resist composition comprising, as a base polymer, the hydrogenated ring-opening metathesis polymer of the present invention which has a specific structure is useful for a positive resist composition, particularly, a chemically amplified positive resist composition. The resist composition further comprises a photoacid generator which is a compound to generate an acid by exposure of a high energy radiation or electron beam, and comprises an organic solvent.

Examples of the photoacid generator used in the present invention include:

i. onium salts of the following general formula (P1a-1), (P1a-2) or (P1b), ii. diazomethane derivatives of the following general formula (P2), iii. glyoxime derivatives of the following general formula (P3), iv. bissulfone derivatives of the following general formula (P4), v. sulfonic acid ester of N-hydroxyimide compound of the following general formula (P5), vi. β-keto sulfonic acid derivatives, vii. disulfone derivatives, viii. nitrobenzyl sulfonate derivatives, ix. sulfonic acid ester derivatives, and the like.

[Chem. 51]

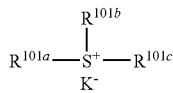

P1a-1

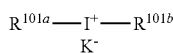

P1a-2 wherein each of $R^{101a}$, $R^{101b}$, and $R^{101c}$ represents a linear, branched or cyclic alkyl group, alkenyl group, oxoalkyl group or oxoalkenyl group, having 1 to 12 carbon atoms, aryl group having 6 to 20 carbon atoms, or aralkyl group or aryl oxoalkyl group having 7 to 12 carbon atoms, and some or all of hydrogen atoms of these group may be substituted by an alkoxy group and the like. Further, $R^{101b}$ and $R^{101c}$ may form a ring and when forming a ring, each of $R^{101b}$ and $R^{101c}$ represents an alkylene group having 1 to 6 carbon atoms. K⁻ represents a non-nucleophilic counter ion.

Regarding the above $R^{101a}$, $R^{101b}$, and $R^{101c}$, they are the same or different, and specific examples thereof as an alkyl group include methyl group, ethyl group, propyl group, isopropyl group, n-butyl group, sec-butyl group, tert-butyl group, pentyl group, hexyl group, heptyl group, octyl group, cyclopentyl group, cyclohexyl group, cycloheptyl group, cyclopropylmethyl group, 4-methylcyclohexyl group, cyclohexylmethyl group, norbornyl group, adamantyl group, and the like. Examples thereof as an alkenyl group include vinyl group, allyl group, propenyl group, butenyl group, hexenyl group, cyclohexenyl group and the like. Examples thereof as an oxoalkyl group include 2-oxocyclopentyl group, 2-oxocyclohexyl group and the like, 2-oxopropyl group, 2-cyclopentyl-2-oxoethyl group, 2-cyclohexyl-2-oxoethyl group, 2-(4-methylcyclohexyl)-2-oxoethyl group and the like. Examples thereof as an aryl group include phenyl group, naphthyl group and the like, or an alkoxyphenyl group such as p-methoxyphenyl group, m-methoxyphenyl group, o-methoxyphenyl group, ethoxyphenyl group, p-tert-butoxyphenyl group, m-tert-butoxyphenyl group, and the like, an alkylphenyl group such as 2-methylphenyl group, 3-methylphenyl group, 4-methylphenyl group, ethylphenyl group, 4-tert-butylphenyl group, 4-butylphenyl group, dimethylphenyl group, and the like, an alkylnaphtyl group such as methylnaphtyl group, ethylnaphtyl group and the like, an alkoxynaphtyl group such as methoxynaphtyl group, ethoxynaphtyl group and the like, a dialkylnaphtyl group such as dimethylnaphtyl group, diethylnaphtyl group and the like, a dialkoxynaphtyl group such as dimethoxynaphtyl group, diethoxynaphtyl group, and the like. Examples thereof as an aralkyl group include benzyl group, phenylethyl group, phenethyl group and the like.

Examples thereof as an aryl oxoalkyl group include 2-aryl-2-oxoethyl group such as 2-phenyl-2-oxoethyl group, 2-(1-naphtyl)-2-oxoethyl group, 2-(2-naphtyl)-2-oxoethyl group and the like. Examples of K— as a non-nucleophilic counter ion include halide ion such as chloride ion, bromide ion and the like, fluoroalkylsulfonate such as triflate, 1,1,1-trifluoro-ethanesulfonate, nonafluorobutanesulfonate and the like, arylsulfonate such as tosylate, benzenesulfonate, 4-fluo-robenzenesulfonate, 1,2,3,4,5-pentafluorobenzenesulfonate and the like, alkylsulfonate such as mesylate, butanesulfonate and the like.

[Chem. 52]

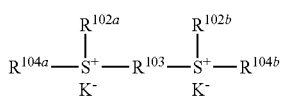

P1b wherein each of $R^{102a}$ and $R^{102b}$ represents a linear, branched or cyclic alkyl group having 1 to 8 carbon atoms. $R^{103}$ represents a linear, branched or cyclic alkylene group having 1 to 10 carbon atoms. Each of $R^{104a}$, $R^{104b}$ represents 2-oxoalkyl group having 3 to 7 carbon atoms. $K^-$ represents a non-nucleophilic counter ion.

Regarding the above $R^{102a}$ and $R^{102b}$, specific examples thereof include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group, a cyclohexylmethyl group and the like. Examples of $R^{103}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, a 1,4-cyclohexanedimethylene group and the like. Examples of $R^{104a}$, $R^{104b}$ include a 2-oxopropyl group, a 2-oxocyclopentyl group, a 2-oxocyclohexyl group, 2-oxocycloheptyl group and the like. $K^-$ is the same as described in the formula (P1a-1) and (P1a-2).

[Chem. 53]

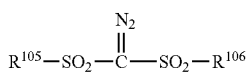

P2 wherein each of $R^{105}$ and $R^{106}$ represents a linear, branched or cyclic alkyl or halogenated alkyl group having 1 to 12 carbon atoms, aryl group or halogenated aryl group having 6 to 20 carbon atoms, or an aralkyl group having 7 to 12 carbon atoms.

Regarding $R^{105}$ and $R^{106}$, examples of the an alkyl group include a methyl group, an ethyl group, a propyl group, an isopropyl group, an n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, an adamantyl group and the like. Examples of the halogenated alkyl group include a trifluoromethyl group, a 1,1,1-trifluoroethyl group, a 1,1,1-trichloroethyl group, a nonafluorobutyl group and the like. Examples of the aryl group include a phenyl group, an alkoxyphenyl group such as a p-methoxyphenyl group, an m-methoxyphenyl group, an o-methoxyphenyl group, an ethoxyphenyl group, a p-tert-butoxyphenyl group, an m-tert-butoxyphenyl group and the like, and an alkylphenyl group such as, a 2-methylphenyl group, a 3-methylphenyl group, a 4-methylphenyl group, an ethylphenyl group, a 4-tert-butylphenyl group, a 4-butylphenyl group, a dimethylphenyl group and the like. Examples of the halogenated aryl group include fluorophenyl group, chlorophenyl group, 1,2,3,4,5-pentafluorophenyl group and the like. Examples of the aralkyl group include benzyl group, phenethyl group and the like.

[Chem. 54]

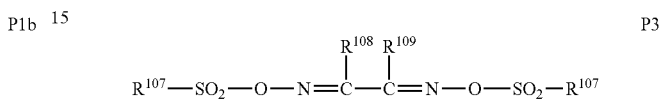

P3 wherein each of $R^{107}$, $R^{108}$, and $R^{109}$ represents a linear, branched or cyclic alkyl group or halogenated alkyl group having 1 to 12 carbon atoms, aryl group or halogenated aryl group having 6 to 20 carbon atoms, or an aralkyl group having 7 to 12 carbon atoms. $R^{108}$ and $R^{109}$ may bind together to form a cyclic structure, and when forming a cyclic structure, each of $R^{108}$ and $R^{109}$ represents a linear or branched alkylene group having 1 to 6 carbon atoms.

Regarding $R^{107}$, $R^{108}$ and $R^{109}$, examples of the alkyl group, halogenated alkyl group, aryl group, halogenated aryl group and an aralkyl group include the same as described for $R^{105}$ and $R^{106}$. In addition, examples of the alkylene group regarding $R^{108}$ and $R^{109}$ include a methylene group, an ethylene group, a propylene group, a butylene group, a hexylene group and the like.

[Chem. 55]

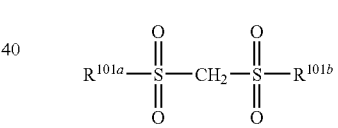

P4 wherein $R^{101a}$ and $R^{101b}$ are the same as the above-described.

[Chem. 56]

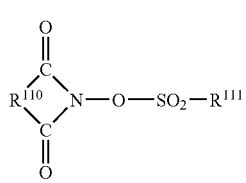

P5 wherein $R^{110}$ represents an allylene group having 6 to 10 carbon atoms, an alkylene group having 1 to 6 carbon atoms or an alkenylene group having 2 to 6 carbon atoms, and some or all of hydrogen atoms of these groups may be further substituted by a linear or branched alkyl group or an alkoxy group having 1 to 4 carbon atoms, nitro group, acetyl group, or phenyl group. $R^{111}$ represents a linear, branched or substituted alkyl group, an alkenyl group or an alkoxyalkyl group, phenyl group, or a naphtyl group, and some or all of hydrogen atoms of these groups may be further substituted by alkyl group or an alkoxy group having 1 to 4 carbon atoms; phenyl group which may be substituted by alkyl group or an alkoxy group having 1 to 4 carbon atoms, nitro group or acetyl group; hetero aromatic group having 3 to 5 carbon atoms; or a chlorine atom, a fluorine atom.

In which, regarding $R^{110}$, examples of an arylene group include a 1,2-phenylene group, a 1,8-naphtylene group and the like, examples of an alkylene group include a methylene group, an ethylene group, a trimethylene group, a tetramethylene group, a phenylethylene group, a norbornane-2,3-diyl group and the like, examples of an alkenylene group include 1,2-vinylene group, 1-phenyl-1,2-vinylene group, 5-norbornene-2,3-diyl group and the like. Regarding $R^{111}$, examples of alkyl group include the same as defined for $R^{101a}$ to $R^{101c}$, and examples of an alkenyl group include vinyl group, a 1-propenyl group, a allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, a 7-octenyl group and the like, examples of an alkoxyalkyl group include a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group, a methoxyheptyl group and the like.

Further, examples of the alkyl group having 1 to 4 carbon atoms which may be further substituted include a methyl group, an ethyl group, a propyl group, an isopropyl group, an n-butyl group, an isobutyl group, a tert-butyl group and the like, examples of the alkoxy group having 1 to 4 carbon atoms include a methoxy group, an ethoxy group, a propoxy group, an isopropoxy group, an n-butoxy group, an isobutoxy group, a tert-butoxy group and the like, examples of the phenyl group which may be substituted by an alkyl group or an alkoxy group having 1 to 4 carbon atoms, a nitro group or an acetyl group include a phenyl group, a tolyl group, a p-tert-butoxyphenyl group, a p-acetylphenyl group, a p-nitrophenyl group and the like, and examples of a hetero aromatic group having 3 to 5 carbon atoms include a pyridyl group, a furyl group and the like.

Specifically, preferable examples include onium salts such as trifluoromethane diphenyliodonium sulfonate, trifluoromethane (p-tert-butoxyphenyl)phenyliodonium sulfonate, p-toluenediphenyliodonium sulfonate, p-toluene (p-tert-butoxyphenyl)phenyliodinoum sulfonate, trifluoromethanetriphenylsulfonium sulfonate, trifluoromethane (p-tert-butoxyphenyl)diphenylsulfonium sulfonate, trifluoromethane bis(p-tert-butoxyphenyl)phenylsulfonium sulfonate, trifluoromethane tris(p-tert-butoxyphenyl)sulfonium sulfonate, p-toluene triphenylsulfonium sulfonate, p-toluene (p-tert-butoxyphenyl)diphenylsulfonium sulfonate, p-toluene bis(p-tert-butoxyphenyl)phenylsulfonium sulfonate, p-toluene tris(p-tert-butoxyphenyl)sulfonium sulfonate, nonafluorobutane triphenylsulfonium sulfonate, butane triphenylsulfonium sulfonate, trifluoromethane trimethylsulfonium sulfonate, p-toluene trimethylsulfonium sulfonate, trifluoromethane cyclohexylmethyl(2-oxocyclohexyl)sulfonium sulfonate, p-toluene cyclohexylmethyl(2-oxo cyclohexyl)sulfonium sulfonate, trifluoromethane dimethylphenylsulfonium sulfonate, p-toluene dimethylphenylsulfonium sulfonate, trifluoromethane dicyclohexylphenylsulfonium sulfonate, p-toluene dicyclohexylphenylsulfonium sulfonate, trifluoromethane trinaphtylsulfonium sulfonate, trifluoromethane cyclohexylmethyl(2-oxocyclohexyl)sulfonium sulfonate, trifluoromethane (2-norbornyl)methyl(2-oxo cyclohexyl)sulfonium sulfonate, ethylenebis[methyl(2-oxocyclopentyl)sulfonium trifluoromethanesulfonate], 1,2'-naphtylcarbonylmethyltetrahydrothiopheniumtriflate and the like, diazomethane derivatives such as bis(benzenesulfonyl) diazomethane, bis(p-toluenesulfonyl) diazomethane, bis(xylenesulfonyl) diazomethane, bis(cyclohexylsulfonyl) diazomethane, bis(cyclopentylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, bis(tert-butylsulfonyl) diazomethane, bis(n-amylsulfonyl) diazomethane, bis(iso amylsulfonyl) diazomethane, bis(sec-amylsulfonyl) diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, 1-tert-amylsulfonyl-1-(tert-butylsulfonyl) diazomethane and the like, glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, bis-O-(camphorsulfonyl)-α-dimethylglyoxime and the like, bissulfone derivatives such as bisnaphtylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, bisbenzenesulfonylmethane and the like, β-ketosulfone derivatives such as 2-cyclohexylcarbonyl-2-(p-toluenesulfonyl) propane, 2-isopropylcarbonyl-2-(p-toluenesulfonyl) propane and the like, disulfone derivatives such as diphenyldisulfone, dicyclohexyldisulfone and the like, nitrobenzylsulfonate derivatives such as p-toluenesulfonic acid 2,6-dinitrobenzyl, p-toluenesulfonic acid 2,4-dinitrobenzyl and the like, sulfonic acid ester derivatives such as 1,2,3-tris(methanesulfonyloxy) benzene, 1,2,3-tris(trifluoromethanesulfonyloxy) benzene, 1,2,3-tris(p-toluenesulfonyloxy) benzene and the like, sulfonic acid ester derivatives of N-hydroxyimide compounds such as N-hydroxysuccinimide methanesulfonic acid ester, N-hydroxysuccinimide trifluoromethanesulfonic acid ester, N-hydroxysuccinimide ethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide 1-octanesulfonic acid ester, N-hydroxysuccinimide p-toluenesulfonic acid ester, N-hydroxysuccinimide p-methoxybenzenesulfonic acid ester, N-hydroxysuccinimide 2-chloroethanesulfonic acid ester, N-hydroxysuccinimide benzenesulfonic acid ester, N-hydroxysuccinimide-2,4,6-trimethylbenzenesulfonic acid ester, N-hydroxysuccinimide 1-naphthalenesulfonic acid ester, N-hydroxysuccinimide 2-naphthalenesulfonic acid ester, N-hydroxy-2-phenylsuccinimide methanesulfonic acid ester, N-hydroxymaleimidemethanesulfonic acid ester, N-hydroxymaleimide ethanesulfonic acid ester, N-hydroxy-2-phenylmaleimide methanesulfonic acid ester, N-hydroxyglutarimide methanesulfonic acid ester, N-hydroxyglutarimide benzenesulfonic acid ester, N-hydroxyphthalimide methanesulfonic acid ester, N-hydroxyphthalimide benzenesulfonic acid ester, N-hydroxyphthalimide trifluoromethanesulfonic acid ester, N-hydroxyphthalimide p-toluenesulfonic acid ester, N-hydroxynaphthalimide methanesulfonic acid ester, N-hydroxynaphthalimide benzenesulfonic acid ester, N-hydroxy-5-norbornene-2,3-dicarboxylmide methanesulfonic acid ester, N-hydroxy-5-norbornene-2,3-dicarboxylmide trifluoromethanesulfonic acid ester, N-hydroxy-5-norbornene-2,3-dicarboxylmide p-toluene sulfonic acid ester and the like; onium salts such as trifluoromethane triphenylsulfonium sulfonate, trifluoromethane (p-tert-butoxyphenyl)diphenylsulfonium sulfonate, trifluoromethane tris(p-tert-butoxyphenyl)sulfonium sulfonate, p-toluene triphenylsulfonium sulfonate, p-toluene (p-tert-butoxyphenyl)diphenylsulfonium sulfonate, p-toluene tris(p-tert-butoxyphenyl)sulfonium sulfonate, trifluoromethane trinaphtylsulfonium sulfonate, trifluoromethane cyclohexylmethyl(2-oxycyclohexyl)sulfonium sulfonate, trifluoromethane (2-norbornyl)methyl(2-oxocyclohexyl)sulfonium sulfonate, 1,2'-naphtylcarbonylmethyltetrahydrothiopheniumtriflate and the like; diazomethane derivatives such as bis(benzenesulfonyl) diazomethane, bis(p-toluenesulfonyl) diazomethane, bis(cyclohexylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, bis(tert-butylsulfonyl) diazomethane and the like; glyoxime derivatives such as bis-O-(p-toluenesulfonyl)-α-dimethylglyoxime, bis-O-(n-butanesulfonyl)-α-dimethylglyoxime and the like; bissulfone derivatives such as bisnaphtylsulfonylmethane and the like; sulfonic acid derivatives of N-hydroxyimide compounds such as N-hydroxysuccinimide methanesulfonic acid ester, N-hydroxysuccinimide trifluoromethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide p-toluenesulfonic acid ester, N-hydroxynaphthalimide methanesulfonic acid ester, N-hydroxynaphthalimide benzenesulfonic acid ester and the like. In addition, the above-described photoacid generator can be used alone or as a combination of two or more. Since the onium salts have excellent effect on improving the formation of rectangle shape and the diazomethane derivatives and glyoxime derivatives have excellent effect on a decrease of standing wave, fine-tuning of profile can be achieved by a combination of both.

An added amount of the photoacid generator is preferably 0.1 to 15 parts (meaning parts by weight, the same hereafter), more preferably 0.5 to 8 parts based on 100 parts of a base resin. When it is lower than 0.1 parts, there is a case that sensitivity becomes worse, and when it is more than 15 parts, there is a case that transparency becomes low and thus resolution is decreased.

An organic solvent used in the present invention can be any organic solvent in which a base resin, a photoacid generator and other additives can be easily dissolved. Examples of such organic solvent include ketones such as cyclohexanone, methyl-2-n-amyl ketone and the like, alcohols such as 3-methoxybutanol, 3-methyl-3-methoxybutanol, 1-methoxy-2-propanol, 1-ethoxy-2-propanol and the like, ethers such as propylene glycol mono-methyl ether, ethyleneglycol mono-methyl ether, propylene glycol mono-ethyl ether, ethyleneglycol mono-ethyl ether, propylene glycol dimethyl ether, diethyleneglycol dimethyl ether and the like, esters such as propylene glycol mono-methyl ether acetate, propylene glycol mono-ethyl ether acetate, ethyl lactate, ethylpyruvate, butyl acetate, methyl 3-methoxy propionate, ethyl 3-ethoxy propionate, tert-butyl acetate, tert-butyl propionate, propylene glycol mono-tert-butyl ether acetate and the like, and they can be used alone or as a mixture of two or more thereof, but not limited thereto. In the present invention, among such organic solvents, diethyleneglycol dimethyl ether or 1-ethoxy-2-propanol which are most excellent in solubility of a photoacid generator among the components of a resist, and a safe solvent such as propylene glycol monomethyl ether acetate and a mixture solvent thereof are used preferably.

An amount of use of an organic solvent is preferably 200 to 1,000 parts, more preferably 400 to 800 parts based on 100 parts of a base resin.

In a resist composition of the present invention, other polymer compound which is different from the hydrogenated ring-opening metathesis polymer having a specific structure as a characteristic of the present invention can be added.

Specific examples of the polymer compound include compounds of the following formulae (R1) and/or (R2) which have weight average molecular weight of 1,000 to 500,000, preferably 5,000 to 100,000, but not limited thereto:

[Chem. 57]

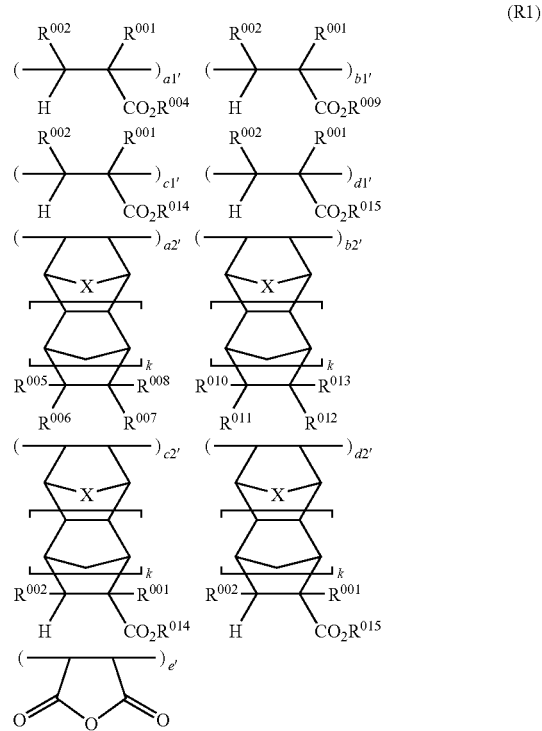

(R1)

-continued

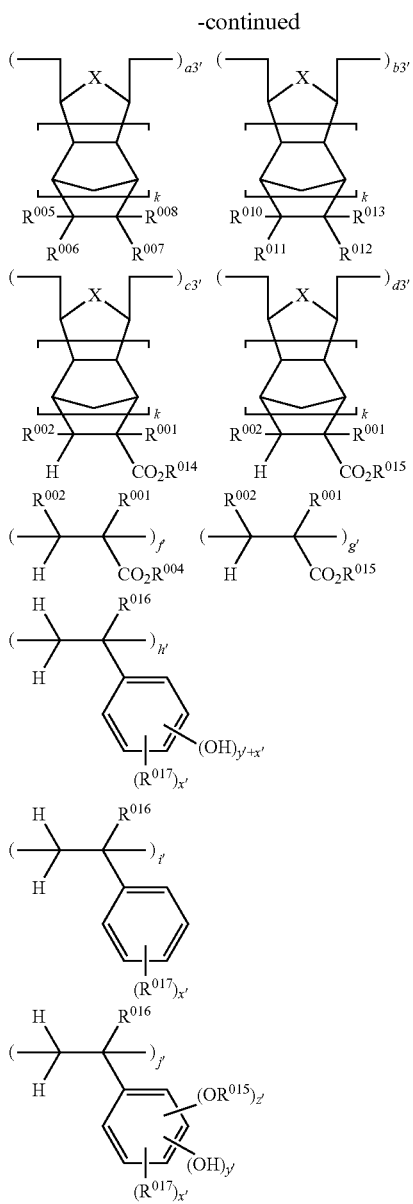

(R2)

wherein $R^{001}$ represents a hydrogen atom, a methyl group or $CH_2CO_2R^{003}$. $R^{002}$ represents a hydrogen atom, a methyl group, or $CO_2R^{003}$ represents a linear, branched or cyclic alkyl group having 1 to 15 carbon atoms. $R^{004}$ represents a hydrogen atom or a mono-valent hydrocarbon group having 1 to 15 carbon atoms, containing a carboxy group or a hydroxy group. At least one of $R^{005}$ to $R^{008}$ represents a mono-valent hydrocarbon group having 1 to 15 carbon atoms containing a carboxy group or a hydroxy group, and the remaining group are independently a hydrogen atom or a linear, branched or cyclic alkyl group having 1 to 15 carbon atoms. $R^{005}$ to $R^{008}$ may form a ring together, and in this case, at least one of $R^{005}$ to $R^{008}$ represents divalent hydrocarbon group having 1 to 15 carbon atoms containing a carboxy group or a hydroxy group, the remaining group represents independently a single bond or a linear, branched or cyclic alkylene group having 1 to 15 carbon atoms. $R^{009}$ represents mono-valent hydrocarbon group having 3 to 15 carbon atoms containing a structure of —$CO_2$— part. At least one of $R^{010}$ to $R^{013}$ represents mono-valent hydrocarbon group having 2 to 15 carbon atoms containing a structure of —$CO_2$— part, and the remaining group represent independently hydrogen atom or a linear, branched or cyclic alkyl group having 1 to 15 carbon atoms. $R^{010}$ to $R^{013}$ may form a ring together, and in this case, at least one of $R^{010}$ to $R^{013}$ represents divalent hydrocarbon group having 1 to 15 carbon atoms containing a structure of —$CO_2$— part, and the remaining group represents independently a single bond or a linear, branched or cyclic alkylene group having 1 to 15 carbon atoms. $R^{014}$ represents alkyl group containing polycyclic hydrocarbon group having 7 to 15 carbon atoms. $R^{015}$ represents acid-unstable group. $R^{016}$ represents hydrogen atom or methyl group. $R^{017}$ represents a linear, branched or cyclic alkyl group having 1 to 8 carbon atoms. X represents $CH_2$ or oxygen atom. Also, k' is 0 or 1. Further, a1', a2', a3', b1', b2', b3', c1', c2', c3', d1', d2', d3', e' is a numeral of equal to or more than 0 and less than 1, satisfying a1'+a2'+a3'+b1'+b2'+b3'+c1'+c2'+c3'+d1'+d2'+d3'+e'=1. Also, f', g', h', i', j' is a numeral of equal to or more than 0 and less than 1, satisfying f'+g'+h'+i'+j'=1.

A combination ratio of the hydrogenated ring-opening metathesis polymer having a specific structure with other polymer compound is preferable in a range of weight ratio of 100:0 to 10:90, particularly 100:0 to 20:80. When this combination ratio is less than such range, it happens that preferable properties as a resist composition cannot be obtained. Properties of the resist composition can be controlled by properly varying the above combination ratio.

Further, the polymer compounds described above are not limited to one kind thereof, and two kinds or more thereof can be added. By using plural kinds of the polymer compound, properties of the resist composition can be controlled.

In the resist composition of the present invention, a solubility-controlling agent can be further added. As the solubility-controlling agent, a compound having an average molecular weight of 100 to 1,000, preferably 150 to 800, which has two or more of phenolic hydroxy group in the molecule wherein a hydrogen atom of the phenolic hydroxy groups is substituted by an acid-unstable group in a ratio of 0 to 100 mol % in average based on the compound, or which has carboxy group in the molecule wherein a hydrogen atom of the carboxy group is substituted by an acid-unstable group in a ratio of 50 to 100 mol % in average based on the compound, is combined.

Further, the ratio of hydrogen atom of the phenolic hydroxy group substituted by an acid-unstable group is in average equal to or more than 0 mol %, preferably equal to or more than 30 mol % based on the total of phenolic hydroxy group, and the upper limit is 100 mol %, preferably 80 mol %. The ratio of hydrogen atom of the carboxy group substituted by an acid-unstable group is in average equal to or more than 50 mol %, preferably equal to or more than 70 mol % based on the total of the carboxy group, and the upper limit is 100 mol %.

In this case, as a compound having two or more phenolic hydroxy groups or carboxy group, compounds of the following formulae (D1) to (D14) are preferable:

[Chem. 58]

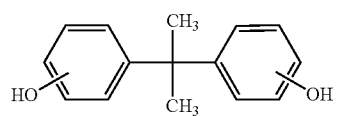

D1

-continued

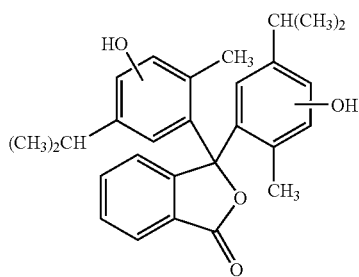

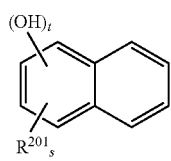

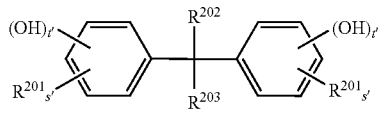

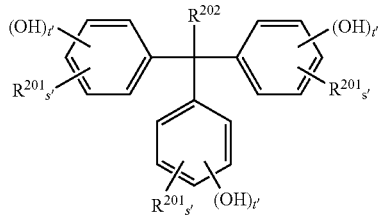

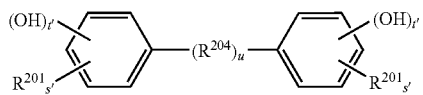

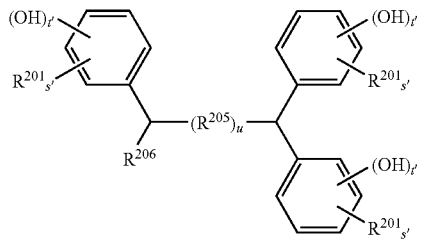

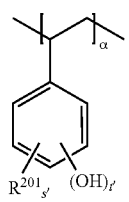

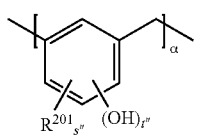

-continued

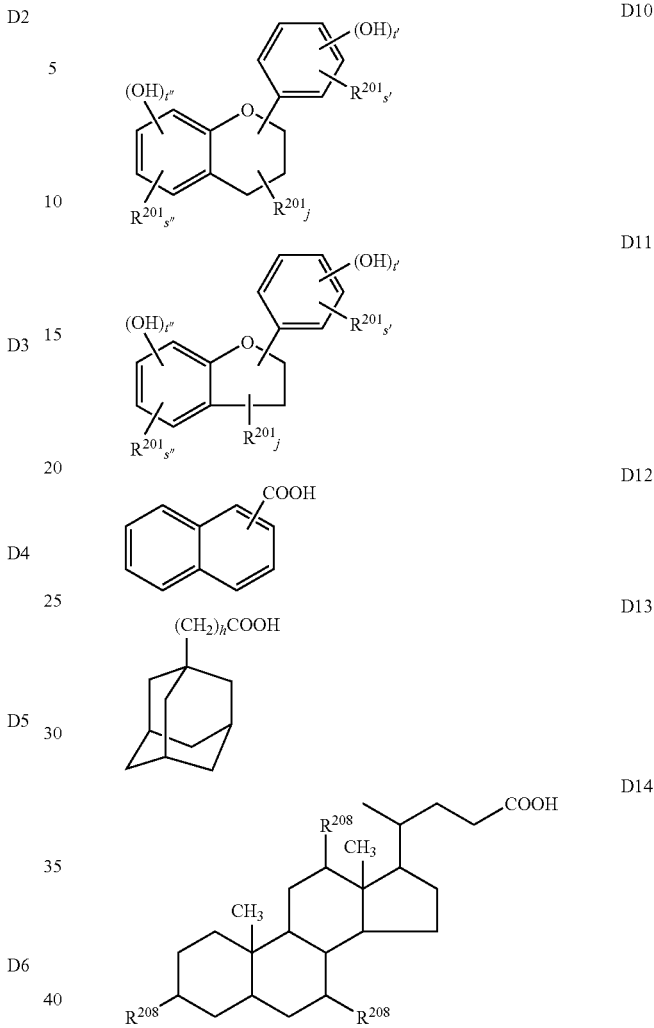

wherein each of $R^{201}$ and $R^{202}$ represents hydrogen atom, or a linear or branched alkyl group or an alkenyl group having 1 to 8 carbon atoms; $R^{203}$ represents hydrogen atom, or a linear or branched alkyl group or alkenyl group having 1 to 8 carbon atoms, or —$(R^{207})_h$COOH. $R^{204}$ represents —$(CH_2)_i$— (i=2 to 10), allylene group having 6 to 10 carbon atoms, carbonyl group, sulfonyl group, oxygen atom or sulfur atom. $R^{205}$ represents alkylene group having 1 to 10 carbon atoms, an arylene group having 6 to 10 carbon atoms, a carbonyl group, a sulfonyl group, an oxygen atom or sulfur atom. $R^{206}$ represents a hydrogen atom, a linear or branched alkyl group or alkenyl group having 1 to 8 carbon atoms, or phenyl group or naphtyl group respectively substituted by hydroxy group. $R^{207}$ represents a linear or branched alkylene group having 1 to 10 carbon atoms. $R^{208}$ represents hydrogen atom or hydroxy group. j is an integer of 0 to 5. u, h is 0 or 1. Each of s, t, s', t', s", and t" satisfies s+t=8, s'+t'=5, s"+t"=4, and thus is a numeral to have at least one hydroxy group in the skeleton of each phenyl. α is a numeral to cause a compound of the formula (D8) and (D9) to have a molecular weight of 100 to 1,000.

Wherein, examples of $R^{201}$ and $R^{202}$ include a hydrogen atom, a methyl group, an ethyl group, a butyl group, a propyl group, an ethynyl group and a cyclohexyl group, examples of $R^{203}$ include the same as for $R^{201}$, $R^{202}$, or —COOH, —CH$_2$COOH, examples of $R^{204}$ include an ethylene group, a phenylene group, a carbonyl group, a sulfonyl group, an oxygen atom, a sulfur atom and the like, examples of $R^{205}$ include methylene group or the same as for $R^{204}$, examples of $R^{206}$ include a hydrogen atom, a methyl group, an ethyl group, a butyl group, a propyl group, an ethynyl group, a cyclohexyl group, a hydroxy group-substituted phenyl group and a hydroxy group-substituted naphtyl group, and the like.

Lots of an acid-unstable group of the solubility-controlling agent can be used, and examples thereof include specifically groups of the following general formula (L1) to (L4), a tertiary alkyl group having 4 to 20 carbon atoms, a trialkylsilyl group where each alkyl group has 1 to 6 carbon atoms, an oxoalkyl group having 4 to 20 carbon atoms and the like.

[Chem. 59]

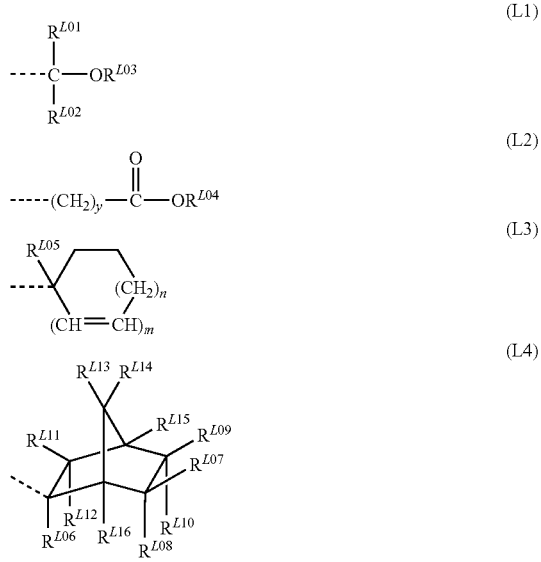

wherein, $R^{L01}$ and $R^{L02}$ represent hydrogen atom or a linear, branched or cyclic alkyl group having 1 to 18 carbon atoms. $R^{L03}$ represents mono-valent hydrocarbon group having 1 to 18 carbon atoms which may have a hetero atom such as oxygen atom and the like. $R^{L01}$ and $R^{L02}$, $R^{L01}$ and $R^{L03}$, $R^{L02}$ and $R^{L03}$ may form a ring, and in the case of forming a ring, each of $R^{L01}$, $R^{L02}$, and $R^{L03}$ represents a linear or branched alkylene group having 1 to 18 carbon atoms. $R^{L04}$ represents tertiary alkyl group having 4 to 20 carbon atoms, a trialkylsilyl group where each alkyl group has 1 to 6 carbon atoms, an oxoalkyl group having 4 to 20 carbon atoms, or a group of the above general formula (L1). $R^{L05}$ represents mono-valent hydrocarbon group having 1 to 8 carbon atoms which may contain a hetero atom, or optionally substituted aryl group having 6 to 20 carbon atoms. $R^{L06}$ represents mono-valent hydrocarbon group having 1 to 8 carbon atoms which may contain hetero atom, or optionally substituted aryl group having 6 to 20 carbon atoms. Each of $R^{L07}$ to $R^{L16}$ independently represents a hydrogen atom or mono-valent hydrocarbon group having 1 to 15 carbon atoms which may contain a hetero atom. $R^{L07}$ to $R^{L16}$ may form a ring together, and in such case, represents divalent hydrocarbon group having 1 to 15 carbon atoms which may contain hetero atom. Further, $R^{L07}$ to $R^{L16}$ which are bonded to adjacent carbons may bind directly together to form double bond. Also, y is an integer of 0 to 6. m is 0 or 1, n is one of 0, 1, 2, and 3 and then satisfying 2m+n=2 or 3.

The solubility-controlling agent described above is combined in an amount of 0 to 50 parts, preferably 0 to 40 parts, more preferably 0 to 30 parts based on a base resin of 100 parts, and can be used alone or as a mixture of two or more thereof. When the combined amount is more than 50 parts, decrease in a film thickness of a pattern occurs and thereby there can be a case to decrease resolution.

Further, the solubility-controlling agent as described above is synthesized by introducing an acid-unstable group to a compound having a phenolic hydroxy group or a carboxy group using an organic chemical treatment.

Moreover, in the resist composition of the present invention, a basic compound can be combined. A proper compound as a basic compound is one able to decrease the diffusion rate when an acid generated from a photoacid generator is diffused in a resist film. By the combination of the basic compound, the diffusion rate of an acid in a resist film is controlled to improve resolution, and change in sensitivity after light exposure is inhibited or dependency on a substrate or environment is lowered to be able to improve light exposure margin or pattern profile and the like.

Such basic compounds include primary, secondary, and tertiary aliphatic amines, mixed amines, aromatic amines, heterocyclic amines, nitrogen-containing compound having a carboxy group, a nitrogen-containing compound having a sulfonyl group, a nitrogen-containing compound having a hydroxy group, a nitrogen-containing compound having a hydroxy phenyl group, an alcoholic nitrogen-containing compound, amide derivatives, imide derivatives and the like.

Specifically, exampled of the primary aliphatic amines include ammonia, methyl amine, ethylamine, n-propyl amine, isopropyl amine, n-butyl amine, isobutyl amine, sec-butyl amine, tert-butyl amine, pentyl amine, tert-amyl amine, cyclopentyl amine, hexylamine, cyclohexylamine, heptyl amine, octyl amine, nonyl amine, decylamine, dodecylamine, cetylamine, methylenediamine, ethylene diamine, tetraethylenepentamine and the like; examples of the secondary aliphatic amines include dimethyl amine, diethyl amine, di-n-propyl amine, diisopropyl amine, di-n-butyl amine, diisobutylamine, di-sec-butyl amine, dipentylamine, dicyclopentyl amine, dihexylamine, dicyclo hexylamine, diheptylamine, dioctyl amine, dinonylamine, didecylamine, didodecylamine, dicetylamine, N,N-dimethylmethylenediamine, N,N-dimethyl ethylene diamine, N,N-dimethyltetraethylenepentamine and the like; examples of the tertiary aliphatic amines include trimethylamine, triethylamine, tri-n-propyl amine, tri-iso-propylamine, tri-n-butyl amine, tri-iso-butylamine, tri-sec-butyl amine, tripentyl amine, tricyclopentyl amine, trihexylamine, tricyclohexylamine, triheptyl amine, trioctylamine, trinonylamine, tridecylamine, tridodecylamine, tricetylamine, N,N,N',N'-tetramethylmethylenediamine, N,N,N',N'-tetra methyl ethylene diamine, N,N,N',N'-tetramethyltetraethylenepentamine and the like.

Further, examples of the mixed amines include dimethylethylamine, methylethylpropylamine, benzylamine, phenethylamine, benzyldimethylamine and the like. Specific examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethyl aniline, 2-nitroaniline, 3-nitroaniline, 4-nitroaniline, 2,4-dinitroaniline, 2,6-dinitroaniline, 3,5-dinitroaniline, N,N-dimethyltoluidine and the like), diphenyl(p-tolyl) amine, methyl diphenyl amine, triphenyl amine, phenylene diamine, naphtylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole and the like), oxazole derivatives (for example oxazole, isooxazole and the like), thiazole derivatives (for example, thiazole, isothiazole and the like), imidazole derivatives (for example, imidazole, 4-methylimidazole, 4-methyl-2-phenylimidazole and the like), pyrazole derivatives, phlazane derivatives, pyrroline derivatives (for example, pyrroline, 2-methyl-1-pyrroline and the like), pyrrolizine derivatives (for example, pyrrolizine, N-methylpyrrolizine, pyrrolizinone, N-methyl pyrrolidone and the like), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenyl pyridine, 2-(1-ethyl propyl)pyridine, aminopyridine, dimethylaminopyridine and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile and the like), isoquinoline derivatives, cinnoline derivatives, quinazoline derivatives, quinoxaline derivatives, phthalazine derivatives, purine derivatives, puteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, urasile derivatives, uridine derivatives and the like.

Further, examples of the nitrogen-containing compound having a carboxy group include aminobenzoic acid, indolecarbonic acid, amino acid derivatives (for example, nicotinic acid, alanine, arginine, asparaginic acid, glutamic acid, glysine, histidine, isoleucine, glycylleucine, leucine, methionine, phenylalanine, threonine, lysine, 3-aminopyrazine-2-carbonic acid, methoxyalanine) and the like; Examples of nitrogen-containing compound having sulfonyl group include 3-pyridinesulfonic acid, p-toluenesulfonic acid pyridium and the like. Examples of nitrogen-containing compound having hydroxy group, nitrogen-containing compound having hydroxy phenyl group, and alcoholic nitrogen-containing compound include 2-hydroxy pyridine, aminocresole, 2,4-quinolinediol, 3-indolemethanol hydrarte, monoethanolamine, diethanolamine, triethanolamine, N-ethyldiethanolamine, N,N-diethylethanol amine, tri-isopropanolamine, 2,2'-iminodiethanol, 2-aminoethanol, 3-amino-1-propanol, 4-amino-1-butanol, 4-(2-hydroxyethyl) morpholine, 2-(2-hydroxy ethyl)pyridine, 1-(2-hydroxyethyl)piperazine, 1-[2-(2-hydroxy ethoxy)ethyl]piperazine, piperidineethanol, 1-(2-hydroxy ethyl)pyrrolizine, 1-(2-hydroxyethyl)-2-pyrrolizinone, 3-piperidino-1,2-propanediol, 3-pyrrolidino-1,2-propanediol, 8-hydroxyeurolidine, 3-quinuclidinole, 3-tropanol, 1-methyl-2-pyrrollidineethanol, 1-adilidineethanol, N-(2-hydroxyethyl) phthalimide, N-(2-hydroxyethyl)isonicotine amide, and the like. Examples of the amide derivatives include formamide, N-methylformamide, N,N-dimethylformamide, acetoamide, N-methylacetoamide, N,N-dimethylacetoamide, propionamide, benzamide and the like. Examples of the imide derivatives include phthalimide, succinimide, maleimide, and the like.

Further, one or two or more selected from the basic compounds represented by the following general formula (B1) may be combined.

[Chem. 60]

$$N(X)_n(Y)_{3-n} \quad\quad B1$$

wherein, n=1, 2 or 3. Each of Ys represents independently a hydrogen atom or a linear, branched or cyclic alkyl group having 1 to 20 carbon atoms, which may contain a hydroxy group or ether. Each of Xs represents independently a group represented by the following general formula (X1) to (X3), two or three Xs may bind together to form a ring.

[Chem. 61]

$$-R^{300}-O-R^{301} \quad\quad X1$$

$$-R^{302}-O-R^{303}-\overset{O}{\underset{\|}{C}}-R^{304} \quad\quad X2$$

$$-R^{305}-\overset{O}{\underset{\|}{C}}-O-R^{306} \quad\quad X3$$

wherein, $R^{300}$, $R^{302}$, and $R^{305}$ represent a linear or branched alkylene group having 1 to 4 carbon atoms. $R^{301}$ and $R^{304}$ represent hydrogen atom, or a linear, branched or cyclic alkyl group having 1 to 20 carbon atoms, which may contain one or more of hydroxy group, ether, ester or lactone ring. $R^{303}$ represents a single bond or a linear or branched alkylene group having 1 to 4 carbon atoms.

Specific examples of a compound represented by the following general formula (B1) include tris(2-methoxymethoxyethyl) amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl) amine, tris(2-formyloxyethyl) amine, tris(2-acetoxyethyl) amine, tris(2-propionyloxyethyl) amine, tris(2-butyryloxyethyl) amine, tris(2-isobutyryloxyethyl) amine, tris(2-valeryloxyethyl) amine, tris(2-pyvaloyloxyethyl) amine, N,N-bis(2-acetoxyethyl) 2-(acetoxyacetoxy) ethyl amine, tris(2-methoxycarbonyloxyethyl) amine, tris(2-tert-butoxycarbonyloxyethyl) amine, tris[2-(2-oxopropoxy)ethyl]amine, tris[2-(methoxycarbonylmethyl) oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl) amine, tris(2-ethoxycarbonylethyl) amine, N,N-bis(2-hydroxyethyl) 2-(methoxycarbonyl)ethylamine, N,N-bis(2-acetoxyethyl) 2-(methoxycarbonyl)ethylamine, N,N-bis(2-hydroxyethyl) 2-(ethoxycarbonyl)ethylamine, N,N-bis(2-acetoxyethyl) 2-(ethoxycarbonyl)ethylamine, N,N-bis(2-hydroxyethyl) 2-(2-methoxyethoxycarbonyl)ethylamine, N,N-bis(2-acetoxyethyl) 2-(2-methoxyethoxycarbonyl)ethylamine, N,N-bis(2-hydroxyethyl) 2-(2-hydroxyethoxycarbonyl)ethylamine, N,N-bis(2-acetoxyethyl) 2-(2-acetoxyethoxycarbonyl)ethylamine, N,N-bis(2-hydroxyethyl) 2-[(methoxycarbonyl)methoxycarbonyl]ethyl amine, N,N-bis(2- acetoxyethyl) 2-[(methoxycarbonyl)methoxycarbonyl] ethylamine, N,N-bis(2-hydroxyethyl) 2-(2-oxopropoxycarbonyl)ethylamine, N,N-bis(2-acetoxyethyl) 2-(2-oxopropoxycarbonyl)ethylamine, N,N-bis(2-hydroxyethyl) 2-(tetrahydrofurfuryloxycarbonyl)ethylamine, N,N-bis(2-acetoxyethyl) 2-(tetrahydrofurfuryloxycarbonyl)ethylamine, N,N-bis(2-hydroxyethyl) 2-[(2-oxotetrahydrofuran-3-yl) oxycarbonyl]ethylamine, N,N-bis(2-acetoxyethyl) 2-[(2-oxotetrahydrofuran-3-yl) oxycarbonyl]ethylamine, N,N-bis(2-hydroxy ethyl) 2-(4-hydroxybutoxycarbonyl) ethylamine, N,N-bis(2-formyloxyethyl) 2-(4-formyloxybutoxycarbonyl)ethyl amine, N,N-bis(2-formyloxyethyl) 2-(2-formyloxyethoxycarbonyl)ethylamine, N,N-bis(2-methoxyethyl) 2-(methoxycarbonyl)ethylamine, N-(2-hydroxyethyl) bis[2-(methoxycarbonyl) ethyl]amine, N-(2-acetoxyethyl) bis[2-(methoxycarbonyl) ethyl]amine, N-(2-hydroxyethyl) bis[2-(ethoxycarbonyl) ethyl]amine, N-(2-acetoxyethyl) bis [2-(ethoxycarbonyl) ethyl]amine, N-(3-hydroxy-1-propyl) bis[2-(methoxycarbonyl)ethyl]amine, N-(3-acetoxy-1-propyl) bis[2-(methoxycarbonyl)ethyl]amine, N-(2-methoxyethyl)bis[2-(methoxycarbonyl)ethyl]amine, N-butyl bis[2-(methoxycarbonyl)ethyl]amine, N-butyl bis[2-(2-methoxyethoxycarbonyl)ethyl]amine, N-methyl bis(2-acetoxyethyl) amine, N-ethyl bis(2-acetoxyethyl) amine, N-methylbis(2-pyvaloyloxyethyl) amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl) amine, N-butylbis(methoxycarbonylmethyl) amine, N-hexylbis(methoxycarbonylmethyl) amine, β-(diethyl amino)-δ-valerolactone and the like.

An amount of the basic compound is 0.001 to 10 parts, preferably 0.01 to 1 parts, based on 1 part of a photoacid generator. Here, when the amount is less than 0.001 parts, effects as an additive may not be sufficiently obtained, and when more than 10 parts, resolution or sensitivity may be decreased.

Further, in the resist composition of the present invention, a compound having a group of =C—COOH in the molecule may be combined. As a compound having a group of =C—COOH in the molecule, one or more compounds selected from the following Groups I and II may be used, but not limited thereto. By the combination with this component, PED stability of the resist composition is improved and edge roughness on a nitride film substrate will be improved.

[Group I]

Compounds represented by the following general formulae (A1) to (A10), wherein some or all of hydrogen atoms of a phenolic hydroxy group in the compound are substituted by —$R^{401}$—COOH (where $R^{401}$ is a linear or branched alkylene group having 1 to 10 carbon atoms), and a molar ratio of phenolic hydroxy group (C) and a group (D) represented by =C—COOH in the molecule is C/(C+D)=0.1 to 1.0.

[Group II]

Compounds represented by the following general formulae (A11) to (A15).

[Chem. 62]

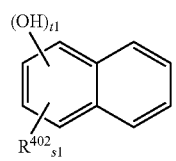

A1

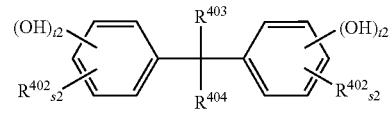

A2

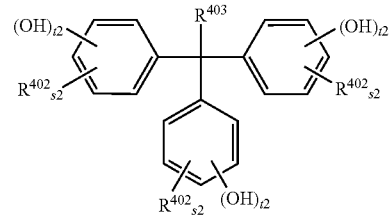

A3

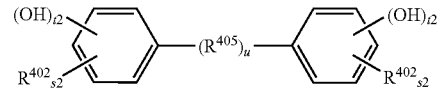

A4

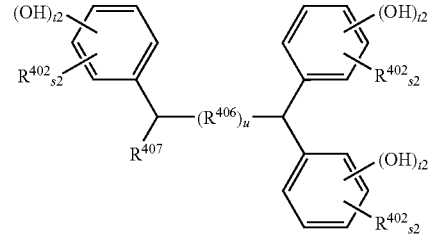

A5

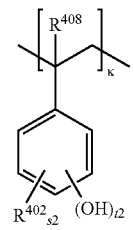

A6

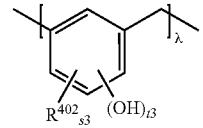

A7

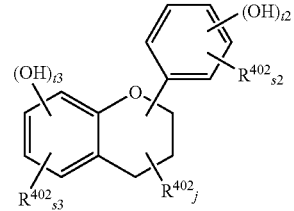

A8

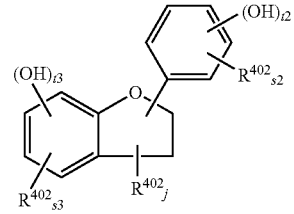

A9

-continued

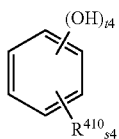
A10 wherein $R^{408}$ represents a hydrogen atom or methyl group. $R^{402}$ and $R^{403}$ represent respectively hydrogen atom or a linear or branched alkyl group or alkenyl group having 1 to 8 carbon atoms. $R^{404}$ represents a hydrogen atom or a linear or branched alkyl group or alkenyl group having 1 to 8 carbon atoms, or —$(R^{409})_h$—COOR' group, while R' represents a hydrogen atom or —$R^{409}$—COOH. $R^{405}$ represents —$(CH_2)_i$— (i=2 to 10), allylene group having 6 to 10 carbon atoms, carbonyl group, sulfonyl group, oxygen atom or sulfur atom. $R^{406}$ represents alkylene group having 1 to 10 carbon atoms, arylene group having 6 to 10 carbon atoms, carbonyl group, sulfonyl group, oxygen atom or sulfur atom. $R^{407}$ represents hydrogen atom or a linear or branched alkyl group and alkenyl group having 1 to 8 carbon atoms, or phenyl group or naphtyl group substituted by hydroxy group respectively. $R^{409}$ represents a linear or branched alkylene group having 1 to 10 carbon atoms. $R^{410}$ represents a hydrogen atom or a linear or branched alkyl group or alkenyl group having 1 to 8 carbon atoms, or —$R^{411}$—COOH group. $R^{411}$ represents a linear or branched alkylene group having 1 to 10 carbon atoms. Also, j is an integer of 0 to 5, and u and h are 0 or 1. Further, s1, t1, s2, t2, s3, t3, s4, and t4 satisfies that s1+t1=8, s2+t2=5, s3+t3=4, s4+t4=6, and each of which is a numeral to at least have one hydroxy group in each phenyl skeleton. Also, κ is a numeral to make a weight average molecular weight of a compound of the formula (A6) to 1,000 to 5,000, and λ is a numeral to make weight average molecular weight of a compound of the formula (A7) to 1,000 to 10,000.

[Chem. 63]

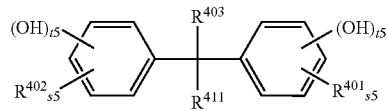
A11

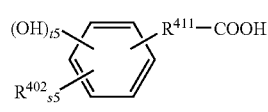
A12

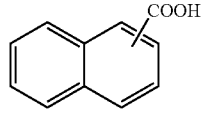
A13

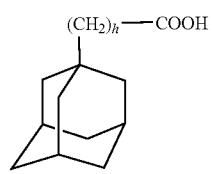
A14

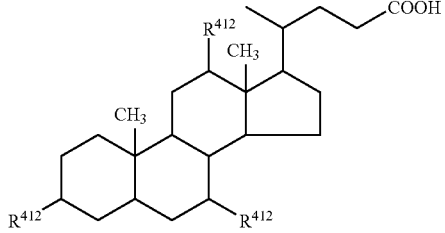
A15 wherein, $R^{402}$, $R^{403}$, and $R^{411}$ represent the same meanings as defined above. $R^{412}$ represents a hydrogen atom or hydroxy group. s5 and t5 are s5≧0, t5≧0, which are a numeral satisfying s5+t5=5. h' is 0 or 1.

As the above components, specifically compounds represented by the following general formulae AI-1 to 14 and AII-1 to 10 may be mentioned, but not limited thereto:

[Chem. 64]

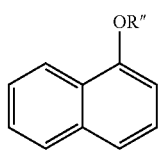
AI-1

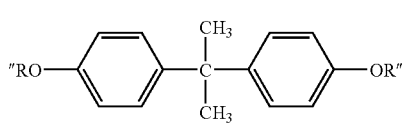
AI-2

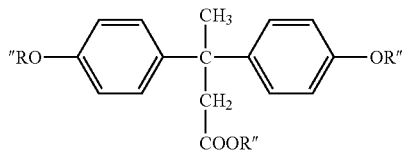
AI-3

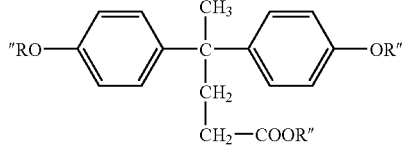
AI-4

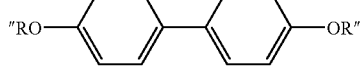
AI-5

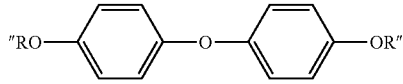
AI-6

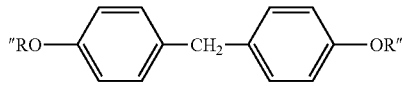
AI-7

-continued
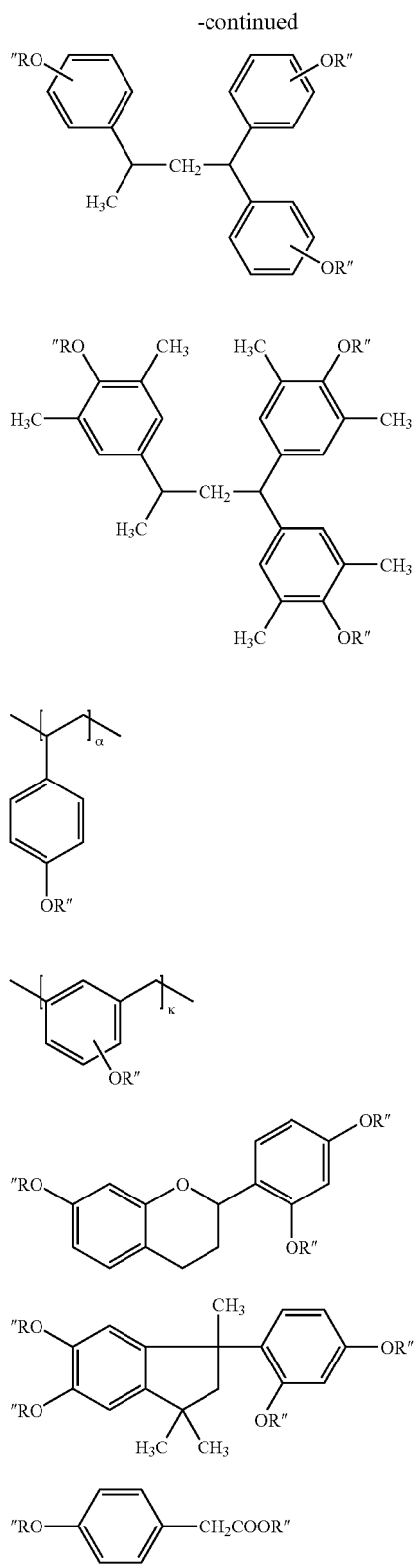
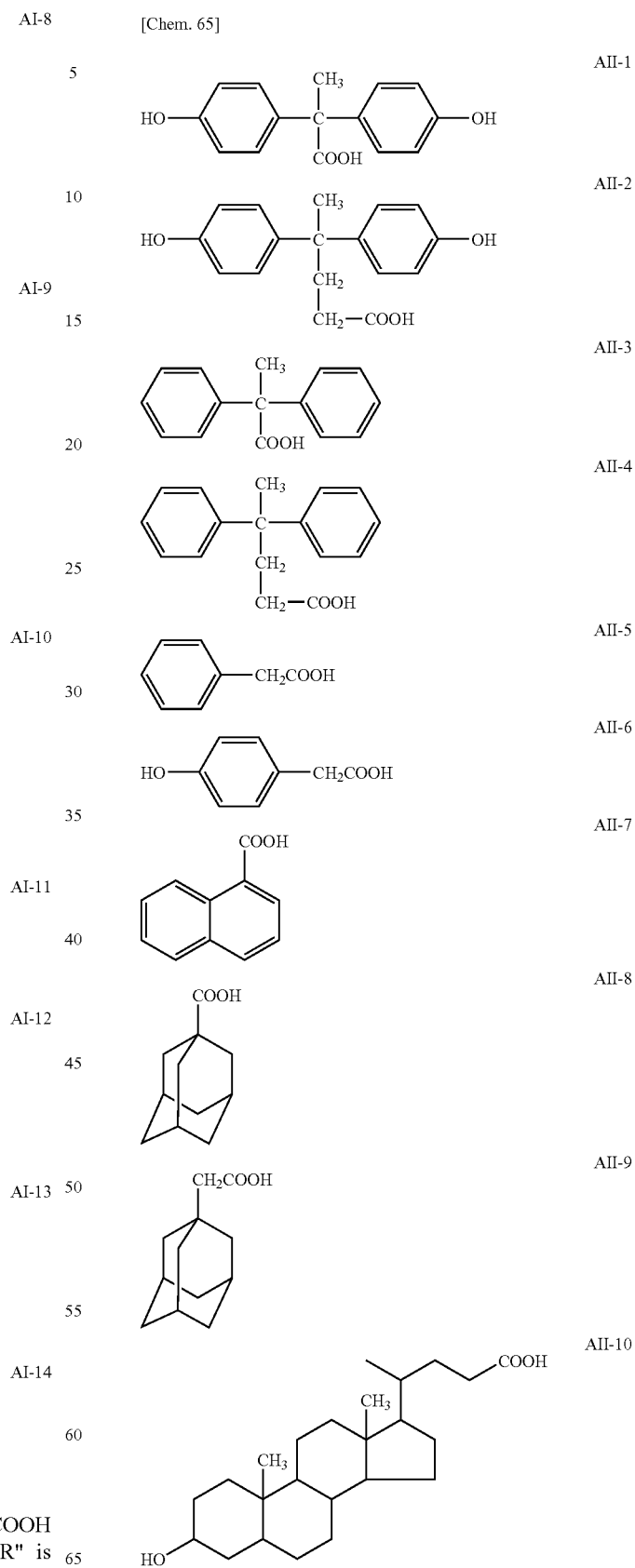
wherein, R″ represents a hydrogen atom or CH$_2$COOH group. In each compound, 10 to 100 mol % of R″ is CH$_2$COOH group. α and κ represent the same as defined above.

Further, the compounds having a group represented by ≡C—COOH in the molecule may be used each alone or in a combination of two or more thereof. An added amount of the compounds having a group represented by ≡C—COOH in the molecule is 0 to 5 parts, preferably 0.1 to 5 parts, more preferably 0.1 to 3 parts, further more preferably 0.1 to 2 parts based on 100 parts of a base resin. When it is more than 5 parts, there is a case that resolution of a resist composition is decreased.

Further, in a resist composition of the present invention, acetylene alcohol derivatives may be combined as an additive, which can improve the storage stability.

As the acetylene alcohol derivatives, the derivatives represented by the following general formulae (S1) and (S2) may be preferably used:

[Chem. 66]

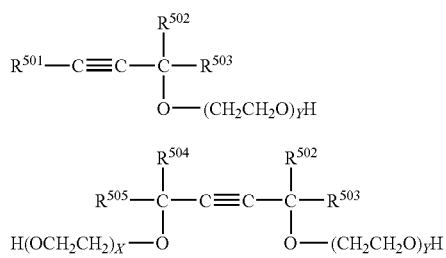

wherein, each of $R^{501}$, $R^{502}$, $R^{503}$, $R^{504}$, and $R^{505}$ represents hydrogen atom, or a linear, branched or cyclic alkyl group having 1 to 8 carbon atoms, X and Y represent 0 or an integer satisfying the following values: $0 \leq X \leq 30$, $0 \leq Y \leq 30$, $0 \leq X+Y \leq 40$.

Examples of the acetylene alcohol derivatives include preferably, Surfinol 61, Surfinol 82, Surfinol 104, Surfinol 104 E, Surfinol 104H, Surfinol 104 A, Surfinol TG, Surfinol PC, Surfinol 440, Surfinol 465, Surfinol 485 (produced by Air Products and Chemicals Inc.), Surfinol E1004 (produced by Nissin Chemical Industry Co., Ltd.), and the like.

An added amount of the acetylene alcohol derivatives is 0.01 to 2 weight %, more preferably 0.02 to 1 weight % based on 100 weight % of a resist composition. When it is lower than 0.01 weight %, effects of improving the coating property and storage stability may not be sufficiently achieved, and when more than 2 weight %, there is a case that the resolution of a resist composition is decreased.

In a resist composition of the present invention, as an optional component other than the above-described components, conventionally used surfactants may be added for improving the coating property. Further, an added amount of the optional component may be a conventional amount in a range which does not inhibit the effects of the present invention.

As the surfactants, non-ionic surfactants are preferable. Examples thereof include perfluoro alkyl polyoxy ethylene ethanol, fluoroalkyl ester, perfluoro alkyl amine oxide, perfluoro alkyl EO additives, fluorine-containing organosiloxane-based compounds and the like. Examples thereof include Fluorad "FC-430" and "FC-431" (all produced by SUMITOMO 3M LIMITED), Surfron "S-141", "S-145", "KH-10", "KH-20", "KH-30" and "KH-40" (all produced by Asahi Glass Co. Ltd.), Unidine "DS-401", "DS-403" and "DS-451" (all produced by Daikin Industries, Limited), Megafac "F-8151" (produced by Dainippon Ink and Chemicals, Incorporated), "X-70-092" and "X-70-093" (all produced by Shin-Etsu Chemical Co., Ltd.) and the like. Preferable examples include Fluorad "FC-430" (produced by SUMITOMO 3M LIMITED), "KH-20" and "KH-30", which are all produced by Asahi Glass Co. Ltd., and "X-70-093" which is produced by Shin-Etsu Chemical Co., Ltd.

To form a pattern using a resist composition of the present invention, it can be carried out using conventional lithography techniques. For example, a resist composition is applied on a substrate such as a silicon wafer and the like by the methods such as spin-coating and the like to be a film thickness of 0.2 to 2.0 μm followed by prebaking on a hot plate at 60 to 150° C. for 1 to 10 minutes, preferably at 80 to 130° C. for 1 to 5 minutes. Then, the obtained resist film is covered with a mask to form an objective pattern and irradiated with high energy radiation such as far ultraviolet ray, excimer laser, X-ray and the like or electron beam in an amount of the light exposure of about 1 to 200 mJ/cm², preferably about 5 to 100 mJ/cm², and subsequently followed by post-exposure baking (PEB) on a hot plate at 60 to 150° C. for 1 to 5 minutes, preferably at 80 to 130° C. for 1 to 3 minutes. Then, the development is carried out for 0.1 to 3 minutes, preferably 0.5 to 2 minutes by the conventional methods such as a dip method, a puddle method, a spray method and the like using an alkali developer such as 0.1 to 5%, preferably 2 to 3% tetramethyl ammonium hydroxide (TMAH) and the like, to form an objective pattern on the substrate. Further, the composition of the present invention is optimum for micropatterning by the use of far ultraviolet ray of 248 to 193 nm or excimer laser and X-ray among the high energy radiation and electron beam. Moreover, in the cases out of the upper and lower limits of the above-described ranges, an objective pattern may not be obtained.

The hydrogenated ring-opening metathesis polymer of the present invention is excellent in heat resistance, heat decomposition resistance, light-transmittance property and the like and suitable for a photoresist composition for semiconductor microprocessing using ultraviolet ray or far ultraviolet ray. Thus, the hydrogenated ring-opening metathesis polymer of the present invention has a high industrial value. The resist composition of the present invention using this polymer as a base resin is sensitized with high energy radiation and thus excellent in sensitivity, resolution and etching resistance. Thus, the resist composition of the present invention is useful for microprocessing by the use of electron beam or far ultraviolet ray. Particularly, the resist composition of the present invention is characterized in that an absorption in a wavelength of exposure light from ArF excimer laser and KrF excimer laser is low and thus a pattern which is fine and also orthogonal to a substrate can be easily formed.

EXAMPLES

The following examples illustrate the present invention in detail below, but do not restrict the scope of the invention.

The hydrogenated ring-opening metathesis polymer was synthesized in an order described below. In addition, physical values properties of the polymers obtained herein were measured by the following methods.

Average molecular weight: The obtained cyclic olefin-based ring-opening metathesis polymer and a hydrogenated polymer thereof were dissolved in tetrahydrofuran and the average molecular weight was calibrated by GPC, using 830-RI and 875-UV manufactured by NIHONBUNKO as a detector and Shodexk-805, 804, 803 and 802.5 as a column, at room temperature and a flow rate of 1.0 ml/min utilizing polystyrene standard.

Hydrogenating rate: A powder of a cyclic olefin-based hydrogenated ring-opening metathesis polymer was dissolved in deuterated chloroform and reduction degree of the peak assigned to a carbon-carbon double bond in the main chain at δ=4.0 to 6.5 ppm caused by a hydrogenation reaction was calculated by using 270 MHz-$^1$H NMR.

The proportion of carboxylic acid contained in the polymer: It was measured by neutralization titration using Bromothymol blue as an indicator.

Example 1

Synthesis of Polymer 1

In a 500 ml autoclave, 8-(1'-ethylcyclopentyloxycarbonyl) tetracyclo[4.4.0.1$^{2,5}$.1$^{7,10}$]-3-dodecene (27.04 g), 4,10-dioxatricyclo[5.2.1.0$^{2,6}$]deca-8-ene-3-one (13.69 g), and tetracyclo[4.4.0.1$^{2,5}$.1$^{7,10}$]-3-dodecene (7.21 g) as cyclic olefin monomers were dissolved in 250 ml of tetrahydrofuran (hereinafter, referred to as THF).

To this was added 1,5-hexadiene (1.47 g), and Mo(N-2,6-iPr$_2$C$_6$H$_3$)(CHCMe$_2$Ph)(OC(CF$_3$)$_2$Me)$_2$ (343 mg) as a polymerization catalyst and the mixture was reacted at 50° C. for 1 hour. Then, butyl aldehyde (100 mg) was added thereto and the mixture was stirred for 30 minutes to stop the reaction.

This ring-opening metathesis polymer solution was added into methanol to precipitate a ring-opening metathesis polymer, followed by filtration, washing by methanol, and vacuum drying to provide 46.8 g of a ring-opening metathesis polymer in the form of a powder.

Then, in a 500 ml autoclave, the 30.0 g powder of this ring-opening metathesis polymer was dissolved in THF (200 ml), and as a hydrogenation catalyst a previously prepared solution of chlorohydridecarbonyltris(triphenylphosphine) ruthenium (II) (30 mg) and triethylamine (10 mg) in THF (40 ml) was added thereto. Hydrogenation was conducted for 5 hours at a hydrogen pressure of 8.1 MPa and a temperature of 140° C., and then the temperature was returned to room temperature and a hydrogen gas was discharged. This hydrogenated ring-opening metathesis polymer solution was added into methanol to precipitate a hydrogenated ring-opening metathesis polymer. The precipitate was separated by filtration and subjected to vacuum drying to provide 29.2 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11400 and Mw/Mn was 1.90. Further, the composition ratio of the structural units [A]/[B]/[C] in the resulted polymer was 40/40/20.

The $^1$H-NMR spectrum of the hydrogenated ring-opening metathesis polymer obtained is shown in FIG. 1.

Example 2

Synthesis of Polymer 2

A ring-opening metathesis polymerization of the mixture was carried out in the same manner as in Example 1 except that 8-(1'-ethylcyclopentyloxycarbonyl)tetracyclo[4.4.0.1$^{2,5}$.1$^{7,10}$]-3-dodecene (20.22 g), 4,10-dioxatricyclo[5.2.1.0$^{2,6}$]deca-8-ene-3-one (17.02 g), bicyclo[2.2.1]hepto-2-ene (4.20 g), 1-octene (1.23 g) were used as cyclic olefin monomers, to give 40.4 g of a ring-opening metathesis polymer in the form of a powder.

Then, in a 500 ml autoclave, the 30.0 g powder of this ring-opening metathesis polymer was hydrogenated in the same manner as in Example 1 and then the temperature was returned to room temperature to discharge a hydrogen gas. This hydrogenated ring-opening metathesis polymer solution was added into methanol to precipitate a hydrogenated ring-opening metathesis polymer. The precipitate was separated by filtration and subjected to vacuum drying to provide 28.9 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 17300 and Mw/Mn was 2.73. Further, the composition ratio of the structural units [A]/[B]/[C] in the resulted polymer was 30/50/20.

Example 3

Synthesis of Polymer 3

A ring-opening metathesis polymerization was carried out in the same manner as in Example 1 except that 8-(1'-ethylcyclopentyloxycarbonyl)tetracyclo[4.4.0.1$^{2,5}$.1$^{7,10}$]-3-dodecene (13.52 g), 4,10-dioxatricyclo[5.2.1.0$^{2,6}$]deca-8-ene-3-one (17.04 g), tetracyclo[4.4.0.1$^{2,5}$.1$^{7,10}$]-3-dodecene (10.73 g) and 1,6-heptadiene (0.92 g) were used as cyclic olefin monomers, W(N-2,6-Me$_2$C$_6$H$_3$)(CHCMe$_2$Ph)(OC(CF$_3$)$_2$Me)$_2$ (357 mg) was used as a polymerization catalyst and the reaction was carried out at 50° C. for 2 hours, to give 40.01 g of a ring-opening metathesis polymer.

Then, in a 500 ml autoclave, the 30.0 g powder of this ring-opening metathesis polymer was hydrogenated in the same manner as in Example 1 to obtain 29.4 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 15000 and Mw/Mn was 1.93. Further, the composition ratio of the structural units [A]/[B]/[C] in the resulted polymer was 20/50/30.

Example 4

Synthesis of Polymer 4

In a 300 ml Schlenk flask, under nitrogen, 8-(1'-ethylcyclopentyloxycarbonyl)tetracyclo[4.4.0.1$^{2,5}$.1$^{7,10}$]-3-dodecene (3.61 g), 4,10-dioxatricyclo[5.2.1.0$^{2,6}$]deca-8-ene-3-one (3.04 g), hexacyclo[6.6.1.0$^{2,7}$.0$^{9,14}$.1$^{3,6}$.1$^{10,13}$]-4-heptadecene (1.81 g) as cyclic olefin monomers were dissolved in 150 ml of THF. To this was added W(N-2,6-Me$_2$C$_6$H$_3$)(CHCMe$_2$Ph)(OC(CF$_3$)$_2$Me)$_2$ (2.00 g) as a ring-opening metathesis polymerization catalyst and the mixture was reacted at room temperature for 3 hours. Then, butyl aldehyde (500 mg) was added thereto and the mixture was stirred for 30 minutes to stop the reaction.

This ring-opening metathesis polymer solution was added into methanol to precipitate a ring-opening metathesis polymer. The precipitate was separated by filtration, washed by methanol, and subjected to vacuum drying to provide 8.0 g of a ring-opening metathesis polymer in the form of a powder.

Then, in a 200 ml autoclave, the 6.0 g powder of this ring-opening metathesis polymer was dissolved in THF (70 ml), and 0.6 g of 5% palladium carbon as a hydrogenation catalyst was added thereto. Hydrogenation was conducted for 5 hours at a hydrogen pressure of 8.1 MPa and a temperature of 165° C., and then the temperature was returned to room temperature to discharge a hydrogen gas. This hydrogenated ring-opening metathesis polymer solution was added into methanol to precipitate a hydrogenated ring-opening metathesis polymer. The precipitate was separated by filtration and subjected to vacuum drying to provide 5.7 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC utilizing polystyrene standard was 8900 and Mw/Mn was 1.08. Further, the composition ratio of the structural units [A]/[B]/[C] in the resulted polymer was 30/50/20.

Example 5

Synthesis of Polymer 5

A ring-opening metathesis polymerization was carried out in the same manner as in Example 4 except that 8-(1'-ethyl-cyclopentyloxycarbonyl)tetracyclo[4.4.0.1$^{2,5}$.1$^{7,10}$]-3-dodecene (3.61 g), 4,10-dioxatricyclo[5.2.1.0$^{2,6}$]deca-8-ene-3-one (3.04 g), tetracyclo[4.3.0.1$^{2,5}$]-3-nonene (1.07 g) were used as cyclic olefin monomers, and Mo(N-2,6-iPr$_2$C$_6$H$_3$)(CHCMe$_2$Ph)(OC(CF$_3$)$_3$)$_2$ (1.06 g) was used as a polymerization catalyst to give 7.3 g of a ring-opening metathesis polymer.

Then, the 6.0 g powder of the obtained ring-opening metathesis polymer was hydrogenated in the same manner as in Example 4 to obtain 5.6 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 18100 and Mw/Mn was 1.12. Further, the composition ratio of the structural units [A]/[B]/[C] in the resulted polymer was 30/50/20.

Example 6

Synthesis of Polymer 6

Except that, in Example 4,8-(1'-ethyl-cyclopentyloxycarbonyl)tetracyclo[4.4.0.1$^{2,5}$.1$^{7,10}$]-3-dodecene (3.61 g), 4,10-dioxatricyclo[5.2.1.0$^{2,6}$]deca-8-ene-3-one (3.04 g), pentacyclo[7.4.4.0.3$^{2,5}$.3$^{7,13}$]-3-pentadecene (1.60 g) were used as cyclic olefin monomers and Mo(N-2,6-iPr$_2$C$_6$H$_3$)(CHCMe$_2$Ph)(OC(CF$_3$)$_3$)$_2$ (1.17 g) was used as a polymerization catalyst, a ring-opening metathesis polymerization was carried out in the same manner as in Example 4, to give 7.8 g of a ring-opening metathesis polymer.

Then, a solution of dichlorotris(triphenylphosphine) ruthenium (II) (10 mg) and triethylamine (5 mg) in THF (10 ml) was used as a hydrogenation catalyst, and the 6.0 g powder of the obtained ring-opening metathesis polymer was hydrogenated in the same manner as in Example 4 to obtain 5.5 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 12300 and Mw/Mn was 1.10. Further, the composition ratio of the structural units [A]/[B]/[C] in the resulted polymer was 30/50/20.

Example 7

Synthesis of Polymer 7

Except that, in Example 1,8-(1'-ethyl-cyclopentyloxycarbonyl)tetracyclo[4.4.0.1$^{2,5}$.1$^{7,10}$]-3-dodecene (20.13 g), spiro[dihydrofuran-3(2H), 2'-[7]oxabicyclo[2.2.1]hepta-5-ene]-2-one (18.69 g), tetracyclo[4.4.0.1$^{2,5}$.1$^{7,10}$]-3-dodecene (7.21 g), 1,5-hexadiene (0.64 g) were used as cyclic olefin monomers and Mo(N-2,6-iPr$_2$C$_6$H$_3$)(CHCMe$_2$Ph)(OC(CF$_3$)$_2$Me)$_2$ (343 mg) was used as a polymerization catalyst, a ring-opening metathesis polymerization was carried out in the same manner as in Example 1, to give 44.3 g of a ring-opening metathesis polymer.

Then, the 30.0 g powder of this ring-opening metathesis polymer was hydrogenated in the same manner as in Example 1 to obtain 29.6 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 23200 and Mw/Mn was 2.00. Further, the composition ratio of the structural units [A]/[B]/[C] in the resulted polymer was 30/50/20.

Example 8

Synthesis of Polymer 8

A ring-opening metathesis polymerization was carried out in the same manner as in Example 1 except that 8-(1'-ethyl-cyclopentyloxycarbonyl)tetracyclo[4.4.0.1$^{2,5}$.1$^{7,10}$]-3-dodecene (20.13 g), 4,10-dioxatricyclo[5.2.1.0$^{2,6}$]deca-8-ene-3-one (10.19 g), 4-oxatricyclo[5.2.1.0$^{2,6}$]deca-8-ene-3-one (6.76 g), tetracyclo[4.4.0.1$^{2,5}$.1$^{7,10}$]-3-dodecene (7.21 g), 1,6-heptadiene (1.46 g) were used as cyclic olefin monomers, W(N-2,6-iPr$_2$C$_6$H$_3$)(CHCMe$_2$Ph)(OC(CF$_3$)$_3$)$_2$ (431 mg) was used as a polymerization catalyst and the reaction was carried out at 50° C. for 2 hours, to give 43.3 g of a ring-opening metathesis polymer.

Then, the 30 g powder of this ring-opening metathesis polymer was hydrogenated in the same manner as in Example 1 to obtain 29.4 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11300 and Mw/Mn was 2.15. Further, the composition ratio of the structural units [A]/[B]/[C] in the resulted polymer was 30/50/20.

Example 9

Synthesis of Polymer 9

A ring-opening metathesis polymerization was carried out in the same manner as in Example 1 except that 8-(1'-ethyl-cyclopentyloxycarbonyl)tetracyclo[4.4.0.1$^{2,5}$.1$^{7,10}$]-3-dodecene (20.13 g), 4,10-dioxatricyclo[5.2.1.0$^{2,6}$]deca-8-ene-3-one (10.19 g), 4-oxatricyclo[5.2.1.0$^{2,6}$]deca-8-ene-3- one (6.76 g), tetracyclo[4.3.0.1$^{2,5}$]-3-nonene (6.04 g), 1,6-heptadiene (1.59 g) were used as cyclic olefin monomers, W(N-2,6-iPr$_2$C$_6$H$_3$)(CHCMe$_2$Ph)(OC(CF$_3$)$_3$)$_2$ (431 mg) was used as a polymerization catalyst and the reaction was carried out at 50° C. for 2 hours, to give 43.1 g of a ring-opening metathesis polymer.

Then, dichlorotris(triphenylphosphine) ruthenium (II) (30 mg) was used as a hydrogenation catalyst, and the 30.0 g powder of the obtained ring-opening metathesis polymer was hydrogenated in the same manner as in Example 1 to obtain 29.7 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 12200 and Mw/Mn was 2.13. Further, the composition ratio of the structural units [A]/[B]/[C] in the resulted polymer was 30/50/20.

Example 10

Synthesis of Polymer 10

A ring-opening metathesis polymerization was carried out in the same manner as in Example 4 except that 8-(1'-ethyl-cyclopentyloxycarbonyl)tetracyclo[4.4.0.1$^{2,5}$.1$^{7,10}$]-3-dodecene (3.61 g), 4,10-dioxatricyclo[5.2.1.0$^{2,6}$]deca-8-ene-3-one (1.83 g), spiro[dihydrofuran-3(2H), 2'-oxabicyclo[2.2.1]hepta-5-ene]-2-one (1.31 g), tetracyclo[4.4.0.1$^{2,5}$.1$^{7,10}$]-3-dodecene (1.28 g) were used as cyclic olefin monomers, and Ru(P(C$_6$H$_{11}$)$_3$)$_2$(CHPh)Cl$_2$ (981 mg) was used as a polymerization catalyst, to give 7.63 g of a ring-opening metathesis polymer.

Then, a solution of dichlorotris(triphenylphosphine) ruthenium (II) (10 mg) and triethylamine (5 mg) in THF (10 ml) was used as a hydrogenation catalyst, and the 6 g powder of this ring-opening metathesis polymer was hydrogenated in the same manner as in Example 4 to obtain 5.9 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11000 and Mw/Mn was 1.62. Further, the composition ratio of the structural units [A]/[B]/[C] in the resulted polymer was 30/50/20.

Example 11

Synthesis of Polymer 11

A ring-opening metathesis polymerization was carried out in the same manner as in Example 1 except that 8-(1'-methyl-cyclopentyloxycarbonyl)tetracyclo[4.4.0.1$^{2,5}$.1$^{7,10}$]-3-dodecene (19.25 g), 4,10-dioxatricyclo[5.2.1.0$^{2,6}$]deca-8-ene-3-one (17.04 g), tetracyclo[4.3.0.1$^{2,5}$]-3-nonene (6.04 g), 1-octene (1.24 g) were used as cyclic olefin monomers, W(N-2,6-iPr$_2$C$_6$H$_3$)(CHCMe$_2$Ph)(OC(CF$_3$)$_3$)$_2$ (431 mg) was used as a polymerization catalyst and the reaction was carried out at 50° C. for 2 hours, to give 41.3 g of a ring-opening metathesis polymer.

Then, the 30.0 g powder of this ring-opening metathesis polymer was hydrogenated in the same manner as in Example 1 to obtain 29.6 g of a hydrogenated ring-opening metathesis polymer in the form of a white powder.

The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 15200 and Mw/Mn was 2.48. Further, the composition ratio of the structural units [A]/[B]/[C] in the resulted polymer was 30/50/20.

Example 12

Synthesis of Polymer 12

A ring-opening metathesis polymerization was carried out in the same manner as in Example 1 except that 8-tert-butyloxycarbonyl-tetracyclo[4.4.0.1$^{2,5}$.1$^{7,10}$]-3-dodecene (17.50 g), 4,10-dioxatricyclo[5.2.1.0$^{2,6}$]deca-8-ene-3-one (17.04 g), tetracyclo[4.3.0.1$^{2,5}$]-3-nonene (6.04 g), 1,5-hexadiene (1.29 g) were used as cyclic olefin monomers and that Mo(N-2,6-iPr$_2$C$_6$H$_3$)(CHCMe$_2$Ph)(OC(CF$_3$)Me$_2$)$_2$ (295 mg) was used as a polymerization catalyst, to give 39.7 g of a ring-opening metathesis polymer.

Then, 3.0 g of 5% palladium carbon was used as a hydrogenation catalyst, and the 30 g powder of the obtained ring-opening metathesis polymer was hydrogenated in the same manner as in Example 1 to obtain 28.9 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 12300 and Mw/Mn was 2.00. Further, the composition ratio of the structural units [A]/[B]/[C] in the resulted polymer was 30/50/20.

Example 13

Synthesis of Polymer 13

A ring-opening metathesis polymerization was carried out in the same manner as in Example 1 except that 8-(1'-methyl-1'-ethyl-propyloxycarbonyl)tetracyclo[4.4.0.1$^{2,5}$.1$^{7,10}$]-3-dodecene (19.32 g), 4,10-dioxatricyclo[5.2.1.0$^{2,6}$]deca-8-ene-3-one (17.04 g), tetracyclo[4.3.0.1$^{2,5}$]-3-nonene (6.04 g), 1,5-hexadiene (1.55 g) were used as cyclic olefin monomers and that Mo(N-2,6-iPr$_2$C$_6$H$_3$)(CHCMe$_2$Ph)(OC(CF$_3$)$_2$Me)2 (343 mg) was used as a polymerization catalyst, to give 41.6 g of a ring-opening metathesis polymer.

Then, 3.0 g of 5% palladium carbon was used as a hydrogenation catalyst, and the 30 g powder of this ring-opening metathesis polymer was hydrogenated in the same manner as in Example 1 to obtain 29.1 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11000 and Mw/Mn was 1.92. Further, the composition ratio of the structural units [A]/[B]/[C] in the resulted polymer was 30/50/20.

Example 14

Synthesis of Polymer 14

Except that 8-(1'-ethyl-cyclopentyloxycarbonyl)tetracyclo[4.4.0.1$^{2,5}$.1$^{7,10}$]-3-dodecene (4.81 g), 4,10-dioxatricyclo[5.2.1.0$^{2,6}$]deca-8-ene-3-one (2.43 g), tetracyclo[4.3.0.1$^{2,5}$]-3-nonene (1.07 g) were used as cyclic olefin monomers and that Mo(N-2,6-Me$_2$C$_6$H$_3$)(CHCMe$_2$Ph)(OC(CF$_3$)Me$_2$)$_2$ (1.20 g) was used as a polymerization catalyst, a ring-opening metathesis polymerization was carried out in the same manner as in Example 4, to give 7.9 g of a ring-opening metathesis polymer.

Then, the 6.0 g powder of this ring-opening metathesis polymer was hydrogenated in the same manner as in Example 4 to obtain 5.4 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11000 and Mw/Mn was 1.08. Further, the composition ratio of the structural units [A]/[B]/[C] in the resulted polymer was 40/40/20.

Then, in a 500 ml NASU flask, the 5.0 g powder of the obtained ring-opening metathesis polymer was added into a solution of trifluoroacetic acid 1.0 ml in toluene 200 ml and stirred at 70° C. for 1 hour. After removing the solvent, the polymer was dissolved again in THF and added into methanol to precipitate a hydrogenated ring-opening metathesis polymer. The precipitate was separated by filtration and subjected to vacuum drying to provide 4.2 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 11200 and Mw/Mn was 1.11.

Example 15

Synthesis of Polymer 15

Except that 8-(1'-ethyl-cyclopentyloxycarbonyl) tetracyclo[4.4.0.1$^{2,5}$.1$^{7,10}$]-3-dodecene (4.81 g), 4,10-dioxatricyclo[5.2.1.0$^{2,6}$]deca-8-ene-3-one (2.43 g), tetracyclo[4.4.0.1$^{2,5}$.1$^{7,10}$]-3-dodecene (1.28 g) were used as cyclic olefin monomers and that Mo(N-2,6-Me$_2$C$_6$H$_3$)(CHCMe$_2$Ph)(OC(CF$_3$)Me$_2$)$_2$ (925 mg) was used as a polymerization catalyst, a ring-opening metathesis polymerization was carried out in the same manner as in Example 14, to give 8.1 g of a ring-opening metathesis polymer.

Then, a solution of dichlorotris(triphenylphosphine) ruthenium (II) (10 mg) and triethylamine (5 mg) in THF (10 ml) was used as a hydrogenation catalyst, and the 6.0 g powder of the obtained ring-opening metathesis polymer was hydrogenated in the same manner as in Example 14 to obtain 5.5 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 14000 and Mw/Mn was 1.10. Further, the composition ratio of the structural units [A]/[B]/[C] in the resulted polymer was 40/40/20.

Then, the 5.0 g of the obtained hydrogenated ring-opening metathesis polymer was subjected to ester-decomposition in the same way as in Example 14 to provide 4.2 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 14500 and Mw/Mn was 1.11.

Example 16

Synthesis of Polymer 16

A ring-opening metathesis polymerization was carried out in the same manner as in Example 14 except that 8-(2'-ethyl-bicyclo[2.2.1]heptyloxycarbonyl) tetracyclo[4.4.0.1$^{2,5}$.1$^{7,10}$]-3-dodecene (5.22 g), 4,10-dioxa-5,5-dimethyltricyclo[5.2.1.0$^{2,6}$]deca-8-en-3-one (2.28 g), tetra cyclo[4.4.0.1$^{2,5}$.1$^{7,10}$]-3-dodecene (1.28 g) were used as cyclic olefin monomers, Ru(P(C$_6$H$_{11}$)$_3$)$_2$(CHPh)Cl$_2$ (1.15 g) was used as a polymerization catalyst and the reaction was carried out at the room temperature for 3 hours, to give 8.3 g of a ring-opening metathesis polymer.

Then, the 6.0 g powder of this ring-opening metathesis polymer was hydrogenated in the same manner as in Example 14 to obtain 5.5 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 9000 and Mw/Mn was 1.35. Further, the composition ratio of the structural units [A]/[B]/[C] in the resulted polymer was 40/40/20.

Then, the 5.0 g powder of the obtained hydrogenated ring-opening metathesis polymer was subjected to ester-decomposition in the same way as in Example 14 to provide 4.2 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 9100 and Mw/Mn was 1.40.

Example 17

Synthesis of Polymer 17

Except that 5-(1'-ethyl-cyclopentyloxycarbonyl)-bicyclo[2.2.1]hepto-2-ene (21.00 g), 4,10-dioxatricyclo[5.2.1.0$^{2,6}$]deca-8-ene-3-one (13.69 g), tetracyclo[4.3.0.1$^{2,5}$]-3-nonene (6.04 g), 1,5-hexadiene (0.71 g) were used as cyclic olefin monomers and that Mo(N-2,6-iPr$_2$C$_6$H$_3$)(CHCMe$_2$Ph)(OCMe$_3$)$_2$ (246 mg) was used as a polymerization catalyst, a ring-opening metathesis polymerization was carried out in the same manner as in Example 1, to give 39.3 g of a ring-opening metathesis polymer.

Then, 3.0 g of 5% palladium carbon was used as a hydrogenation catalyst, and the 30 g powder of this ring-opening metathesis polymer was hydrogenated in the same manner as in Example 1 to obtain 29.6 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 21000 and Mw/Mn was 1.96. Further, the composition ratio of the structural units [A]/[B]/[C] in the resulted polymer was 40/40/20.

Then, in a 500 ml NASU flask, the 5.0 g of the obtained hydrogenated ring-opening metathesis polymer added into a solution of trifluoroacetic acid 1.0 ml in toluene 200 ml and stirred at 70° C. for 1 hour. After removing the solvent, the polymer was dissolved again in THF and added into methanol to precipitate a hydrogenated ring-opening metathesis polymer. The precipitate was separated by filtration and subjected to vacuum drying to provide 4.3 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 21200 and Mw/Mn was 1.98.

Example 18

Synthesis of Polymer 18

A ring-opening metathesis polymerization was carried out in the same manner as in Example 17 except that 5-(1'-ethyl-cyclopentyloxycarbonyl)-bicyclo[2.2.1]hepto-2-ene (21.00 g), 4,10-dioxatricyclo[5.2.1.0$^{2,6}$]deca-8-ene-3-one (13.69 g), tetracyclo[4.4.0.1$^{2,5}$.1$^{7,10}$]-3-dodecene, (7.21 g), 1,5-hexadiene (0.70 g) were used as cyclic olefin monomers, W(N-2,6-iPr$_2$C$_6$H$_3$)(CHCMe$_2$Ph)(OCMe$_3$)$_2$ (286 mg) was used as a polymerization catalyst and the reaction was carried out at 50° C. for 2 hours, to give 40.4 g of a ring-opening metathesis polymer.

Then, the 30 g powder of this ring-opening metathesis polymer was hydrogenated in the same manner as in Example 17 to obtain 29.8 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 18100 and Mw/Mn was 1.88. Further, the composition ratio of the structural units [A]/[B]/[C] in the resulted polymer was 40/40/20.

Then, the 5.0 g powder of the obtained hydrogenated ring-opening metathesis polymer was subjected to ester-decomposition in the same way as in Example 14 to provide 4.2 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 18700 and Mw/Mn was 1.89.

Example 19

Synthesis of Polymer 19

A ring-opening metathesis polymerization was carried out in the same manner as in Example 14 except that 8-(1'-methyl-cyclopentyloxycarbonyl)tetracyclo[4.4.0.1$^{2,5}$.1$^{7,10}$]-3-dodecene (3.44 g), 4,10-dioxatricyclo[5.2.1.0$^{2,6}$]deca-8-ene-3-one (2.43 g), tetracyclo[4.4.0.1$^{2,5}$.1$^{7,10}$]-3-dodecene (1.28 g) were used as cyclic olefin monomers and that Ru(P(C$_6$H$_{11}$)$_3$)$_2$(CHPh)Cl$_2$ (934 mg) was used as a polymerization catalyst, to give 6.79 g of a ring-opening metathesis polymer.

Then, a solution of chlorohydridocarbonyltris (triphenylphosphine)ruthenium (II) (10 mg) and triethylamine (5 mg) in THF (10 ml) was added as a hydrogenation catalyst, and the 6 g powder of this ring-opening metathesis polymer was hydrogenated in the same manner as in Example 14 to obtain 5.7 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 11000 and Mw/Mn was 1.64. Further, the composition ratio of the structural units [A]/[B]/[C] in the resulted polymer was 40/40/20.

Then, the 5.0 g powder of the obtained hydrogenated ring-opening metathesis polymer was subjected to ester-decomposition in the same way as in Example 14 to provide 4.1 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 11600 and Mw/Mn was 1.65.

Example 20

Synthesis of Polymer 20

A ring-opening metathesis polymerization was carried out in the same manner as in Example 14 except that 8-(1',1'-dimethyl-propyloxycarbonyl)-tetracyclo[4.4.0.1$^{2,5}$.1$^{7,10}$]-3-dodecene (3.29 g), 4,10-dioxatricyclo[5.2.1.0$^{2,6}$] deca-8-en-3-one (2.43 g), tetra cyclo[4.4.0.1$^{2,5}$.1$^{7,10}$]-3-dodecene (1.28 g) were used as cyclic olefin monomers and that Ru(P(C$_6$H$_{11}$)$_3$)$_2$(CHPh)Cl$_2$ (1.03 g) was used as a polymerization catalyst, to give 6.65 g of a ring-opening metathesis polymer.

Then, a solution of chlorohydridocarbonyltris(triphenylphosphine)ruthenium (II) (10 mg) and triethylamine (5 mg) in THF (10 ml) was added as a hydrogenation catalyst, and the 6 g powder of this ring-opening metathesis polymer was hydrogenated in the same manner as in Example 14 to obtain 5.7 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 10500 and Mw/Mn was 1.57. Further, the composition ratio of the structural units [A]/[B]/[C] in the resulted polymer was 40/40/20.

Then, the 5.0 g of the obtained hydrogenated ring-opening metathesis polymer was subjected to ester-decomposition in the same way as in Example 14 to provide 4.1 g of a partially ester-decomposed, hydrogenated ring-opening metathesis polymer in the form of a white powder. The composition ratio of the structural units [A]/[B]/[C]/[D] in the resulted polymer was 30/40/20/10, weight average molecular weight Mw measured by GPC was 10800 and Mw/Mn was 1.58.

Example 21

Synthesis of Polymer 21

A ring-opening metathesis polymerization was carried out in the same manner as in Example 4 except that 5-(1'-ethyl-cyclopentyloxycarbonyl)-bicyclo[2.2.1]hepto-2-ene (1.87 g), 8-tert-butyloxycarbonyl-tetracyclo[4.4.0.1$^{2,5}$.1$^{7,10}$]-3-dodecene (2.08 g), 4,10-dioxatricyclo[5.2.1.0$^{2,6}$]deca-8-en-3-one (2.43 g), tetra cyclo[4.4.0.1$^{2,5}$.1$^{7,10}$]-3-dodecene (1.28 g) were used as cyclic olefin monomers and that Ru(P(C$_6$H$_{11}$)$_3$)$_2$(CHPh)Cl$_2$ (456 mg) was used as a polymerization catalyst, to give 7.28 g of a ring-opening metathesis polymer.

Then, the 6 g powder of this ring-opening metathesis polymer was hydrogenated in the same manner as in Example 4 to obtain 5.8 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 24100 and Mw/Mn was 1.86. Further, the composition ratio of the structural units [A]/[B]/[C]/[E] in the resulted polymer was 20/40/20/20.

Example 22

Synthesis of Polymer 22

A ring-opening metathesis polymerization was carried out in the same manner as in Example 1 except that 8-(1'-ethyl-cyclopentyloxycarbonyl)tetracyclo[4.4.0.1$^{2,5}$.1$^{7,10}$]-3-dodecene (13.52 g), 5-(1'-ethyl-cyclopentyloxycarbonyl)-7-oxabicyclo[2.2.1]hepto-2-ene (16.07 g), 4-oxatricyclo[5.2.1.0$^{2,6}$]deca-8-en-3-one (10.21 g), tetracyclo[4.3.0.1$^{2,5}$]-3-nonene (6.04 g), 1,6-heptadiene (0.80 g) were used as cyclic olefin monomers, W(N-2,6-Me$_2$C$_6$H$_3$)(CHCMe$_2$Ph)(OC(CF$_3$)$_2$Me) 2 (357 mg) was used as a polymerization catalyst and the reaction was carried out at 50° C. for 2 hours, to give 44.2 g of a ring-opening metathesis polymer.

Then, 3.0 g of 5% palladium carbon was used as a hydrogenation catalyst, and the 30 g powder of this ring-opening metathesis polymer was hydrogenated in the same manner as in Example 1 to obtain 29.7 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 19000 and Mw/Mn was 2.21. Further, the composition ratio of the structural units [A]/[B]/[C]/[E] in the resulted polymer was 20/30/20/30.

Example 23

Synthesis of Polymer 23

A ring-opening metathesis polymerization was carried out in the same manner as in Example 1 except that 8-(1'-ethyl-cyclopentyloxycarboxymethyl) tetracyclo[4.4.0.1$^{2,5}$.1$^{7,10}$]-3-dodecene (21.38 g), 4,10-dioxatricyclo[5.2.1.0$^{2,6}$]deca-8-en-3-one (20.54 g), tetra cyclo[4.4.0.1$^{2,5}$.1$^{7,10}$]-3-dodecene (3.69 g), 1,6-heptadiene (2.15 g) were used as cyclic olefin monomers, W(N-2,6-iPr$_2$C$_6$H$_3$)(CHCMe$_2$Ph)(OC(CF$_3$)$_3$)$_2$ (431 mg) was used as a polymerization catalyst and the reaction was carried out at 50° C. for 2 hours, to give 45.6 g of a ring-opening metathesis polymer.

Then, the 30 g powder of this ring-opening metathesis polymer was hydrogenated in the same manner as in Example 1 to obtain 29.3 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 9900 and Mw/Mn was 1.86. Further, the composition ratio of the structural units [A]/[B]/[C] in the resulted polymer was 30/60/10.

Example 24

Synthesis of Polymer 24

A ring-opening metathesis polymerization was carried out in the same manner as in Example 1 except that 8,9-di(1'-ethyl-cyclopentyloxycarbonyl)tetracyclo[4.4.0.1$^{2,5}$.1$^{7,10}$]-3-dodecene (29.96 g), 4,10-dioxa-5,5-dimethyltricyclo[5.2.1.0$^{2,6}$]deca-8-en-3-one (24.33 g), tetra cyclo[4.3.0.1$^{2,5}$]-3-nonene (3.09 g), 1,6-heptadiene (1.23 g) were used as cyclic olefin monomers, W(N-2,6-iPr$_2$C$_6$H$_3$)(CHCMe$_2$Ph)(OC(CF$_3$)$_3$)$_2$ (431 mg) was used as a polymerization catalyst and the reaction was carried out at 50° C. for 2 hours, to give 56.2 g of a ring-opening metathesis polymer.

Then, the 30 g powder of this ring-opening metathesis polymer was hydrogenated in the same manner as in Example 1 to obtain 29.9 g of a hydrogenated ring-opening metathesis polymer in the form of a white powder. The hydrogenating rate was 100% from the analytical results calculated from $^1$H-NMR of the hydrogenated ring-opening metathesis polymer with no observation of any peak assigned to a proton of an olefin in the main chain and the weight average molecular weight Mw measured by GPC was 10700 and Mw/Mn was 1.90. Further, the composition ratio of the structural units [A]/[B]/[C] in the resulted polymer was 30/60/10.

[Chem. 67]

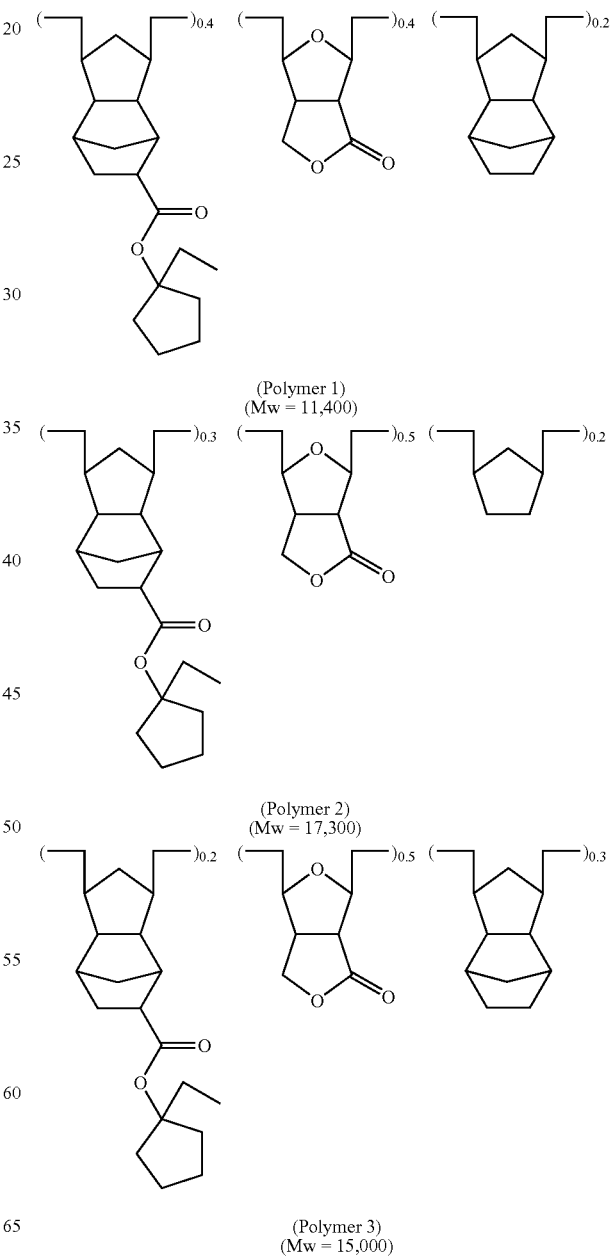

(Polymer 1) (Mw = 11,400)

(Polymer 2) (Mw = 17,300)

(Polymer 3) (Mw = 15,000)

-continued
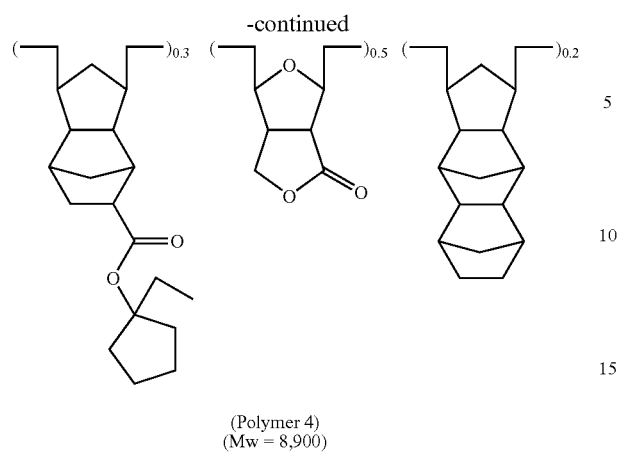
(Polymer 4)
(Mw = 8,900)
[Chem. 68]
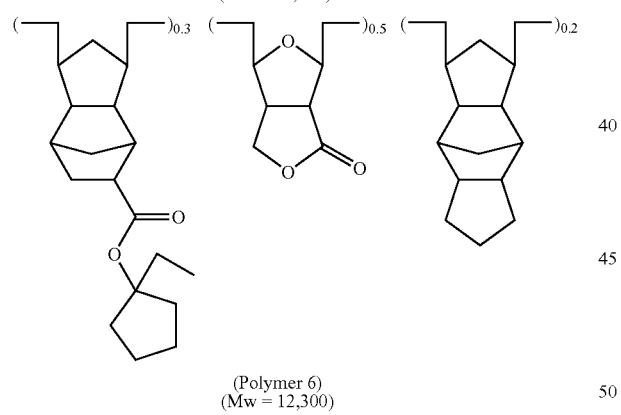
(Polymer 5)
(Mw = 18,100)
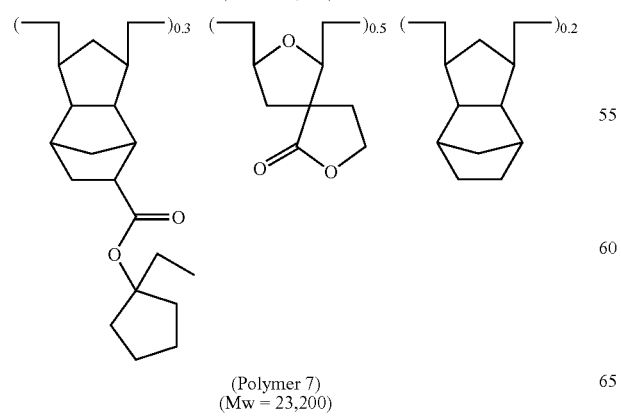
(Polymer 6)
(Mw = 12,300)
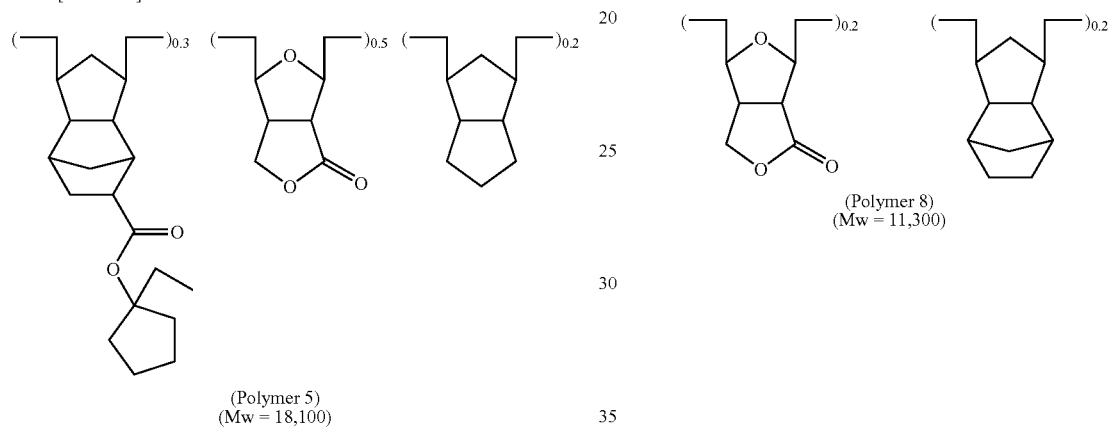
(Polymer 7)
(Mw = 23,200)
-continued
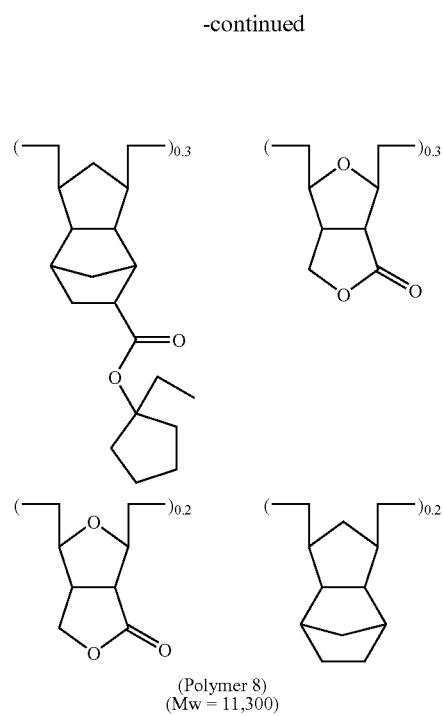
(Polymer 8)
(Mw = 11,300)
[Chem. 69]
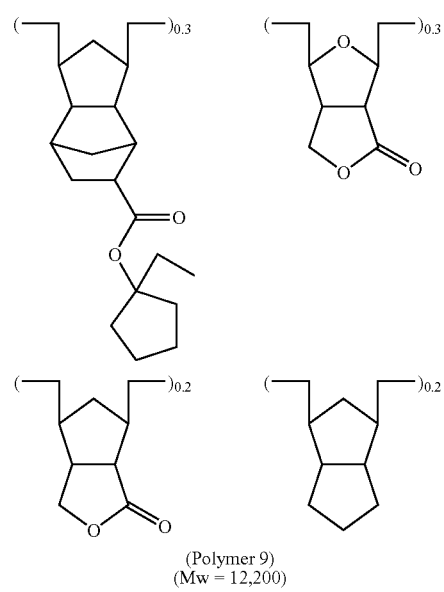
(Polymer 9)
(Mw = 12,200)

 
 
(Polymer 10)
(Mw = 11,000)
 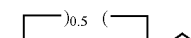 
(Polymer 11)
(Mw = 15,200)
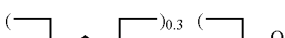 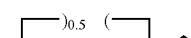 
(Polymer 12)
(Mw = 12,300)
[Chem. 70]
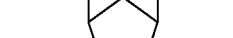
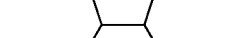
(Polymer 13)
(Mw = 11,000)
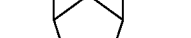
(Polymer 14)
(Mw = 11,200)
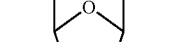
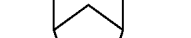
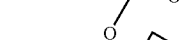
(Polymer 15)
(Mw = 14,500)

-continued
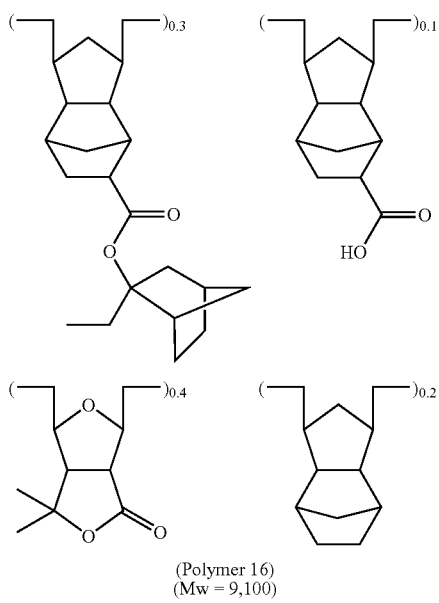
(Polymer 16)
(Mw = 9,100)
[Chem. 71]
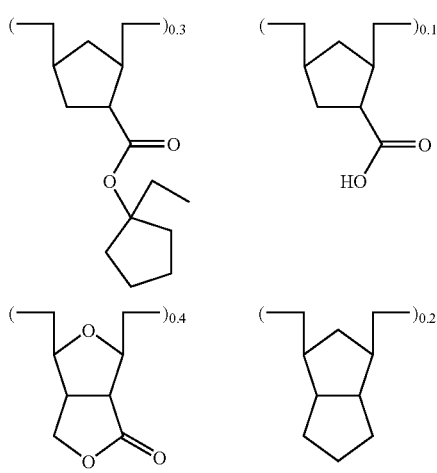
(Polymer 17)
(Mw = 21,200)
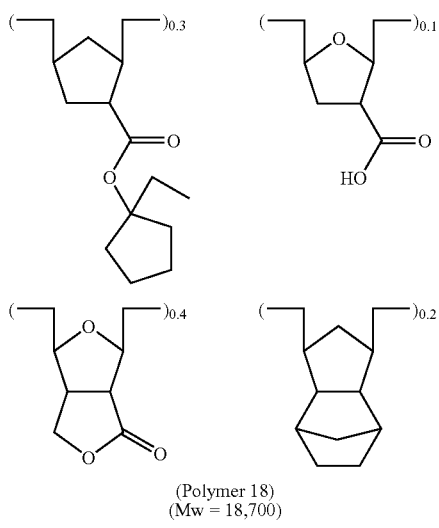
(Polymer 18)
(Mw = 18,700)
-continued
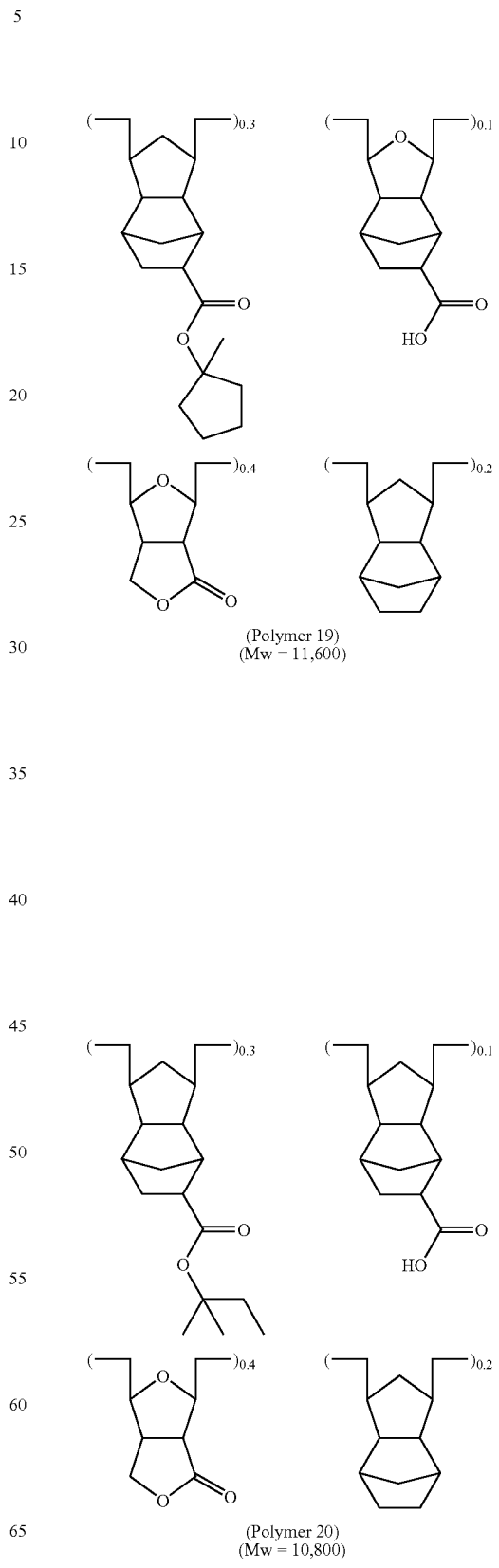
(Polymer 19)
(Mw = 11,600)
(Polymer 20)
(Mw = 10,800)

-continued

[Chem. 72]

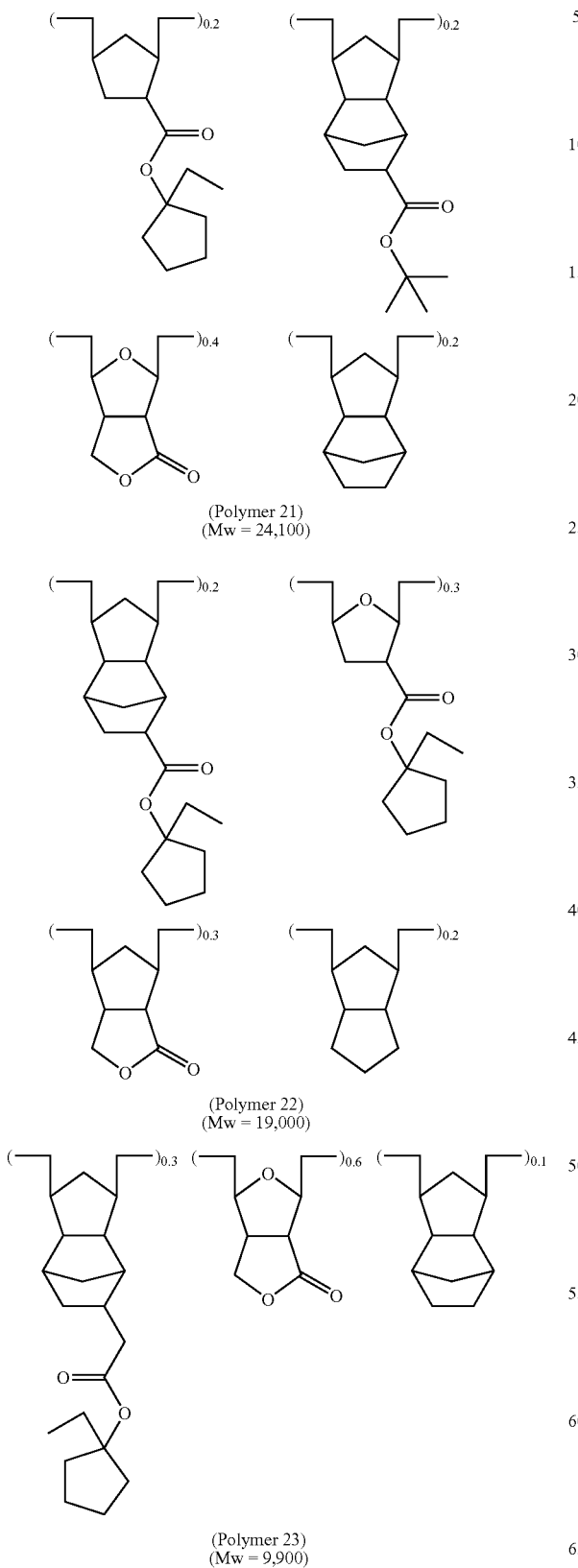

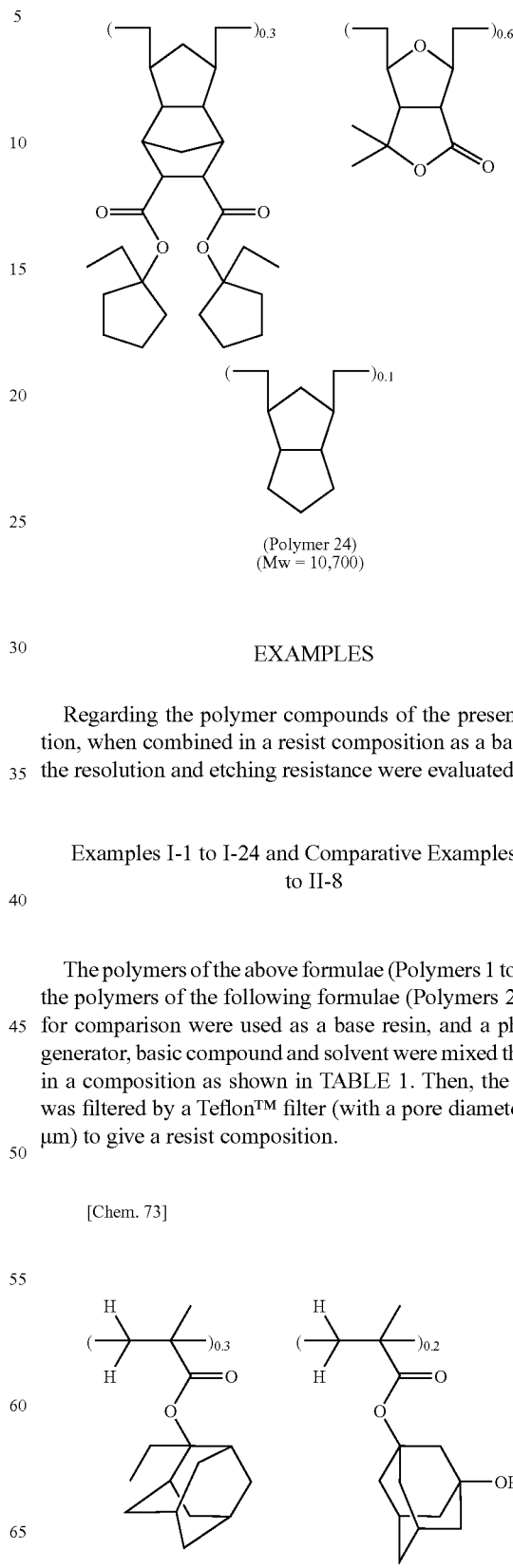

EXAMPLES

Regarding the polymer compounds of the present invention, when combined in a resist composition as a base resin, the resolution and etching resistance were evaluated.

Examples I-1 to I-24 and Comparative Examples II-1 to II-8

The polymers of the above formulae (Polymers 1 to 24) and the polymers of the following formulae (Polymers 25 to 32) for comparison were used as a base resin, and a photoacid generator, basic compound and solvent were mixed therewith in a composition as shown in TABLE 1. Then, the mixture was filtered by a Teflon™ filter (with a pore diameter of 0.2 µm) to give a resist composition.

[Chem. 73]

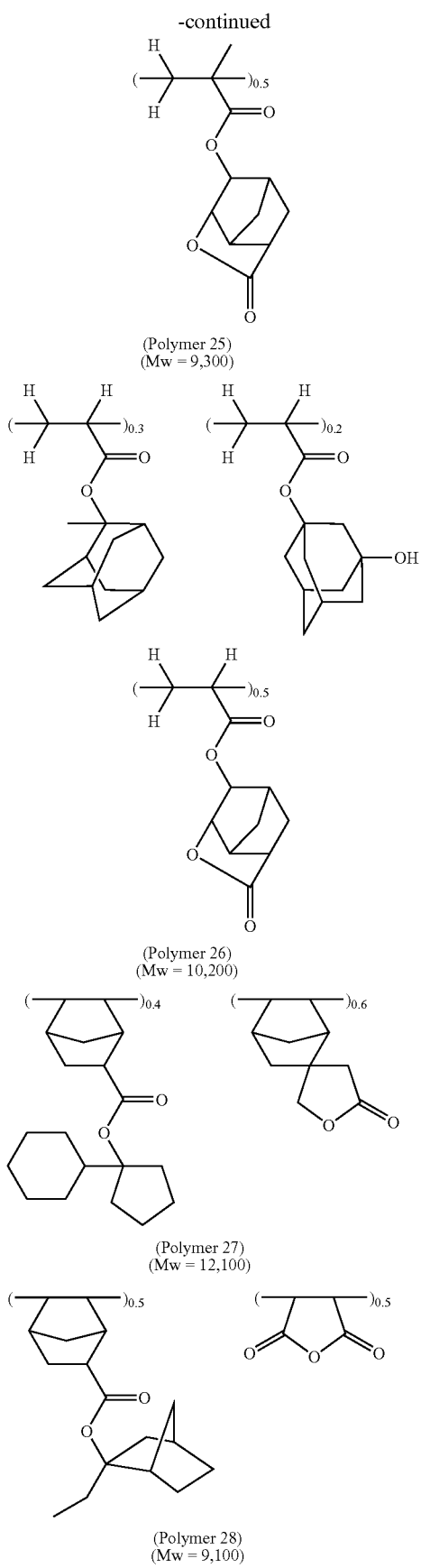
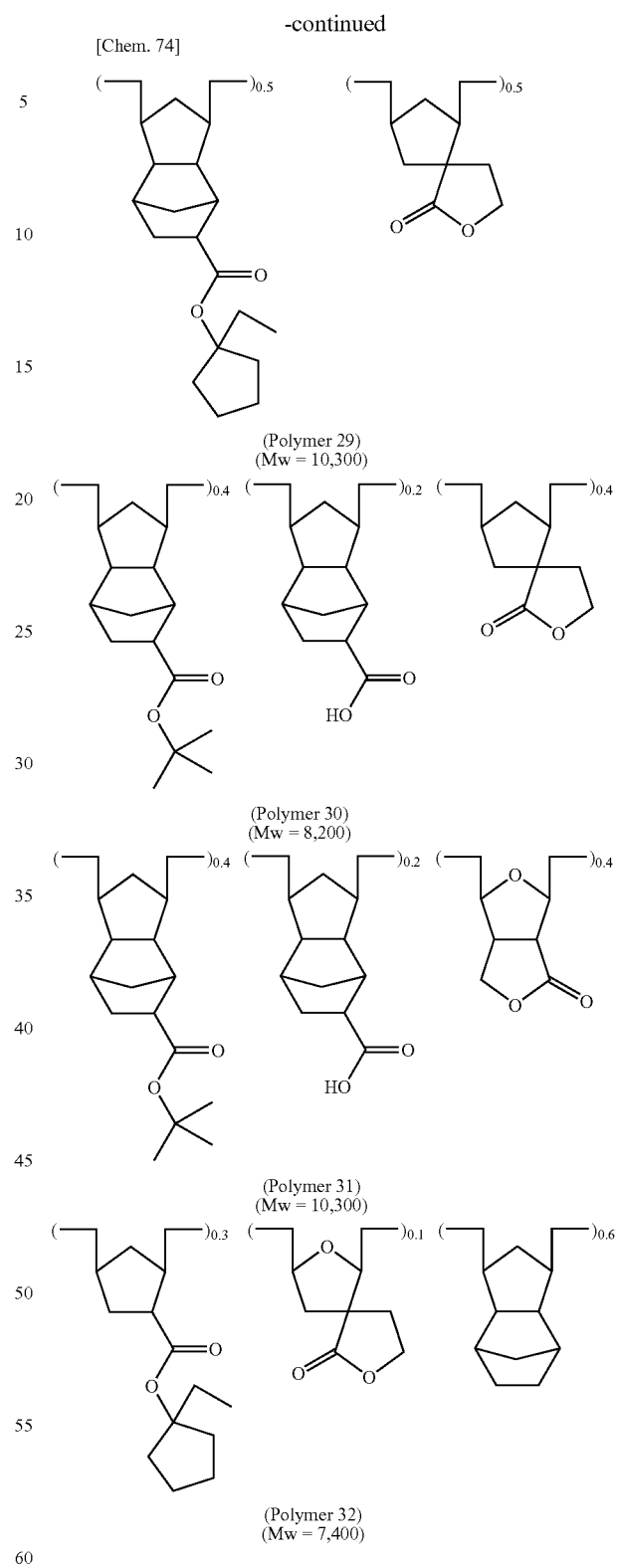
The resist solution was applied by spin coating on a silicon wafer on which an anti-reflection film (ARC29A manufactured by Nissan Chemical Industries, LTD., 78 nm) had been applied, and heated at 100° C. to 130° C. for 60 seconds to form a 250 nm thickness resist film. This was exposed by using an ArF excimer laser stepper (manufactured by Nikon Corp., NA=0.68) and heated at 100° C. to 130° C. for 60 seconds. Then, paddle development was conducted for 60 seconds with an aqueous 2.38% tetramethylammonium hydroxide solution, to form a line and space pattern of 1:1. The developed wafer was cut and the cut section was observed by SEM (scanning electron microscope). The minimum line width (μm) of lines and spaces separated at the dose (the optimum dose=Eop, mJ/cm$^2$) which provided a resolution at the top and bottom of a 0.13 μm line-and-space pattern, was defined as the resolution of a resist to be evaluated. The shape of pattern was classified into any of rectangle, rounded head, T-top, forward taper and reverse taper.

Further, the resist solution was applied by spin coating on a silicon wafer which was surface-treated (at 90° C. for 60 seconds) in a gaseous phase with HMDS (hexamethyldisilasane) and then heated at 100° C. for 60 seconds to form a 300 nm thickness resist film. Etching-resistance of this film was evaluated by using a dry etcher (under $CF_4/CHF_3$ gas by TOKYO ELECTRON LTD.). By measuring a change of the film thickness in a minute, the etching rate was determined based on SEPR-430S (Shin-Etsu Chemical Co.).

The composition for each resist of Examples and the results from the evaluation of the resolution and etching-resistance at the optimum temperature of SB (soft bake)/PEB (post exposure bake) are shown in TABLE 1. Further, a composition and the results of each resist of Comparative Examples are shown in TABLE 2. In addition, regarding Tables 1 and 2, a photoacid generator, basic compounds and solvents are as follows. All of the solvents contained 0.01 weight % of KH-20 (manufactured by ASAHI GLASS, LTD.):

TPSNF: nonafluorobutanesulfonic acid triphenylsulfonium

TMMEA: trismethoxymethoxyethylamine

CyHO: cyclohexanone

TABLE 1

| Example | Resin (parts by wt) | Photo acid generator (parts by wt) | Basic compound (parts by wt) | Solvent (parts by wt) | SB/PEB temperature | Optimum dose (mJ/cm$^2$) | Resolution (μm) | Shape | Etching rate |
|---|---|---|---|---|---|---|---|---|---|
| I-1 | Polymer 1 (80) | TPSNf (1) | TMMEA (0.236) | CyHO (640) | 100/110 | 22.0 | 0.12 | rectangle | 1.05 |
| I-2 | Polymer 2 (80) | TPSNf (1) | TMMEA (0.236) | CyHO (640) | 100/110 | 25.0 | 0.13 | rectangle | 1.09 |
| I-3 | Polymer 3 (80) | TPSNf (1) | TMMEA (0.236) | CyHO (640) | 110/120 | 23.0 | 0.12 | rectangle | 1.03 |
| I-4 | Polymer 4 (80) | TPSNf (1) | TMMEA (0.236) | CyHO (640) | 100/110 | 23.0 | 0.13 | rectangle | 1.01 |
| I-5 | Polymer 5 (80) | TPSNf (1) | TMMEA (0.236) | CyHO (640) | 100/110 | 24.0 | 0.12 | rectangle | 1.04 |
| I-6 | Polymer 6 (80) | TPSNf (1) | TMMEA (0.236) | CyHO (640) | 110/110 | 20.0 | 0.12 | rectangle | 1.04 |
| I-7 | Polymer 7 (80) | TPSNf (1) | TMMEA (0.236) | CyHO (640) | 110/110 | 19.0 | 0.12 | rectangle | 1.06 |
| I-8 | Polymer 8 (80) | TPSNf (1) | TMMEA (0.236) | CyHO (640) | 100/110 | 26.0 | 0.11 | rectangle | 1.03 |
| I-9 | Polymer 9 (80) | TPSNf (1) | TMMEA (0.236) | CyHO (640) | 110/110 | 20.0 | 0.11 | rectangle | 1.04 |
| I-10 | Polymer 10 (80) | TPSNf (1) | TMMEA (0.236) | CyHO (640) | 100/110 | 22.0 | 0.12 | rectangle | 1.03 |
| I-11 | Polymer 11 (80) | TPSNf (1) | TMMEA (0.236) | CyHO (640) | 120/120 | 21.0 | 0.12 | rectangle | 1.03 |
| I-12 | Polymer 12 (80) | TPSNf (1) | TMMEA (0.236) | CyHO (640) | 130/130 | 21.0 | 0.13 | a little T-top | 1.07 |
| I-13 | Polymer 13 (80) | TPSNf (1) | TMMEA (0.236) | CyHO (640) | 100/110 | 25.0 | 0.12 | rectangle | 1.10 |
| I-14 | Polymer 14 (80) | TPSNf (1) | TMMEA (0.236) | CyHO (640) | 100/110 | 27.0 | 0.11 | rectangle | 1.06 |
| I-15 | Polymer 15 (80) | TPSNf (1) | TMMEA (0236) | CyHO (640) | 100/110 | 25.0 | 0.11 | rectangle | 1.05 |
| I-16 | Polymer 16 (80) | TPSNf (1) | TMMEA (0.236) | CyHO (640) | 110/100 | 23.0 | 0.11 | rectangle | 1.02 |
| I-17 | Polymer 17 (80) | TPSNf (1) | TMMEA (0.236) | CyHO (640) | 100/110 | 19.0 | 0.12 | rectangle | 1.08 |
| I-18 | Polymer 18 (80) | TPSNf (1) | TMMEA (0.236) | CyHO (640) | 110/110 | 19.0 | 0.11 | rectangle | 1.06 |
| I-19 | Polymer 19 (80) | TPSNf (1) | TMMEA (0.236) | CyHO (640) | 110/120 | 22.0 | 0.12 | rectangle | 1.03 |
| I-20 | Polymer 20 (80) | TPSNf (1) | TMMEA (0.236) | CyHO (640) | 120/120 | 26.0 | 0.12 | rectangle | 1.03 |
| 1-21 | Polymer 21 (80) | TPSNf (1) | TMMEA (0.236) | CyHO (640) | 100/110 | 21.0 | 0.13 | rectangle | 1.04 |
| I-22 | Polymer 22 (80) | TPSNf (1) | TMMEA (0.236) | CyHO (640) | 100/110 | 23.0 | 0.12 | rectangle | 1.05 |
| I-23 | Polymer 23 (80) | TPSNf (1) | TMMEA (0236) | CyHO (640) | 100/100 | 24.0 | 0.11 | a little rounded head | 1.05 |
| I-24 | Polymer 24 (80) | TPSNf (1) | TMMEA (0.236) | CyHO (640) | 100/110 | 22.0 | 0.12 | a little rounded head | 1.06 |

TABLE 2

| Comparative Example | Resin (parts by wt) | Photoacid generator (parts by wt) | Basic compound (parts by wt) | Solvent (parts by wt) | SB/PEB temperature | Optimum dose (mJ/cm$^2$) | Resolution (μm) | Shape | Etching rate |
|---|---|---|---|---|---|---|---|---|---|
| II-1 | Polymer 25 (80) | TPSNf (1) | TMMEA (0.236) | CyHO (640) | 120/120 | 26.0 | 0.12 | rectangle | 1.29 |
| II-2 | Polymer 26 (80) | TPSNf (1) | TMMEA (0.236) | CyHO (640) | 110/110 | 22.0 | 0.11 | a little T-top | 1.27 |
| II-3 | Polymer 27 (80) | TPSNf (1) | TMMEA (0.236) | CyHO (640) | 100/110 | 23.0 | 0.15 | rounded head | 1.09 |
| II-4 | Polymer 28 (80) | TPSNf (1) | TMMEA (0.236) | CyHO (640) | 100/110 | 23.0 | 0.14 | rounded head | 1.15 |
| II-5 | Polymer 29 (80) | TPSNf (1) | TMMEA (0.236) | CyHO (640) | 100/110 | 23.0 | 0.15 | taper | 1.03 |
| II-6 | Polymer 30 (80) | TPSNf (1) | TMMEA (0.236) | CyHO (640) | 120/130 | 23.0 | 0.16 | taper | 1.04 |
| II-7 | Polymer 31 (80) | TPSNf (1) | TMMEA (0.236) | CyHO (640) | 120/130 | 21.0 | 0.14 | rounded head | 1.05 |
| II-8 | Polymer 32 (80) | TPSNf (1) | TMMEA (0.236) | CyHO (640) | 120/110 | 29.0 | 0.16 | T-top | 1.02 |

From the results of Tables 1 and 2, it was confirmed that the resist compositions of the present invention have high resolution and high etching resistance in exposure of an ArF excimer laser.

It is apparent that the present invention is not limited to the above embodiment, and may be modified and changed without departing from the scope of the invention.

The invention claimed is:

1. A hydrogenated ring-opening metathesis polymer, which contains at least a structural unit [A] represented by the following general formula [1], a structural unit [B] selected from the following formula [3] and/or [4] and a structural unit [C] selected from the following general formula [5] and/or [6]:

[Chem. 1]

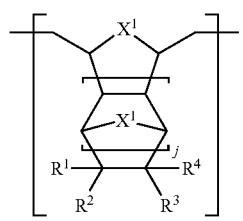

[1]

wherein at least one of $R^1$ to $R^4$ is a functional group having an acid-unstable group represented by the following general formula [2]:

[Chem. 2]

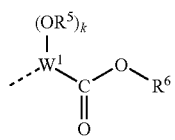

[2]

wherein the chain line represents a coupling hand, $R^5$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^6$ represents a tertiary alkyl group having 4 to 20 carbon atoms, and $W^1$ represents a single bond or a (k+2)-valent hydrocarbon group having 1 to 10 carbon atoms, k is 0 or 1 and when k is 0, $W^1$ represents a single bond, and the remaining groups of $R^1$ to $R^4$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms; and $X^1$s are the same or different and represent —O— or —CR$^7{}_2$— where $R^7$ represents a hydrogen atom or a linear or branched alkyl group having 1 to 10 carbon atoms, j represents an integer of 0 or 1 to 3;

[Chem. 3]

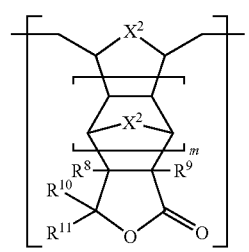

[3]

-continued

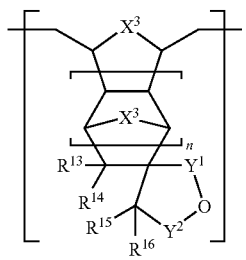

[4]

wherein $R^8$ to $R^{11}$ each independently represent a hydrogen atom or a linear, branched or cyclic alkyl group having 1 to 10 carbon atoms, $X^2$s are the same or different and represent —O— or —$CR^{12}_2$— where $R^{12}$ represents a hydrogen atom or a linear or branched alkyl group having 1 to 10 carbon atoms, m represents an integer of 0 or 1 to 3, $R^{13}$ to $R^{16}$ each independently represent a hydrogen atom or a linear, branched or cyclic alkyl group having 1 to 10 carbon atoms, $X^3$s are the same or different and represent —O— or —$CR^{17}_2$— wherein $R^{17}$ represents a hydrogen atom or a linear or branched alkyl group having 1 to 10 carbon atoms, one of $Y^1$ and $Y^2$ represents —(C=O)— and the other of $Y^1$ and $Y^2$ represents —$CR^{18}_2$— where $R^{18}$ represents a hydrogen atom or a linear or branched alkyl group having 1 to 10 carbon atoms, n represents an integer of 0 or 1 to 3; and

[Chem. 4]

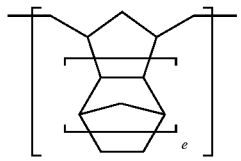

[5]

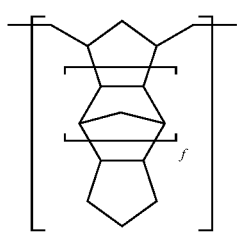

[6]

wherein e represents an integer of 0 or 1 to 3, and f represents an integer of 0 or 1 to 3;
wherein the at least one of $X^1$ of the general formula [1] of the structural unit [A], $X^2$ of the general formula [3] and $X^3$ of the general formula [4] of the structural unit [B] is —O—, and
wherein the molar ratio of the structural units [A], [B] and [C] satisfies simultaneously that [A]/([B]+[C]) is from 20/80 to 98/2, ([A]+[B])/[C] is from 99/1 to 50/50, and ([A]+[C])/[B] is from 99/1 to 21/79.

2. The hydrogenated ring-opening metathesis polymer according to claim 1, wherein $R^6$ of the general formula [2] selected as at least one of $R^1$ to $R^4$ of the formula [1] represents 1-alkyl cyclopentyl group, 2-alkyl-2-norbornyl group or 2-alkyl-2-adamantyl groups.

3. The hydrogenated ring-opening metathesis polymer according to claim 1, which further contains a structural unit [D] represented by the following general formula [7]:

[Chem. 5]

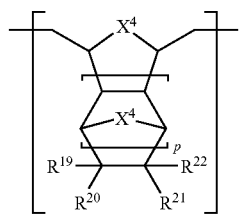

[7]

wherein at least one of $R^{19}$ to $R^{22}$ represents a functional group having a carboxyl group represented by the following general formula [8]:

[Chem. 6]

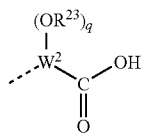

[8]

wherein the chain line represents a coupling hand, $R^{23}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $W^2$ represents a single bond or a (q+2)-valent hydrocarbon group having 1 to 10 carbon atoms, q represents 0 or 1, and when q is 0, $W^2$ represents a single bond, and the remaining groups of $R^{19}$ to $R^{22}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms, and $X^4$s are the same or different and represent —O— or —$CR^{24}_2$— wherein $R^{24}$ represents a hydrogen atom or a linear or branched alkyl group having 1 to 10 carbon atoms, p represents an integer of 0 or 1 to 3.

4. The hydrogenated ring-opening metathesis polymer according to claim 3, wherein the molar ratio of the sum of the structural unit [A] of the general formula [1], the structural unit [B] of the general formula [3] and/or [4], and the structural unit [C] of the general formula [5] and/or [6] to the structural unit [D] of the general formula [7], ([A]+[B]+[C])/[D] is from 100/0 to 20/80.

5. The hydrogenated ring-opening metathesis polymer according to claim 1, which further contains a structural unit [E] represented by the following general formula [9]:

[Chem. 7]

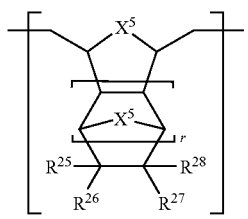

[9]

wherein at least one of $R^{25}$ to $R^{28}$ represents a functional group having a carboxylic acid ester group represented by the following general formula [10]:

[Chem. 8]

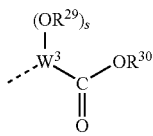

[10]

wherein the chain line represents a coupling hand, $R^{29}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms, $W^3$ represents a single bond or a (s+2)-valent hydrocarbon group having 1 to 10 carbon atoms, s represents 0 or 1, when s is 0, $W^3$ represents a single bond; and the remaining groups of $R^{25}$ to $R^{28}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms and $X^5$s are the same or different and represent —O— or —$CR^{31}_2$— wherein $R^{31}$ represents a hydrogen atom or a linear or branched alkyl group having 1 to 10 carbon atoms; and r represents an integer of 0 or 1 to 3.

6. The hydrogenated ring-opening metathesis polymer according to claim 3, which further contains a structural unit [E] represented by the following general formula [9]:

[Chem. 7]

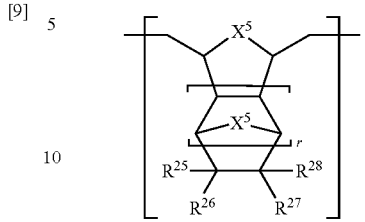

[9]

wherein at least one of $R^{25}$ to $R^{28}$ represents a functional group having a carboxylic acid ester group represented by the following general formula [10]:

[Chem. 8]

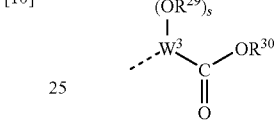

[10]

wherein the chain line represents a coupling hand, $R^{29}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms, $W^3$ represents a single bond or a (s+2)-valent hydrocarbon group having 1 to 10 carbon atoms, s represents 0 or 1, when s is 0, $W^3$ represents a single bond; and the remaining groups of $R^{25}$ to $R^{28}$ are selected each independently from a hydrogen atom, a linear, branched or cyclic alkyl group having 1 to 20 carbon atoms, halogen atoms, a linear, branched or cyclic halogenated alkyl group having 1 to 20 carbon atoms, a linear, branched or cyclic alkoxy group having 1 to 20 carbon atoms, a linear, branched or cyclic alkoxyalkyl group having 2 to 20 carbon atoms, a linear, branched or cyclic alkylcarbonyloxy group having 2 to 20 carbon atoms, an arylcarbonyloxy group having 6 to 20 carbon atoms, a linear, branched or cyclic alkylsulfonyloxy group having 1 to 20 carbon atoms, an arylsulfonyloxy group having 6 to 20 carbon atoms, a linear, branched or cyclic alkoxycarbonyl group having 2 to 20 carbon atoms, or a linear, branched or cyclic alkoxycarbonylalkyl group having 3 to 20 carbon atoms and $X^5$s are the same or different and represent —O— or —$CR^{31}_2$— wherein $R^{31}$ represents a hydrogen atom or a linear or branched alkyl group having 1 to 10 carbon atoms; and r represents an integer of 0 or 1 to 3.

7. The hydrogenated ring-opening metathesis polymer according to claim 5, wherein the molar ratio of the sum of the structural unit [A] of the general formula [1], the structural unit [B] of the general formula [3] and/or [4] and the structural unit [C] of the general formula [5] and/or [6] to the structural unit [E] of the general formula [9], ([A]+[B]+[C])/[E] is from 100/0 to 40/60.

8. The hydrogenated ring-opening metathesis polymer according to claim 6, wherein the molar ratio of the sum of the structural unit [A] of the general formula [1], the structural unit [B] of the general formula [3] and/or [4] and the structural unit [C] of the general formula [5] and/or [6] to the structural unit [E] of the general formula [9], ([A]+[B]+[C])/[E] is from 100/0 to 40/60.

9. The hydrogenated ring-opening metathesis polymer according to claim 1, wherein the number-average molecular weight in terms of polystyrene standard measured by gel permeation chromatography (GPC) is from 2,000 to 200,000.

10. The hydrogenated ring-opening metathesis polymer according to claim 3, wherein the number-average molecular weight in terms of polystyrene standard measured by gel permeation chromatography (GPC) is from 2,000 to 200,000.

11. The hydrogenated ring-opening metathesis polymer according to claim 1, wherein the number-average molecular weight in terms of polystyrene standard measured by GPC is from 3,000 to 50,000.

12. The hydrogenated ring-opening metathesis polymer according to claim 3, wherein the number-average molecular weight in terms of polystyrene standard measured by GPC is from 3,000 to 50,000.

13. A resist composition comprising the hydrogenated ring-opening metathesis polymer according to claim 1 as a base resin.

14. A resist composition comprising the hydrogenated ring-opening metathesis polymer according to claim 3 as a base resin.

15. A resist composition comprising the hydrogenated ring-opening metathesis polymer according to claim 5 as a base resin.

16. A resist composition comprising the hydrogenated ring-opening metathesis polymer according to claim 6 as a base resin.

17. A method for forming a pattern, comprising:

a process of applying a resist composition comprising the hydrogenated ring-opening metathesis polymer according to claim 1 as a base resin onto a substrate to form a coating;

a process of, after heat treating the coating, exposure with a high energy radiation or electron beams through a photomask, and a process of, after optionally heat treating the exposed coating, development with a developer.

18. A method for forming a pattern, comprising:

a process of applying a resist composition comprising the hydrogenated ring-opening metathesis polymer according to claim 3 as a base resin onto a substrate to form a coating;

a process of, after heat treating the coating, exposure with a high energy radiation or electron beams through a photomask, and a process of, after optionally heat treating the exposed coating, development with a developer.

19. A method for forming a pattern, comprising:

a process of applying a resist composition comprising the hydrogenated ring-opening metathesis polymer according to claim 5 as a base resin onto a substrate to form a coating;

a process of, after heat treating the coating, exposure with a high energy radiation or electron beams through a photomask, and a process of, after optionally heat treating the exposed coating, development with a developer.

20. A method for forming a pattern, comprising:

a process of applying a resist composition comprising the hydrogenated ring-opening metathesis polymer according to claim 6 as a base resin onto a substrate to form a coating;

a process of, after heat treating the coating, exposure with a high energy radiation or electron beams through a photomask, and a process of, after optionally heat treating the exposed coating, development with a developer.

* * * * *